US008129803B2

(12) United States Patent
Martin et al.

(10) Patent No.: US 8,129,803 B2
(45) Date of Patent: Mar. 6, 2012

(54) MICROMACHINED MICROPHONE AND MULTISENSOR AND METHOD FOR PRODUCING SAME

(75) Inventors: John R. Martin, Foxborough, MA (US); Timothy J. Brosnihan, Natick, MA (US); Craig Core, North Andover, MA (US); Thomas Kieran Nunan, Carlisle, MA (US); Jason Weigold, Newburyport, MA (US); Xin Zhang, Acton, MA (US)

(73) Assignee: Analog Devices, Inc., Norwood, MA (US)

( * ) Notice: Subject to any disclaimer, the term of this patent is extended or adjusted under 35 U.S.C. 154(b) by 25 days.

(21) Appl. No.: 12/804,213

(22) Filed: Jul. 16, 2010

(65) Prior Publication Data

US 2010/0285628 A1    Nov. 11, 2010

Related U.S. Application Data

(62) Division of application No. 11/113,925, filed on Apr. 25, 2005, now Pat. No. 7,825,484.

(51) Int. Cl.
*H01L 21/02* (2006.01)
*H01L 21/84* (2006.01)

(52) U.S. Cl. ............... 257/415; 257/416; 257/E21.002; 257/E29.32; 438/53; 438/E21.704; 438/400; 438/48; 438/52

(58) Field of Classification Search ............... 257/415, 257/416, E21.002, E29.32; 438/53, E21.704, 438/400, 48, 52
See application file for complete search history.

(56) References Cited

U.S. PATENT DOCUMENTS 5,817,539 A    10/1998    Werner ........................... 438/50
6,870,937 B1    3/2005    Hirosaki et al. .............. 381/174
(Continued)

FOREIGN PATENT DOCUMENTS

DE        196 48 424 C1    6/1998
(Continued)

OTHER PUBLICATIONS

European Patent Office, European Search Report for European Application No. 06 750 896.0-2225, 5 pages Feb. 24, 2010.
(Continued)

*Primary Examiner* — Cuong Q Nguyen
*Assistant Examiner* — Cathy N Lam
(74) *Attorney, Agent, or Firm* — Sunstein Kann Murphy & Timbers LLP

(57) ABSTRACT

A micromachined microphone is formed from a silicon or silicon-on-insulator (SOI) wafer. A fixed sensing electrode for the microphone is formed from a top silicon layer of the wafer. Various polysilicon microphone structures are formed above a front side of the top silicon layer by depositing at least one oxide layer, forming the structures, and then removing a portion of the oxide underlying the structures from a back side of the top silicon layer through trenches formed through the top silicon layer. The trenches allow sound waves to reach the diaphragm from the back side of the top silicon layer. In an SOI wafer, a cavity is formed through a bottom silicon layer and an intermediate oxide layer to expose the trenches for both removing the oxide and allowing the sound waves to reach the diaphragm. An inertial sensor may be formed on the same wafer, with various inertial sensor structures formed at substantially the same time and using substantially the same processes as corresponding microphone structures.

20 Claims, 61 Drawing Sheets
(60 of 61 Drawing Sheet(s) Filed in Color)

Backside cavity
Microphone Region

Accelerometer Regions

U.S. PATENT DOCUMENTS

| | | | |
|---|---|---|---|
| 7,023,066 B2 | 4/2006 | Lee et al. | 257/415 |
| 2003/0133588 A1* | 7/2003 | Pedersen | 381/423 |
| 2005/0005421 A1 | 1/2005 | Wang et al. | 29/594 |
| 2006/0093171 A1* | 5/2006 | Zhe et al. | 381/191 |
| 2006/0233400 A1 | 10/2006 | Ohbayashi et al. | 381/175 |

FOREIGN PATENT DOCUMENTS

| | | |
|---|---|---|
| JP | 2002-223499 | 8/2002 |
| WO | WO 03/045110 A1 | 5/2003 |

OTHER PUBLICATIONS

Roy D. Marsh, Response to EP Search Report of Feb. 2010, European Patent Application No. 06 750 896.0, 24 pages.

Chinese State Intellectual Property Office, Chinese Office Action, Chinese State Intellectual Property Office (SIPO), dated Sep. 14, 2010, App. No. 200680022953.1, 10 pp.

NPA International, Letter of Sep. 21, 2010 summarizing Chinese Office Action dated Sep. 14, 2010, App. No. 200680022953.1, 3 pp.

* cited by examiner

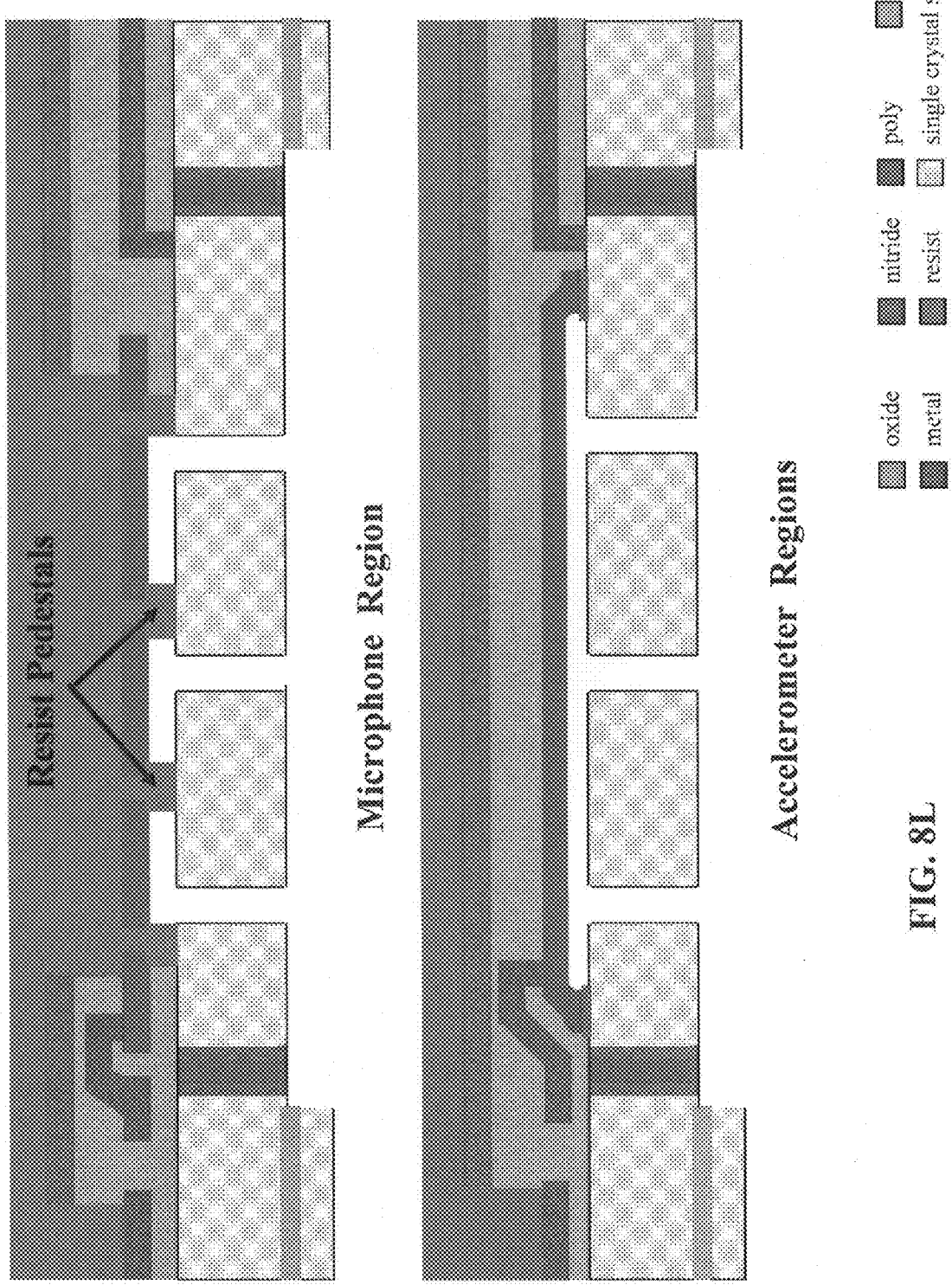

MICROMACHINED MICROPHONE AND MULTISENSOR AND METHOD FOR PRODUCING SAME

CROSS-REFERENCE TO RELATED APPLICATION

This application is a divisional of, and therefore claims priority from, U.S. patent application Ser. No. 11/113,925 filed on Apr. 25, 2005 in the names of John R. Martin, Timothy J. Brosnihan, Craig Core, Thomas Kieran Nunan, Jason Weigold, and Xin Zhang [practitioner's file 2550/A47], which is hereby incorporated herein by reference in its entirety.

This application may be related to U.S. patent application Ser. No. 11/028,249 (now abandoned) entitled Method of Forming a MEMS Device, filed Jan. 3, 2005 in the names of Thomas Kieran Nunan and Timothy J. Brosnihan [practitioner's file 2550/A40], which is hereby incorporated herein by reference in its entirety.

FIELD OF THE INVENTION

The present invention relates generally to micromachined devices, and, more particularly, to micromachined microphones and inertial sensors.

BACKGROUND OF THE INVENTION

Micromachined microphones typically include a thin diaphragm electrode and a fixed sensing electrode that is positioned alongside the diaphragm electrode. The diaphragm electrode and the fixed sensing electrode act like plates of a capacitor. During operation of the microphone, charges are placed on the diaphragm electrode and the fixed sensing electrode. As the diaphragm electrode vibrates in response to sound waves, the change in distance between the diaphragm electrode and the fixed sensing electrode results in capacitance changes that correspond to the sound waves.

FIG. 1 shows the general structure of a micromachined microphone as known in the art. Among other things, the micromachined microphone includes a diaphragm 102 and a bridge 104. The diaphragm 102 and the bridge 104 act as electrodes for a capacitive circuit. As shown, the bridge 104 may be perforated to allow sound waves to reach the diaphragm 102. Alternatively or additionally, sound waves can be made to reach the diaphragm through other channels. In any case, sound waves cause the diaphragm to vibrate, and the vibrations can be sensed as changes in capacitance between the diaphragm 102 and the bridge 104. The micromachined microphone typically includes a substantial cavity 106 behind the diaphragm 102 in order to allow the diaphragm 102 to move freely.

In a typical micromachined microphone, sound waves reach the diaphragm through perforations in the fixed sensing electrode. The size and depth of the perforations can affect the quality of sound reproduction.

SUMMARY OF THE INVENTION

Embodiments of the present invention include micromachined microphones and micromachined multisensors (including both a microphone and an inertial sensor on a single chip) that can be very small and thin. Certain markets for micromachined devices, such as cellular phones and personal digital assistants (PDAs), place considerable value on small, thin components.

In accordance with one aspect of the invention there is provided a method for producing a micromachined microphone from a wafer having at least a first silicon layer. The method involves forming at least one oxide layer on a front side of the first silicon layer, forming a plurality of polysilicon microphone structures including a diaphragm on the at least one oxide layer, and removing a portion of the at least one oxide layer underlying the plurality of polysilicon microphone structures from a back side of the first silicon layer through a plurality of trenches formed through the first silicon layer. The plurality of trenches allow sound waves to reach the diaphragm from the back side of the first silicon layer. For illustrative purposes, the sound path in this exemplary example is described as reaching the diaphragm from the backside. However, a front side sound path is equivalent and is incorporated in the description of all of the process and design variations described herein.

In certain embodiments of the invention, the at least one oxide layer may be formed on the front side of the first silicon layer by depositing a single oxide layer on the front side of the first silicon layer. In other embodiments of the invention, the at least one oxide layer may be formed on the front side of the first silicon layer by forming the trenches through the first silicon layer, depositing a first oxide layer covering the front side of the first silicon layer and lining the trenches, forming a plurality of sacrificial polysilicon microphone structures on the first oxide layer, depositing a second oxide layer over the first oxide layer and the sacrificial polysilicon microphone structures, and removing the sacrificial polysilicon microphone structures. In certain embodiments of the invention, the plurality of sacrificial polysilicon structures are formed on the first oxide layer by depositing a polysilicon layer covering the first oxide layer and filling the lined trenches, and patterning the polysilicon layer to form the plurality of sacrificial polysilicon microphone structures. $XeF_2$ is used as an exemplary example of a polysilicon sacrificial etch material and etch process throughout this description. However, other silicon etchants and etch processes can be used and are incorporated in the description of all of the process and design variants described herein.

Before removing the portion of the at least one oxide layer underlying the plurality of polysilicon structures, an additional oxide layer may be formed over the at least one oxide layer and the plurality of polysilicon structures, the additional oxide layer may be patterned to expose a portion of a polysilicon structure and a portion of the first silicon layer, and metallic electrodes may be formed to at least the exposed portion of the polysilicon structure and the exposed portion of the first silicon layer. At least one metallic bond pad may also be formed at this time. A passivation layer (typically including an oxide layer covered by a nitride layer) may be formed over the metallic electrodes. The passivation layer may be patterned to expose at least a portion of an edge of the diaphragm, and a pedestal may be formed beneath the edge of the diaphragm, for example, by depositing a first photoresist layer over the exposed portion of the edge of the diaphragm, patterning the photoresist material to re-expose the portion of the edge of the diaphragm, removing a portion of oxide beneath the portion of the edge of the diaphragm, and depositing a second photoresist layer forming a pedestal beneath the edge of the diaphragm. Similarly, photoresist may be patterned over holes in the diaphragm to allow a portion of oxide to be removed under the diaphragm. A second layer of photoresist at a plurality of these locations forms a plurality of pedestals directly under the diaphragm. The pedestal supports the diaphragm during removal of the portion of the at least one oxide layer underlying the plurality of polysilicon structures.

The pedestal is removed after removal of the portion of the at least one oxide layer underlying the plurality of polysilicon structures. It should be noted that the described techniques for forming pedestals under the diaphragm, removing sacrificial material, and removal of pedestals may be similar or related to techniques described in U.S. Pat. No. 5,314,572 entitled Method for Fabricating Microstructures, which is hereby incorporated herein by reference in its entirety.

In certain embodiments of the invention, a multisensor including the microphone and an inertial sensor may be formed on the same wafer. The inertial sensor is formed in part by forming a plurality of polysilicon inertial sensor structures during formation of the polysilicon microphone structures and removing a portion of the at least one oxide layer underlying the plurality of polysilicon inertial sensor structures from a back side of the first silicon layer through at least one trench through the first silicon layer during removal of the portion of the at least one oxide layer underlying the plurality of polysilicon microphone structures. As with the microphone, a plurality of sacrificial polysilicon inertial sensor structures may be formed on the first oxide layer during formation of the plurality of sacrificial polysilicon microphone structures, the second oxide layer may be deposited over the sacrificial polysilicon inertial sensor structures, and the sacrificial polysilicon inertial sensor structures may be removed. The polysilicon layer is preferably patterned to form the plurality of sacrificial polysilicon inertial sensor structures during formation of the sacrificial polysilicon microphone structures.

In certain embodiments of the invention, the wafer is an SOI wafer further including a second silicon layer and an intermediate oxide layer between the first silicon layer and the second silicon layer. In this case, removing the portion of the at least one oxide layer underlying the plurality of polysilicon microphone structures from the back side of the first silicon layer may involve removing underlying portions of the second silicon layer and the intermediate oxide layer to form a back side cavity and removing the portion of the at least one oxide layer underlying the plurality of polysilicon microphone structures through the back side cavity. In the case of a multisensor, back side cavities may be formed for both the microphone and the inertial sensor, and the portions of the oxide layers underlying the microphone and inertial sensor structures are removed through the back side cavities. A glass layer may be formed on a back side of the second silicon layer so as to cover and seal the back side cavity of the inertial sensor but not the back side cavity of the microphone.

In accordance with another aspect of the invention there is provided apparatus including a wafer having at least a first silicon layer and including a plurality of trenches formed through the first silicon layer and a plurality of polysilicon microphone structures, including a diaphragm, formed above a front side of the first silicon layer. The plurality of polysilicon microphone structures are formed by depositing at least one oxide layer on the front side of the first silicon layer, forming the polysilicon microphone structures on the at least one oxide layer, and subsequently removing a portion of the at least one oxide layer underlying the plurality of polysilicon microphone structures from a back side of the first silicon layer through the plurality of trenches. The plurality of trenches allow sound waves to reach the diaphragm from the back side of the first silicon layer.

In certain embodiments of the invention, the apparatus may also include a plurality of polysilicon inertial sensor structures formed above the front side of the first silicon wafer, wherein the plurality of polysilicon microphone structures and the plurality of polysilicon inertial sensor structures are formed substantially at the same time using substantially the same processes.

In certain embodiments of the invention, the wafer is an SOI wafer including a second silicon layer and an intermediate oxide layer between the first silicon layer and the second silicon layer, in which case underlying portions of the second silicon layer and the intermediate oxide layer are removed to form a back side cavity exposing the trenches. The trenches may be formed through the first silicon layer through the back side cavity.

In accordance with another aspect of the invention there is provided apparatus including a micromachined microphone and a micromachined inertial sensor formed on the same wafer. The microphone and the inertial sensor include polysilicon structures formed above a front side of a top silicon layer of the wafer. The top silicon layer includes a plurality of trenches allowing removal of oxide underlying the polysilicon structures from a back side of the top silicon layer during production and also allowing sound waves to reach a microphone diaphragm from the back side.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The foregoing and advantages of the invention will be appreciated more fully from the following further description thereof with reference to the accompanying drawings wherein:

FIGS. 8A-8M demonstrate an exemplary process for forming a combined microphone and three-axis accelerometer from an SOI wafer in accordance with an embodiment of the present invention.

Unless noted otherwise, the drawings are not drawn to scale.

DETAILED DESCRIPTION OF A PREFERRED EMBODIMENT

In embodiments of the present invention, a micromachined microphone is formed from a silicon or silicon-on-insulator (SOI) wafer. As known in the art, a SOI wafer includes a top silicon layer, usually called the device layer, an intermediate insulator (oxide) layer, and a bottom silicon layer that is typically much thicker than the top silicon layer (approximately 650 microns). In this invention, the top layer formed in either a silicon or a SOI wafer may be approximately 10 microns thick in some embodiments of the invention or much thicker, approximately 50 microns thick, in other embodiments. In embodiments of the present invention, the fixed sensing electrode (also referred to herein as a "backplate") is formed from the top silicon layer of the wafer, and the diaphragm is formed so as to be suspended above the top silicon layer. Perforations are formed in the fixed sensing electrode to allow sound waves to reach the diaphragm from the bottom side of the wafer. An oxide layer on the back side of the top silicon layer, which may be the inherent oxide layer of a SOI wafer or an oxide layer deposited on a silicon wafer, is used as an etch stop layer for controlling the machining of the fixed sensing electrode. In certain embodiments of the invention, an inertial sensor, such as a micromachined accelerometer or gyroscope, is formed on the same wafer as the microphone. For convenience, such an arrangement may be referred to hereinafter as a "multisensor," since it includes multiple micromachined sensor elements on a single chip. Provision is made for having the microphone diaphragm open to air but the inertial sensor hermetically sealed.

A first exemplary process for forming a micromachined microphone from an SOI wafer in accordance with an embodiment of the present invention is described with reference to FIGS. 2A-2N.

Figure 1:
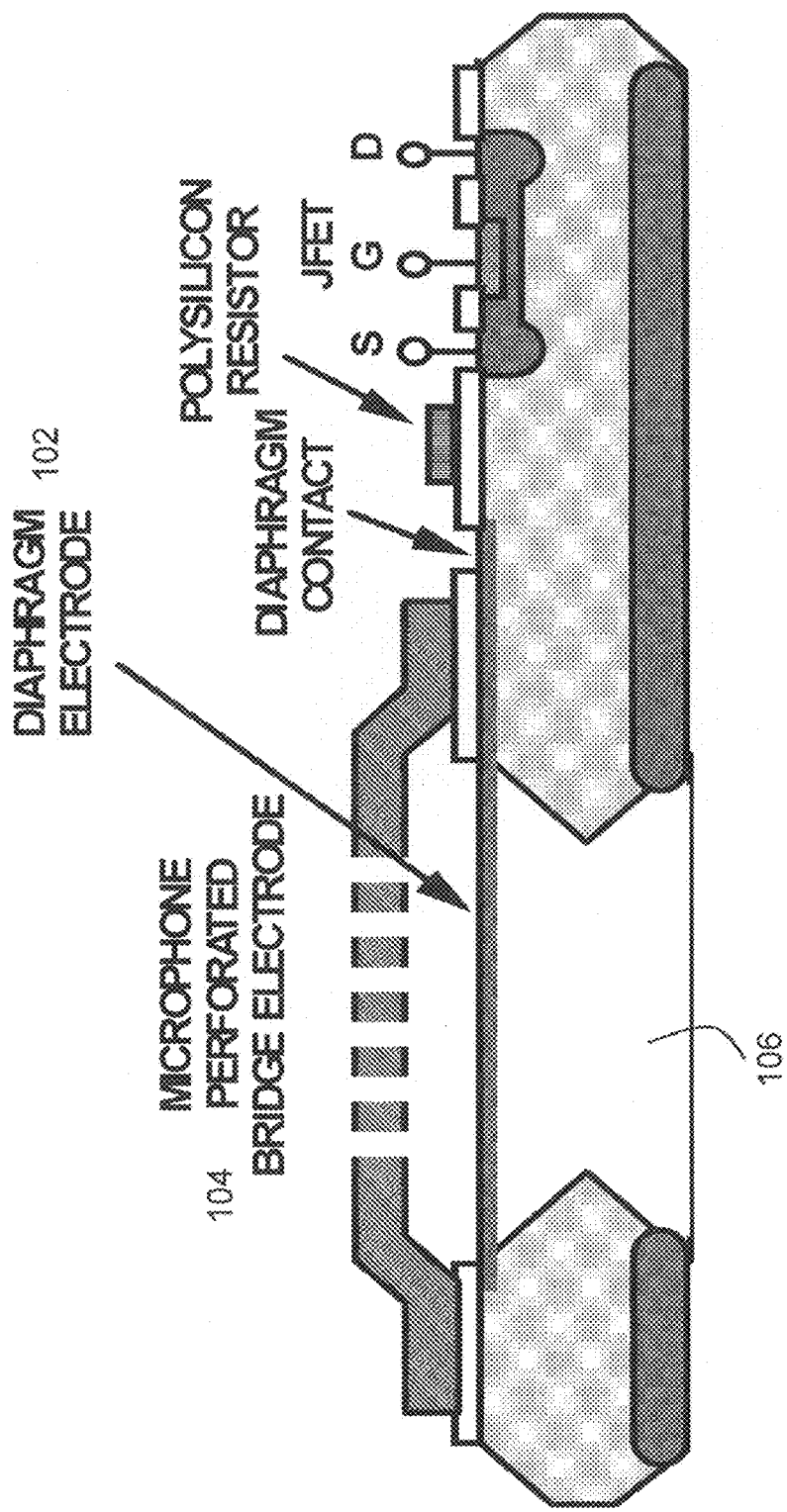
FIG. 1 shows the general structure of a micromachined microphone as known in the art.
Figure 2A:
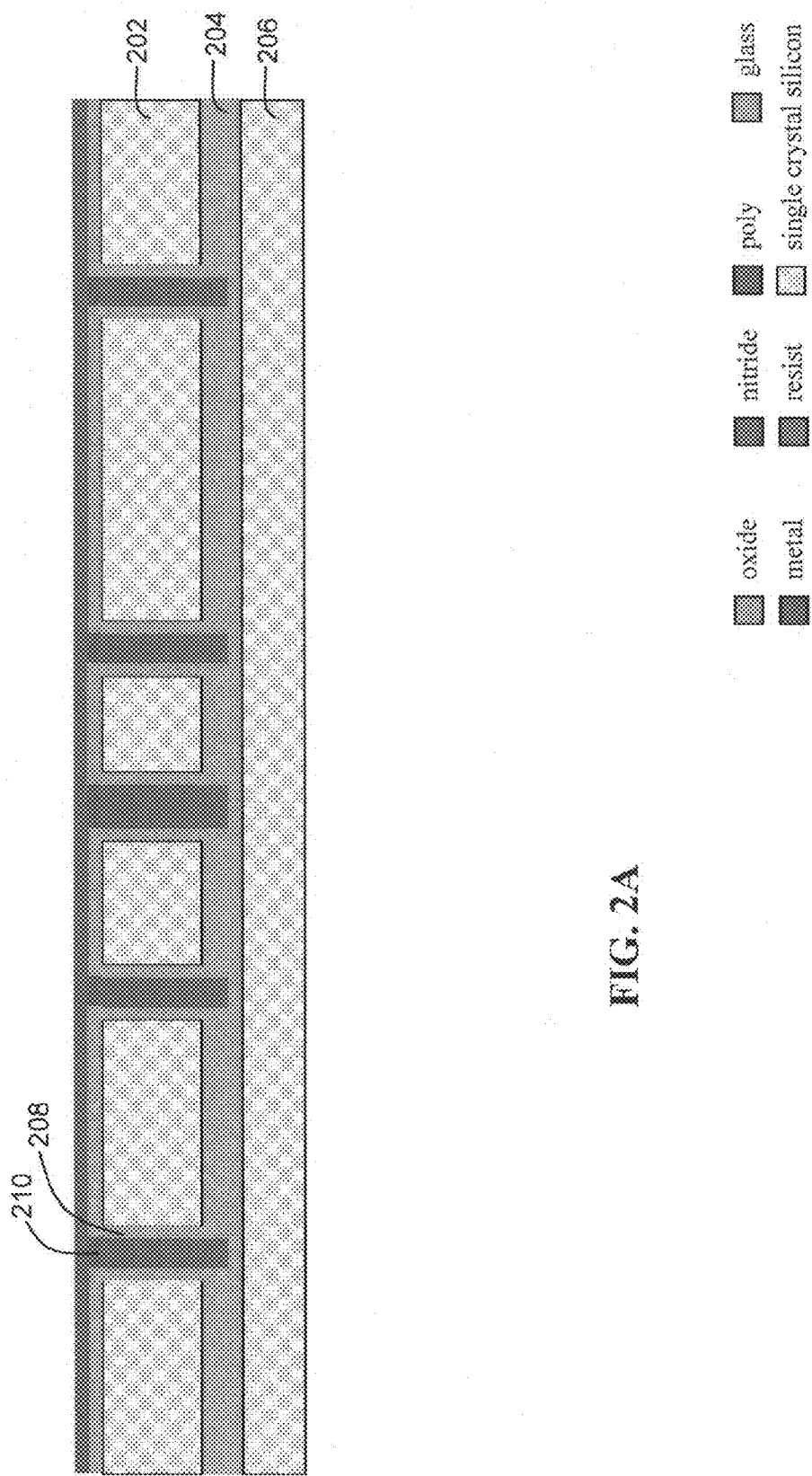
FIGS. 2A-2N demonstrate a first exemplary process for forming a micromachined microphone from an SOI wafer in accordance with an embodiment of the present invention.

In FIG. 2A, trenches are etched through the top silicon layer 202 of a blank SOI wafer into the intermediate oxide layer 204 and optionally through to the bottom silicon layer 206. The trenches are then lined with an oxide material 208. A polysilicon material 210 is then deposited so as to fill the lined trenches and cover the top silicon.

Figure 2B:
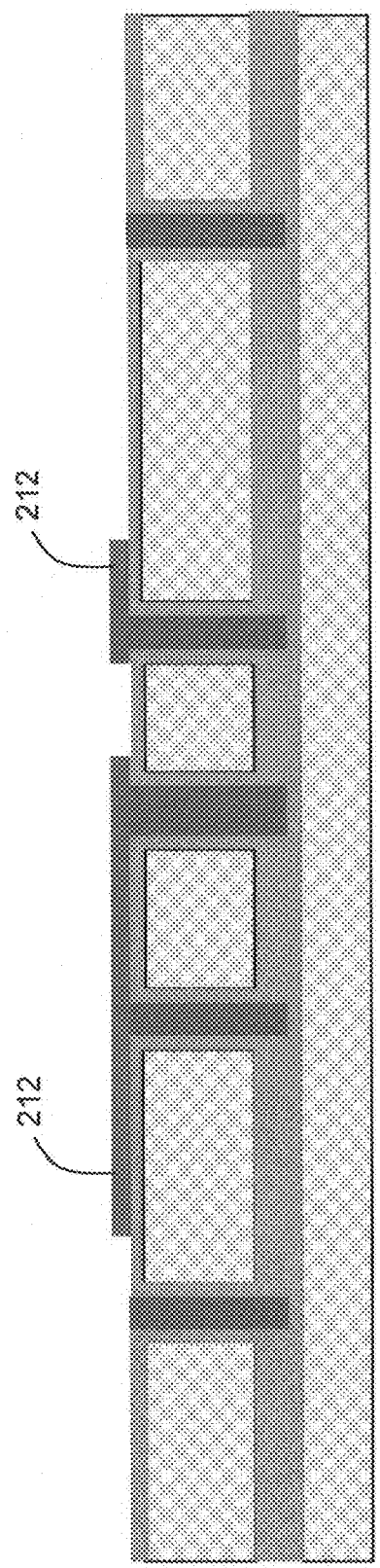

In FIG. 2B, the polysilicon material is patterned and etched to form various sacrificial structures 212 that will be removed later.

Figure 2C:
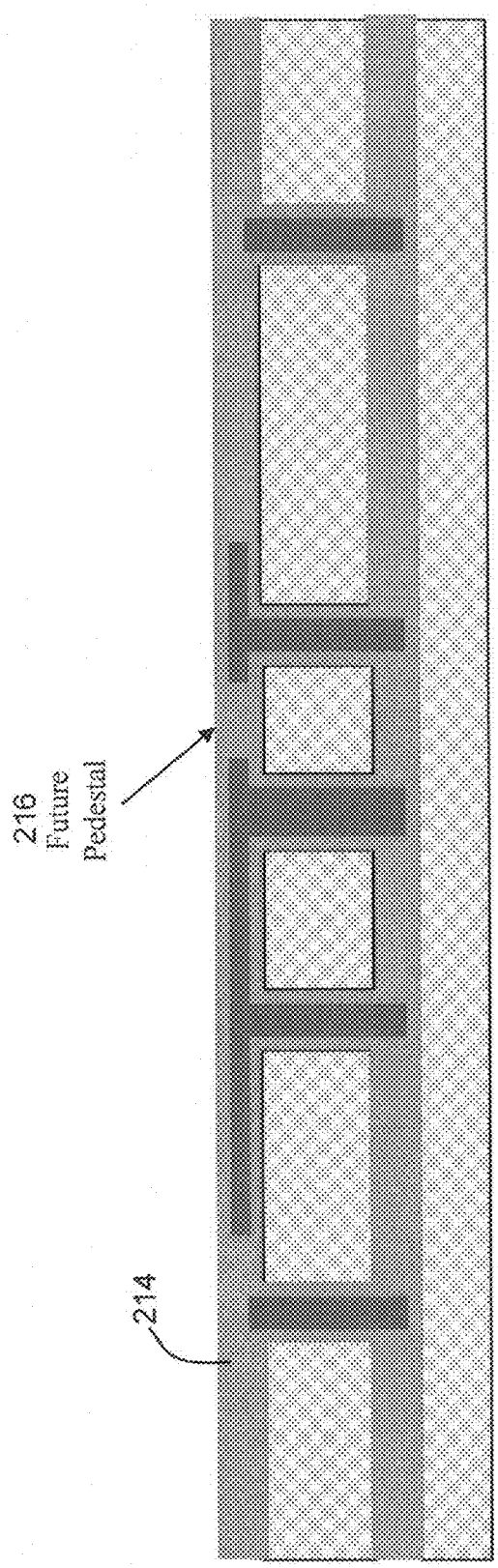

In FIG. 2C, additional oxide material 214 is deposited. The site of a future oxide pedestal 216, described below, is highlighted.

Figure 2D:
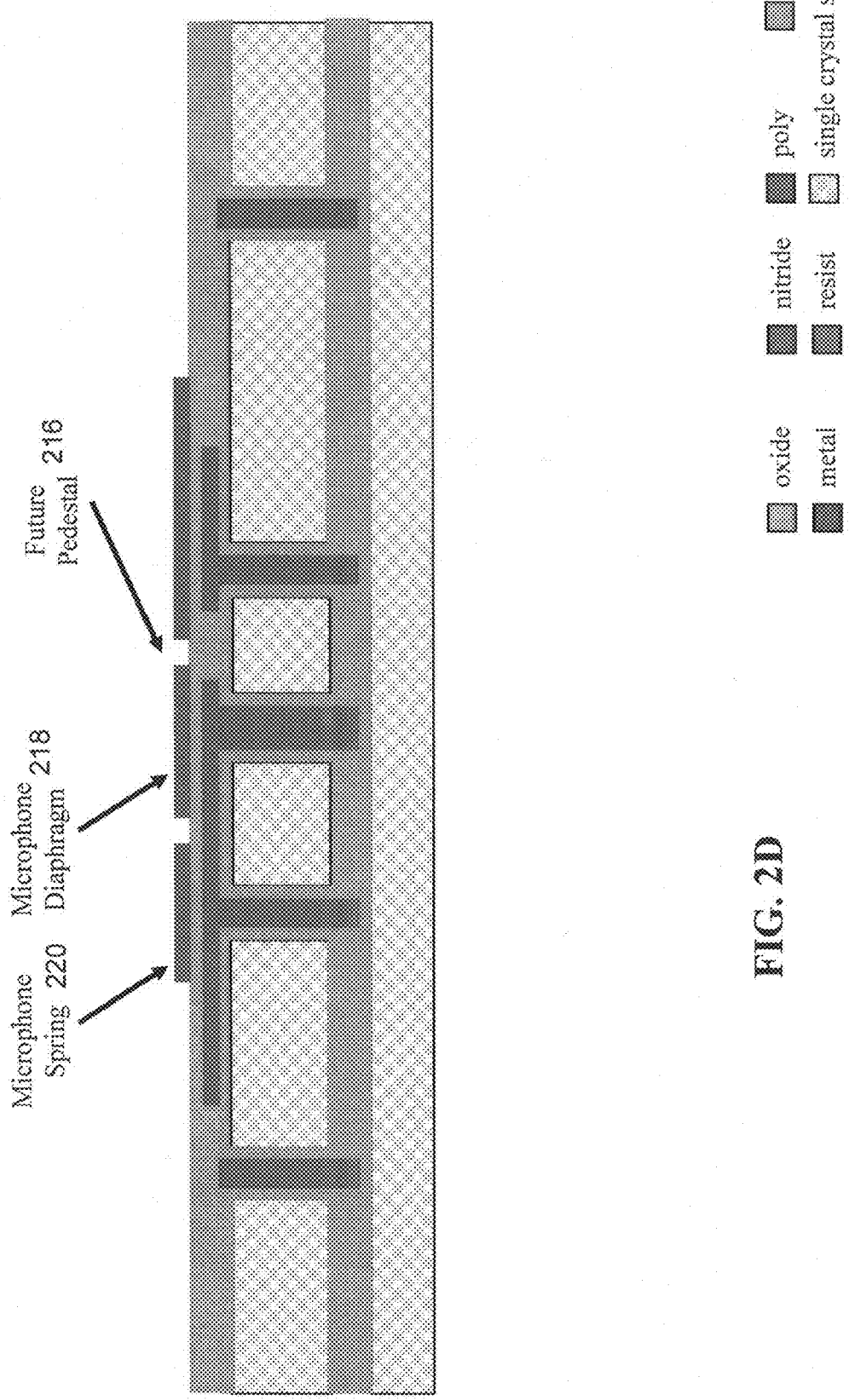

In FIG. 2D, features including the microphone diaphragm 218 and suspension spring 220 are deposited and patterned from a polysilicon material. The diaphragm is typically round, although this is not a requirement of the invention. The diaphragm may be solid or perforated. The gap between the diaphragm and the surrounding polysilicon is preferably very small so that the sound waves act substantially on one side of the diaphragm only.

Figure 2E:
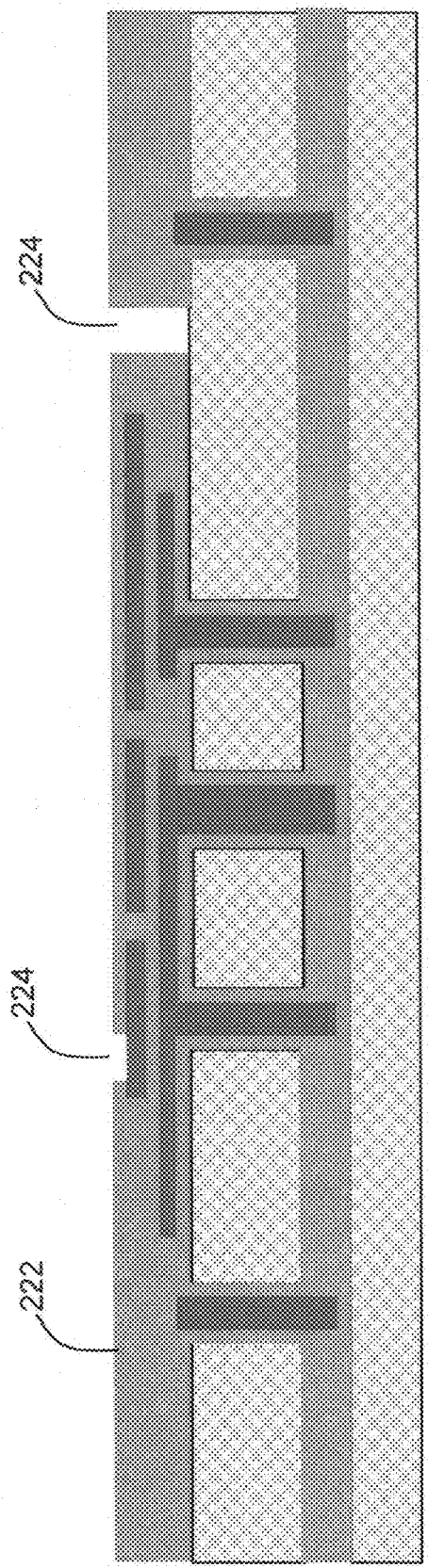

In FIG. 2E, oxide 222 is deposited, and holes 224 are etched. The holes are used for electrodes that make electrical connections to the diaphragm and backplate, as described below.

Figure 2F:
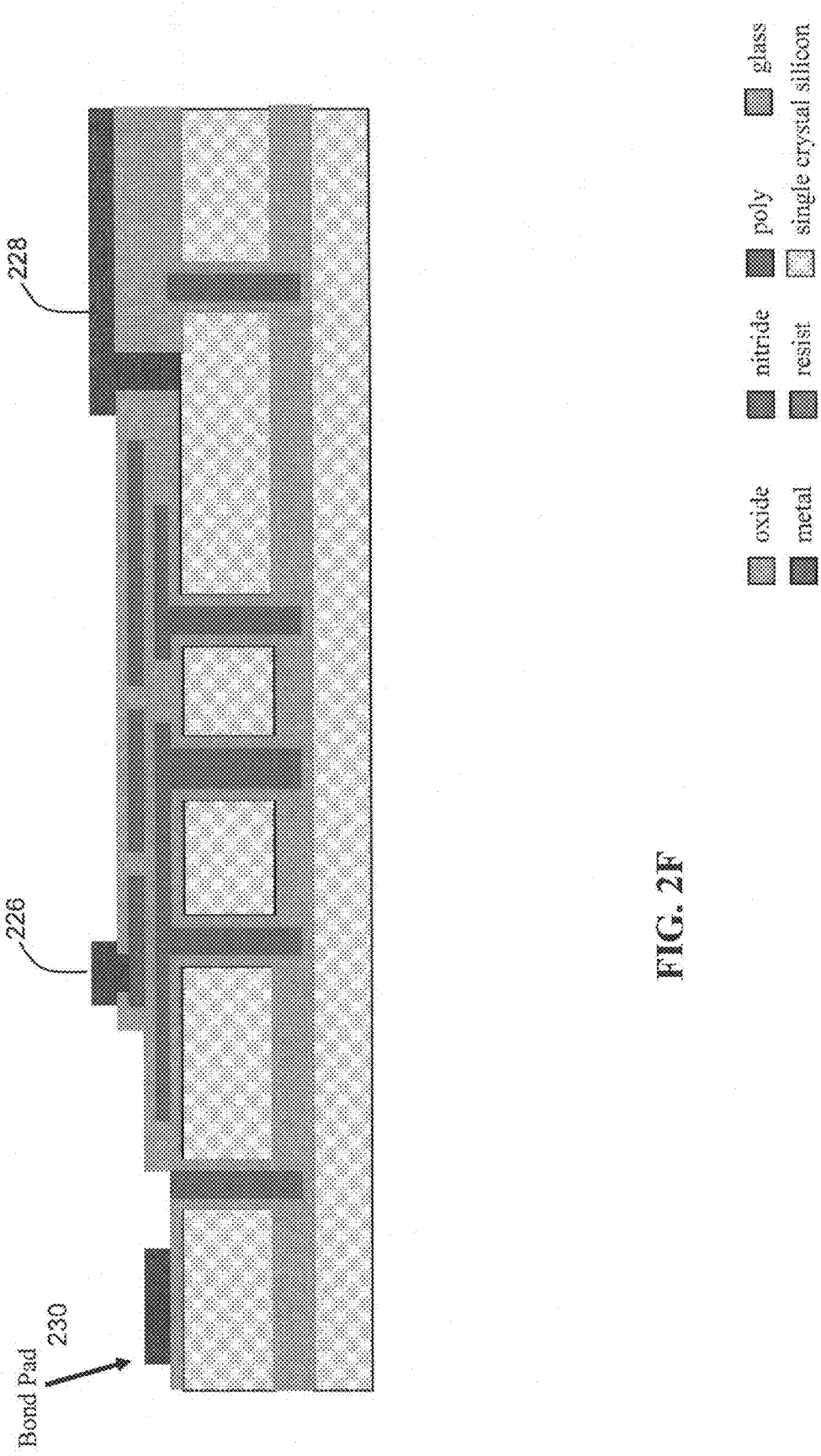

In FIG. 2F, metal is deposited and patterned in order to form an electrode 226 for placing electrical charge on the diaphragm, an electrode 228 for placing electrical charge on the backplate, and a plurality of bond pads 230. There may be electrical connections (not shown) between bond pads 230 and the electrodes 226 and 228.

Figure 2G:
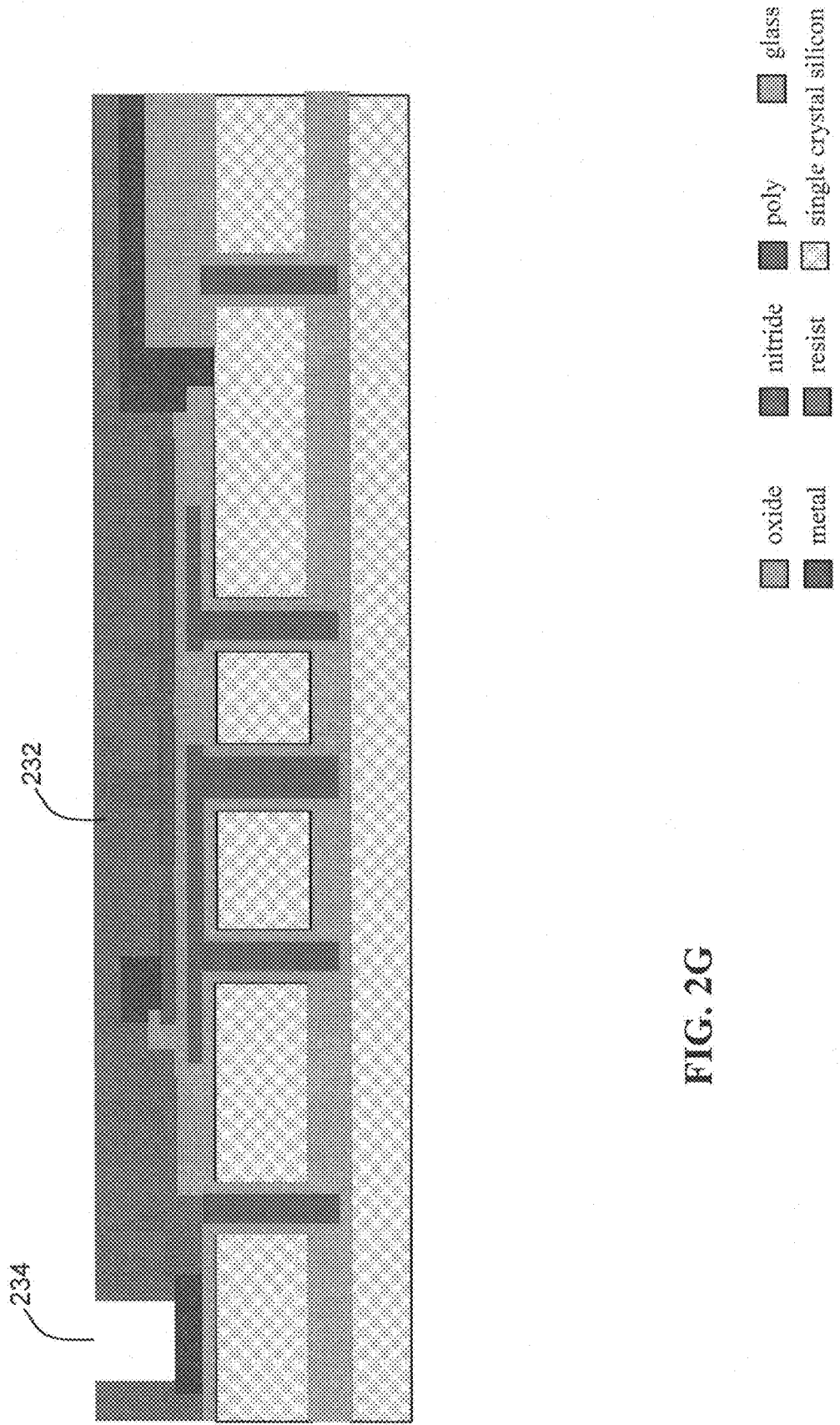

In FIG. 2G, passivation layers 232 are deposited. The passivation layers typically include an oxide layer covered by a nitride layer, which is a standard passivation layer used for integrated circuitry. The passivation layers 232 are etched at 234 to expose the bond pad 230.

Figure 2H:
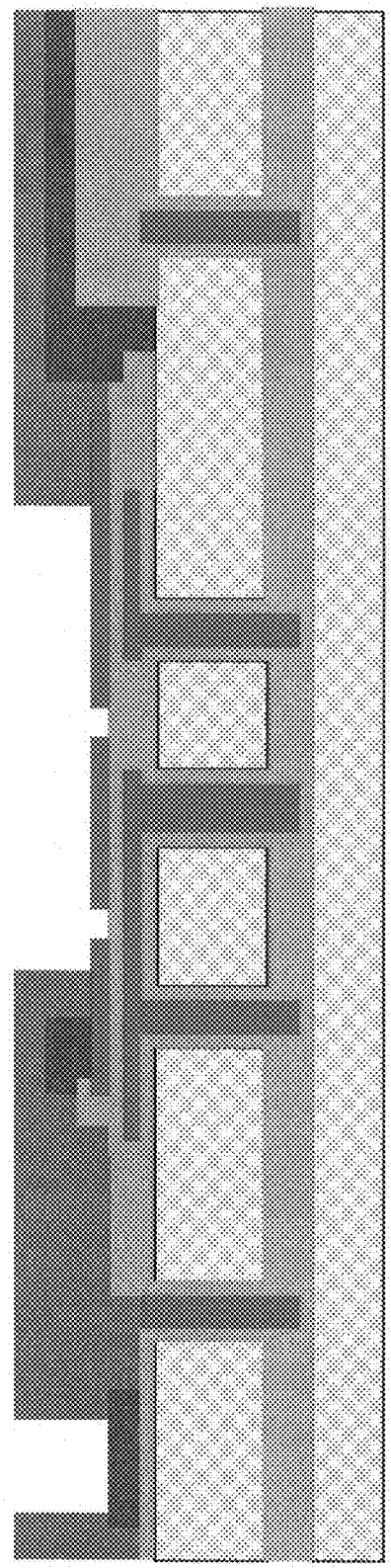

In FIG. 2H, the passivation layers 232 are etched to expose the diaphragm 218.

Figure 2I:
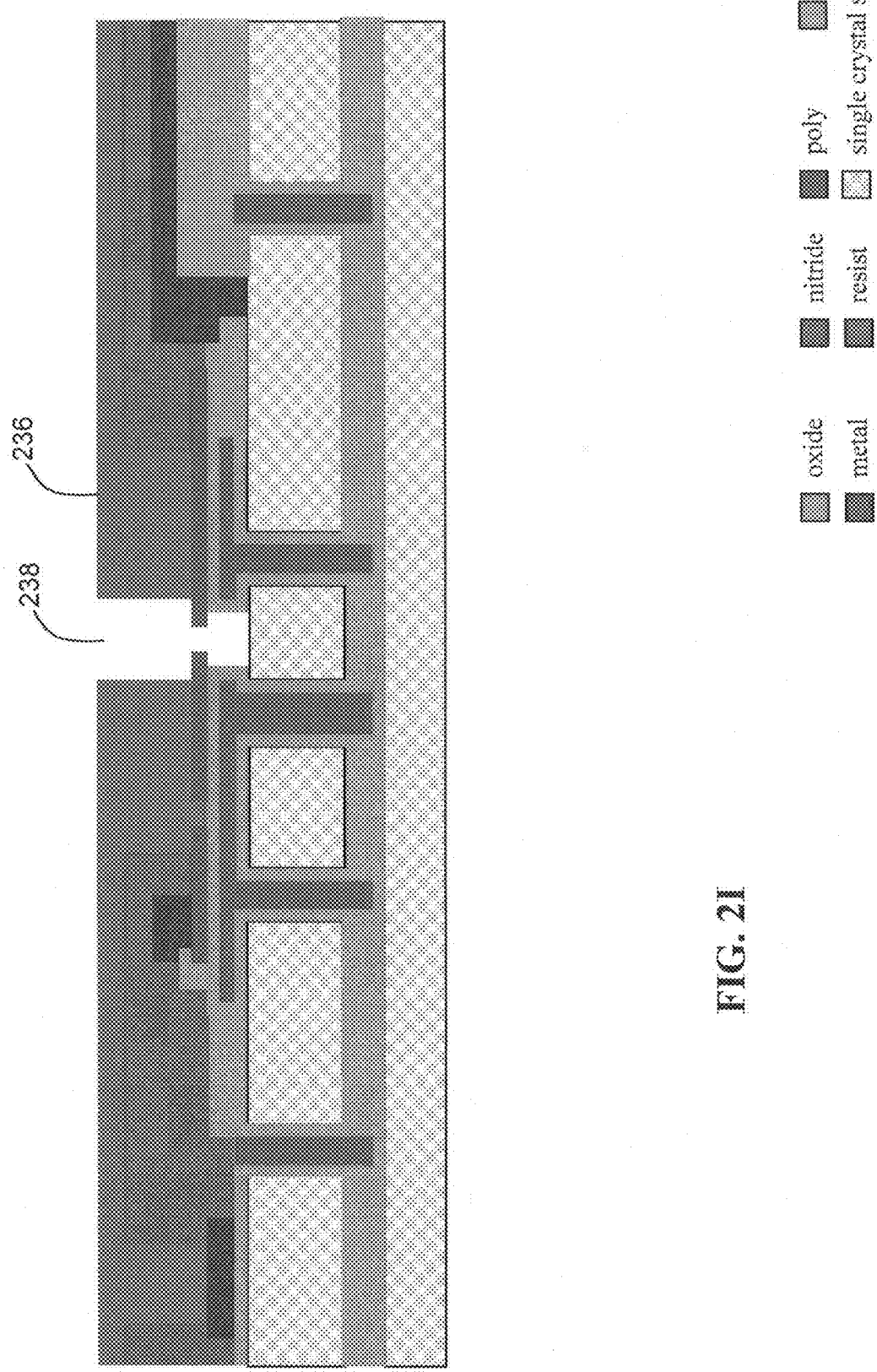

In FIG. 2I, a photoresist material 236 is deposited and then patterned to expose the future pedestal area 238. The oxide at the future pedestal area is then removed by etching.

Figure 2J:
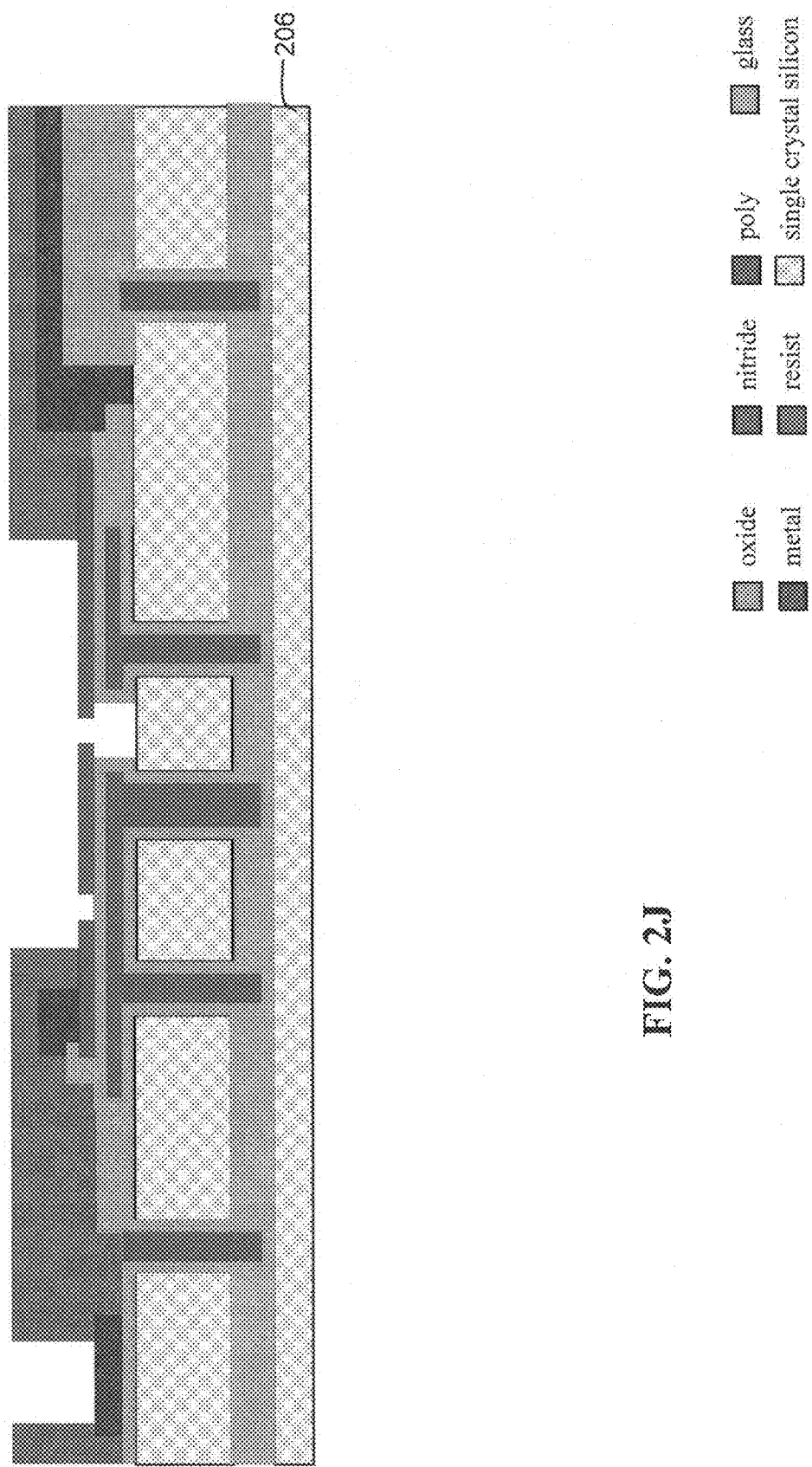

In FIG. 2J, the remaining photoresist material is removed, and the bottom silicon layer 206 is optionally thinned from approximately 650 microns to approximately 350 microns by any of several methods including etching, grinding and polishing.

Figure 2K:
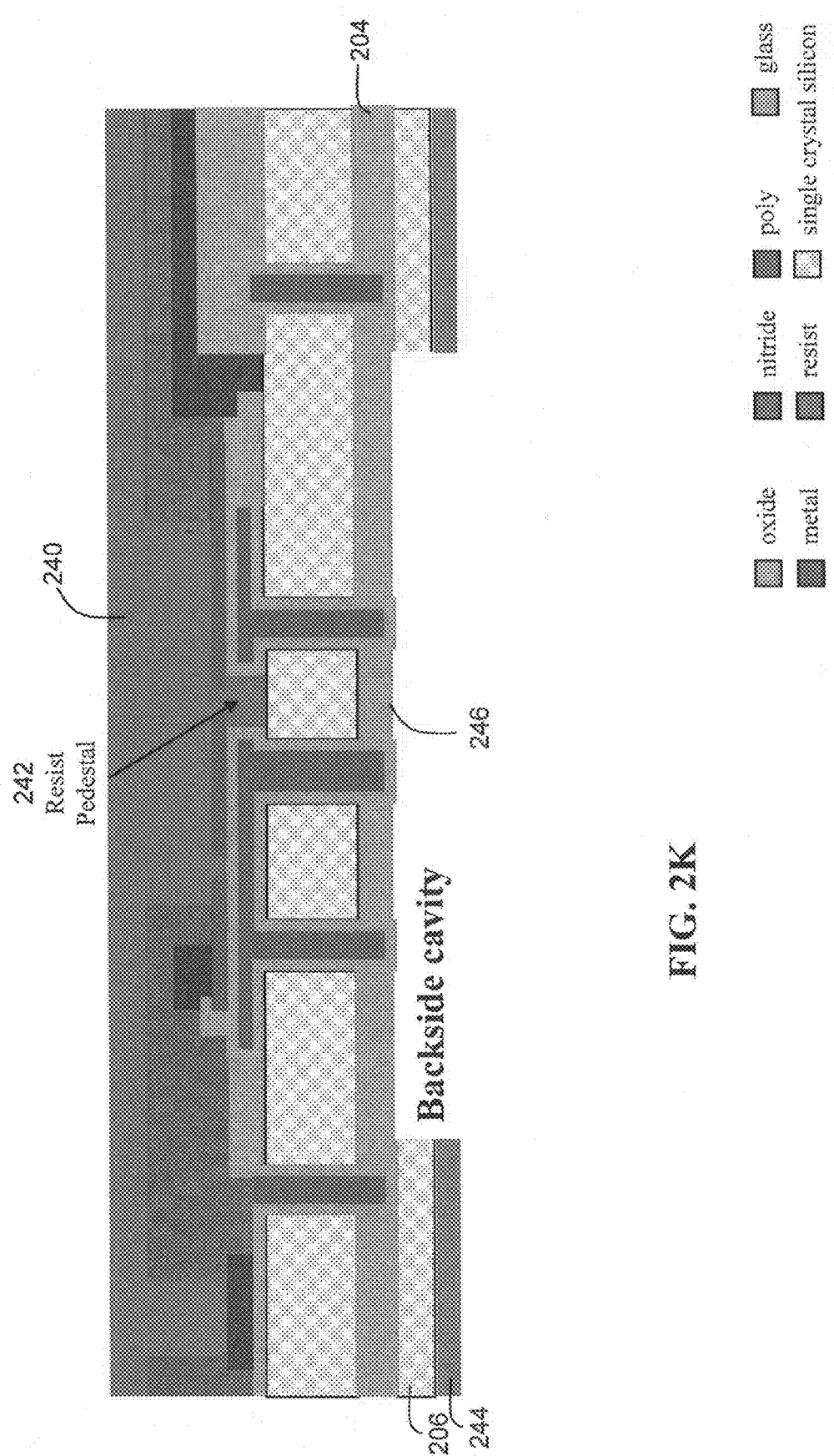

In FIG. 2K, photoresist material 240 is deposited on the front side of the wafer so as to form a photoresist pedestal 242. Photoresist material 244 is also deposited on back side of the wafer and patterned to outline a backside cavity 246. The backside cavity 246 is formed by etching away a portion of the bottom silicon layer 206 to the intermediate oxide layer 204. In an exemplary embodiment, the backside cavity 246 after packaging is approximately one cubic millimeter in volume.

Figure 2L:
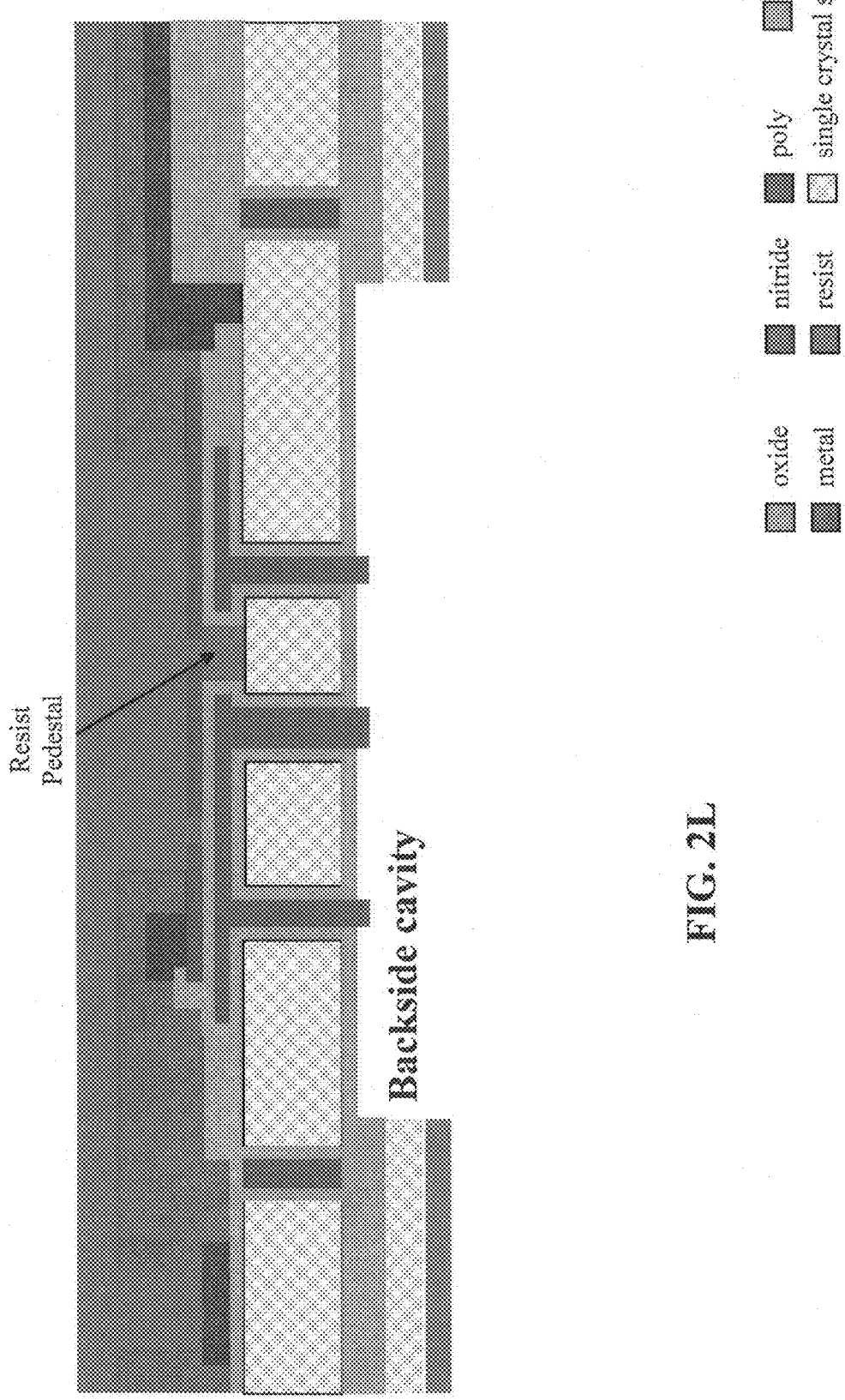

In FIG. 2L, a portion of the intermediate oxide layer within the cavity 246 is removed in order to expose the sacrificial polysilicon structures.

Figure 2M:
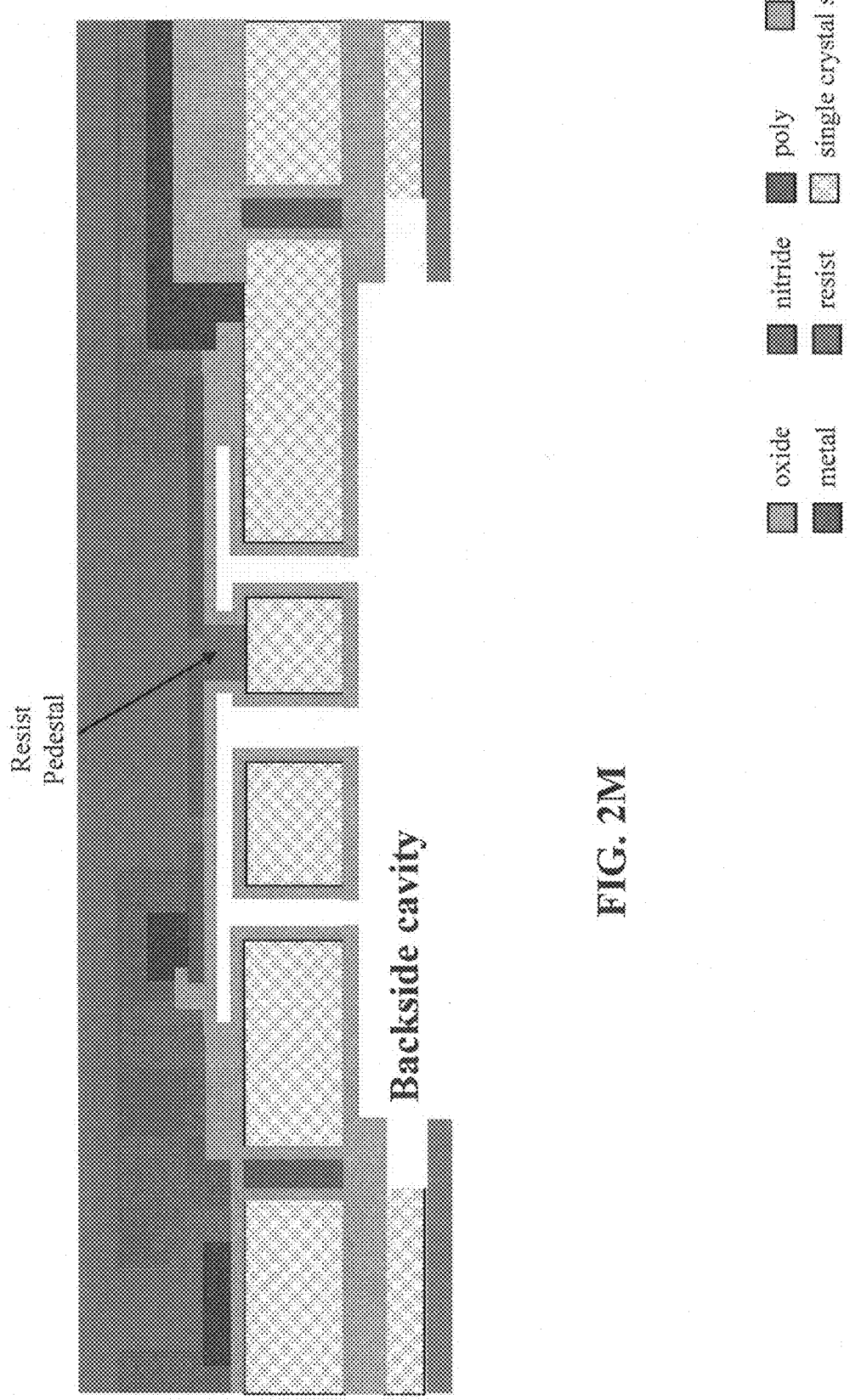

In FIG. 2M, the sacrificial polysilicon structures are removed, preferably by exposing the polysilicon to $XeF_2$ gas or another suitable silicon etchant through the backside cavity 246. It should be noted that the $XeF_2$ gas may remove some of the exposed bottom silicon layer, although this is generally undesirable.

Figure 2N:
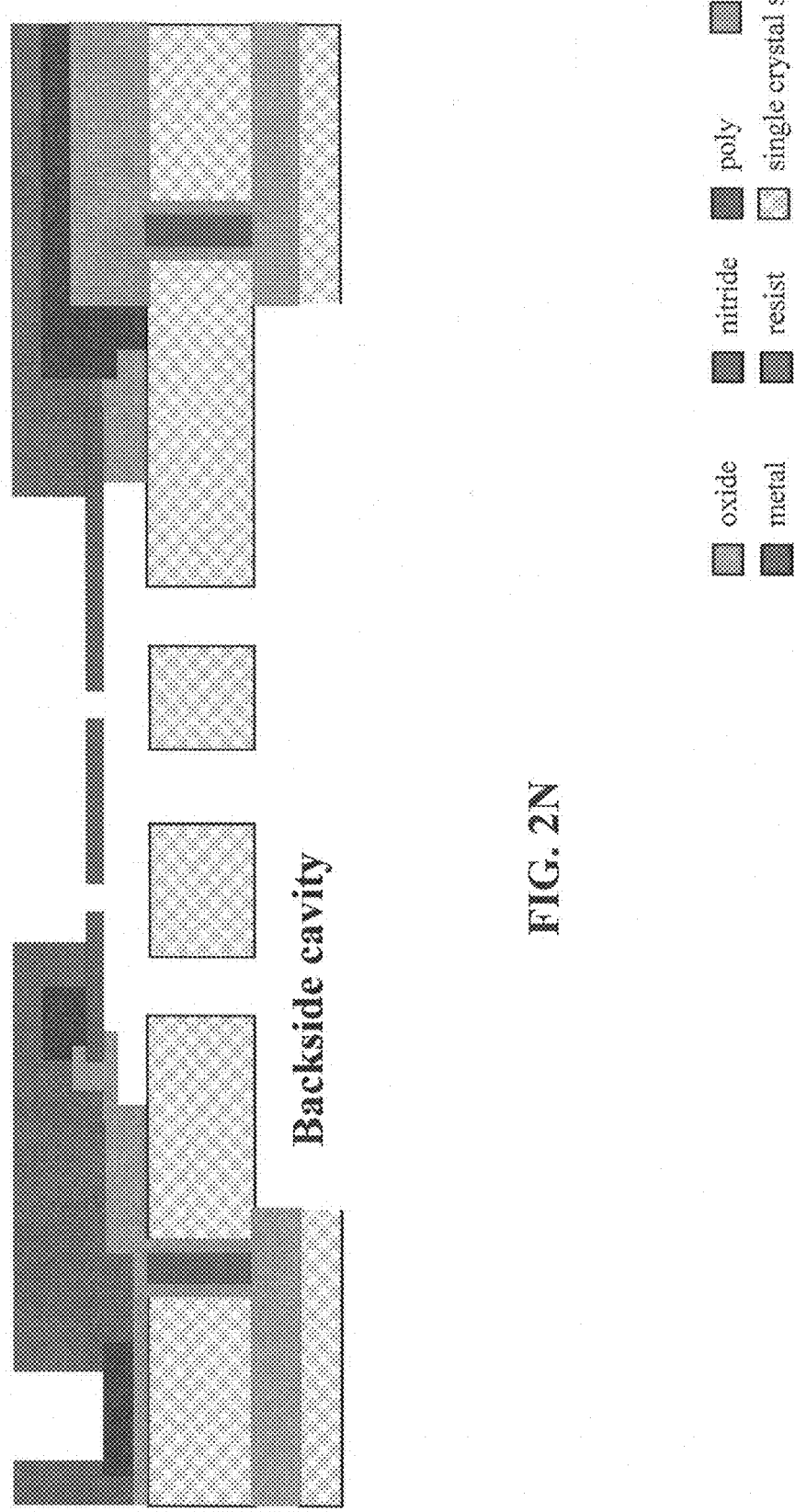

In FIG. 2N, the oxide behind the diaphragm 218 is removed, preferably by placing in an appropriate liquid. Then, the front side photoresist material 240 (including the pedestal) is removed, preferably in a dry etch (not a liquid). This essentially releases the diaphragm and related structures. It should be noted that the pedestal is used to support the delicate microphone structures during release and may not be required in all embodiments, particularly if vapor HF is used to remove the oxide instead of a liquid.

In certain embodiments of the invention, a micromachined microphone and an inertial sensor (such as a gyroscope or accelerometer) are formed on the same wafer and are integrated into a single chip. The microphone is generally open to air in order to allow sound waves to reach the microphone diaphragm, although the inertial sensor may be hermetically sealed on the wafer.

Figure 4:
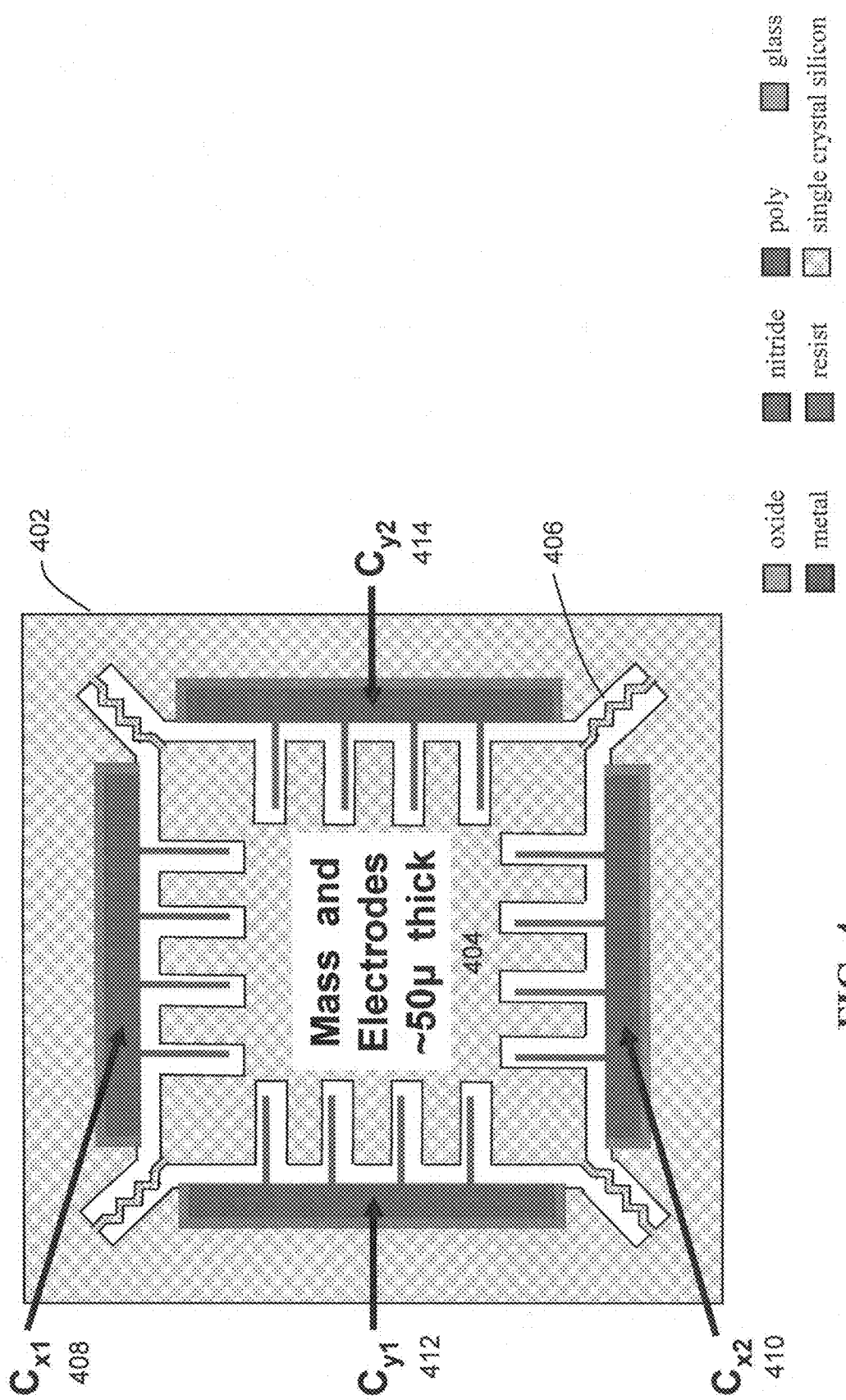
FIG. 4 shows the general layout of a first exemplary two-axis (X-Y) accelerometer in accordance with an embodiment of the present invention.

FIG. 4 shows the general layout of a first exemplary two-axis (X-Y) accelerometer in accordance with an embodiment of the present invention. The accelerometer includes a frame 402 and a mass 404 that is suspended from the frame by a number of suspension springs 406. The mass includes a number of finger structures that are interdigitated with a number of fixed sensing fingers. In this example, there are two sets of fixed sensing fingers 408 and 410 for sensing movement of the mass 404 relative to the frame 402 in the X axis and two sets of fixed sensing fingers 412 and 414 for sensing movement of the mass 404 relative to the frame 402 in the Y axis. In the example shown in FIG. 4, the fixed sensing fingers are off-center (i.e., are closer to one mass finger than to the adjacent mass finger), which allows for differential capacitance measurement.

Figure 5:
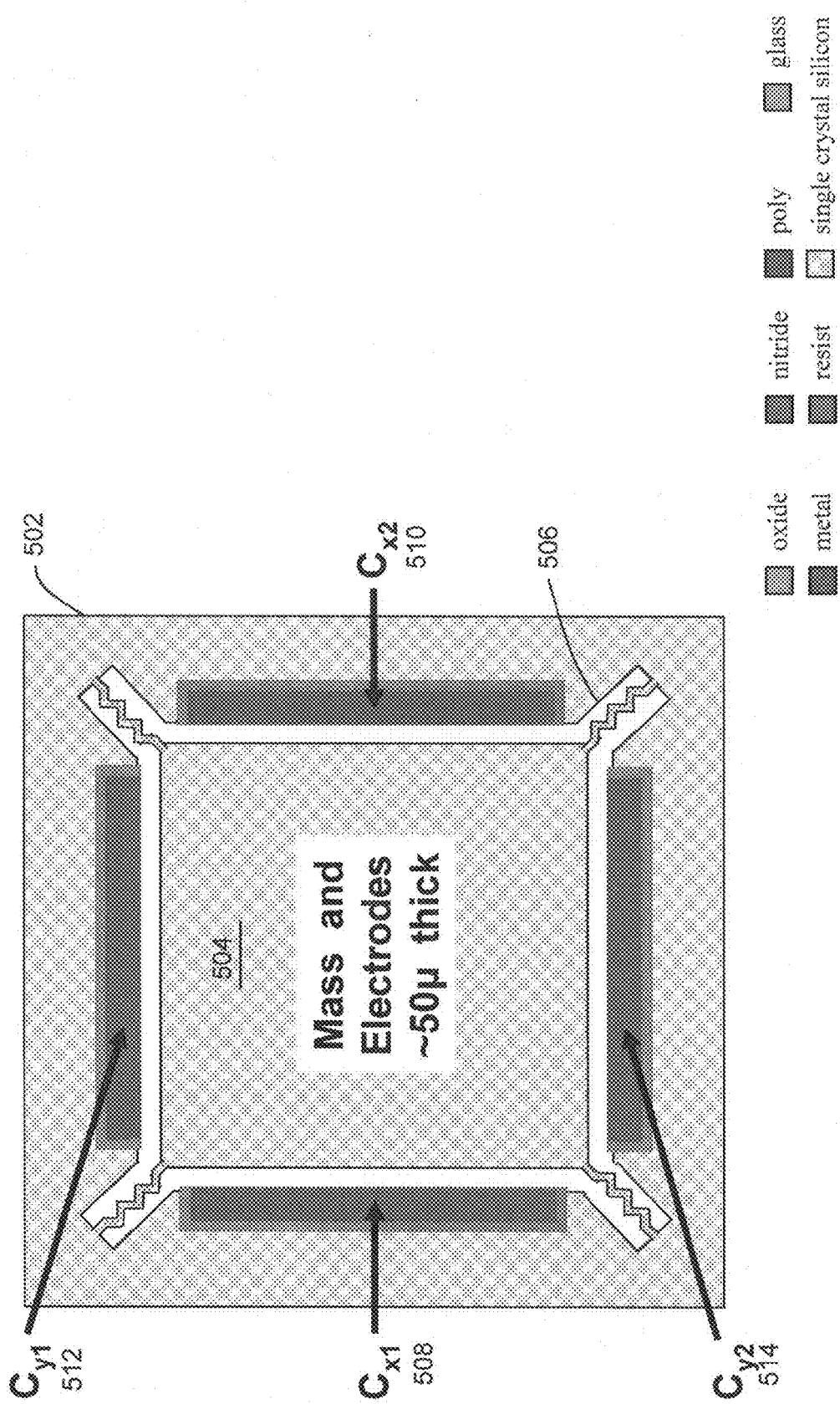
FIG. 5 shows the general layout of a second exemplary two-axis (X-Y) accelerometer in accordance with an embodiment of the present invention.

FIG. 5 shows the general layout of a second exemplary two-axis (X-Y) accelerometer in accordance with an embodiment of the present invention. The accelerometer includes a frame 502 and a mass 504 that is suspended from the frame by a number of suspension springs 506. In this example, there are two electrodes 508 and 510 for sensing movement of the mass 504 relative to the frame 502 in the X axis and two electrodes 512 and 514 for sensing movement of the mass 504 relative to the frame 502 in the Y axis.

Figure 6:
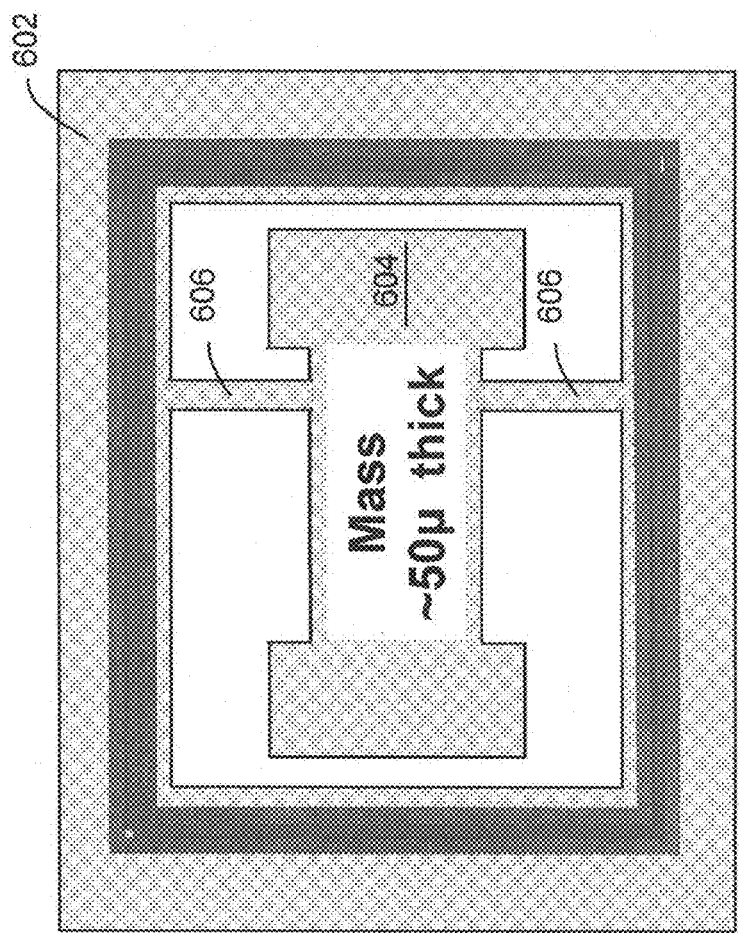
FIG. 6 shows the general layout of an exemplary Z-axis accelerometer in accordance with an embodiment of the present invention.

FIG. 6 shows the general layout of an exemplary Z-axis accelerometer in accordance with an embodiment of the present invention. The accelerometer includes a frame 602 and a mass 604 that is suspended from the frame by a number of suspension springs 606. In this example, the mass 604 is designed to pivot or "teeter-totter" about the springs 606 under z-axis acceleration so that there is displacement of the mass out of the plane of the frame/mass. Electrodes (not shown) are positioned to detect such out-of-plane movement of the mass 604.

An exemplary process for forming a combined microphone and two-axis accelerometer from an SOI wafer is described with reference to FIGS. 7A-7N. In order to show both the microphone region and the accelerometer region of the wafer at each step, the microphone region is shown above the accelerometer region, although it is understood that the regions are actually beside one another on the wafer. It should be noted that this process is a variation of the one described above with reference to FIGS. 2A-2N, and these processes could be used to produce just the micromachined microphone, or, for that matter, just the accelerometer.

Figure 7A:
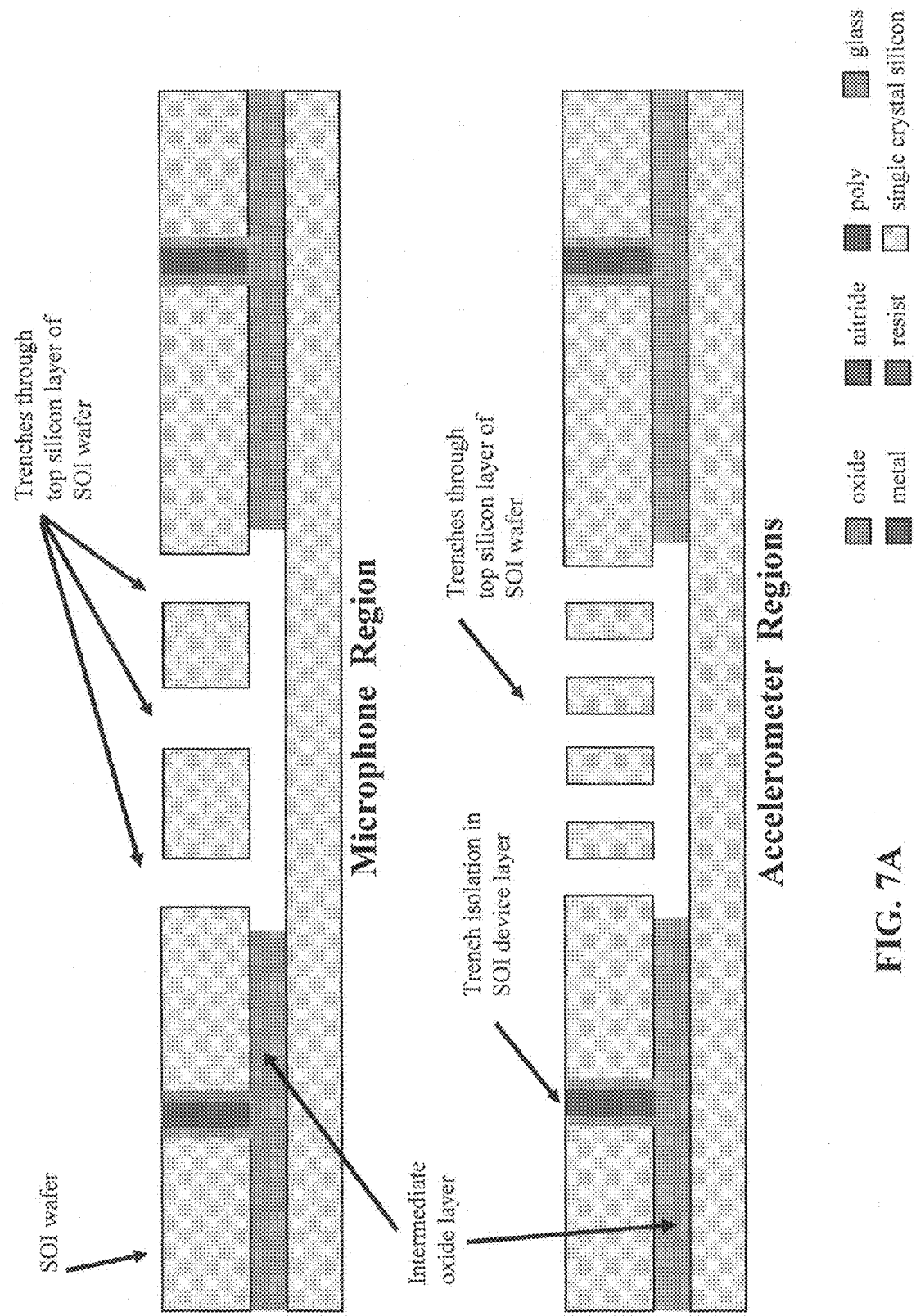
FIGS. 7A-7N demonstrate an exemplary process for forming a combined microphone and two-axis accelerometer from an SOI wafer in accordance with an embodiment of the present invention.

In FIG. 7A, trenches are etched through the top silicon layer of a SOI wafer in both the microphone region and the accelerometer region. Portions of the intermediate oxide layer beneath the trenches is removed.

Figure 7B:
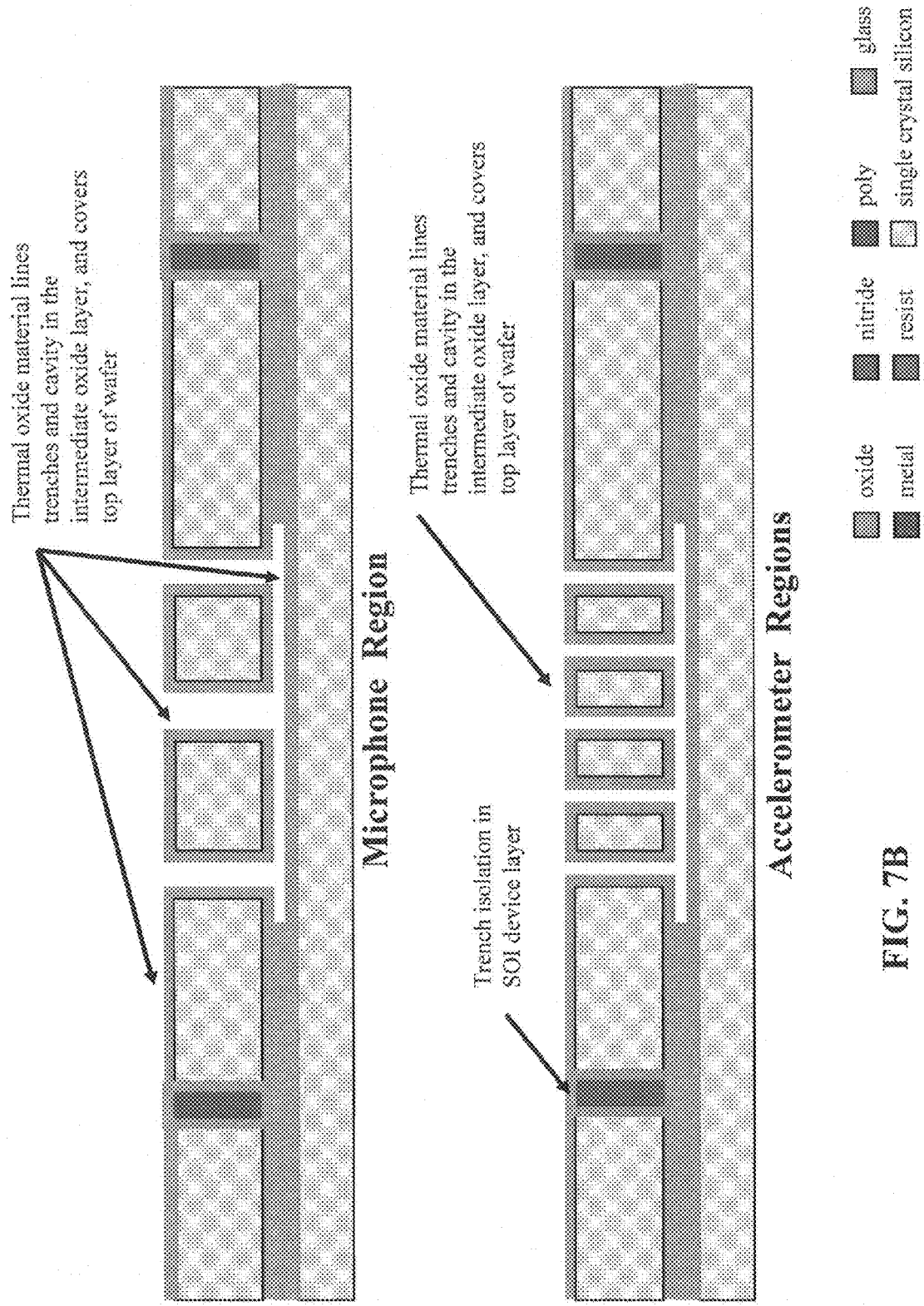

In FIG. 7B, a thermal oxide material is grown. This lines the trenches and the cavity in the intermediate oxide layer and also covers the top layer of the wafer.

Figure 7C:
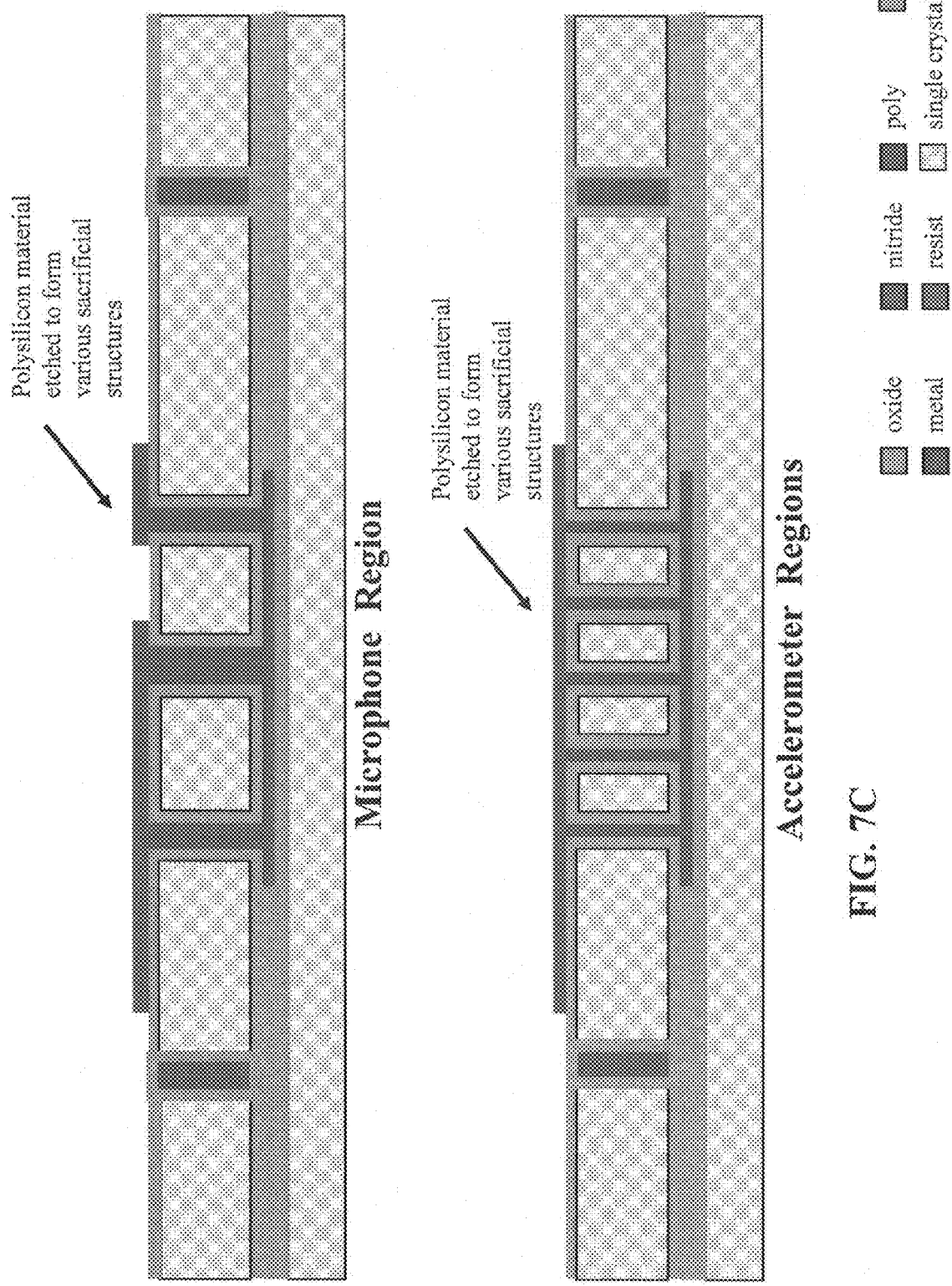

In FIG. 7C, a polysilicon material is patterned and etched to form various sacrificial structures that will be removed later.

Figure 7D:
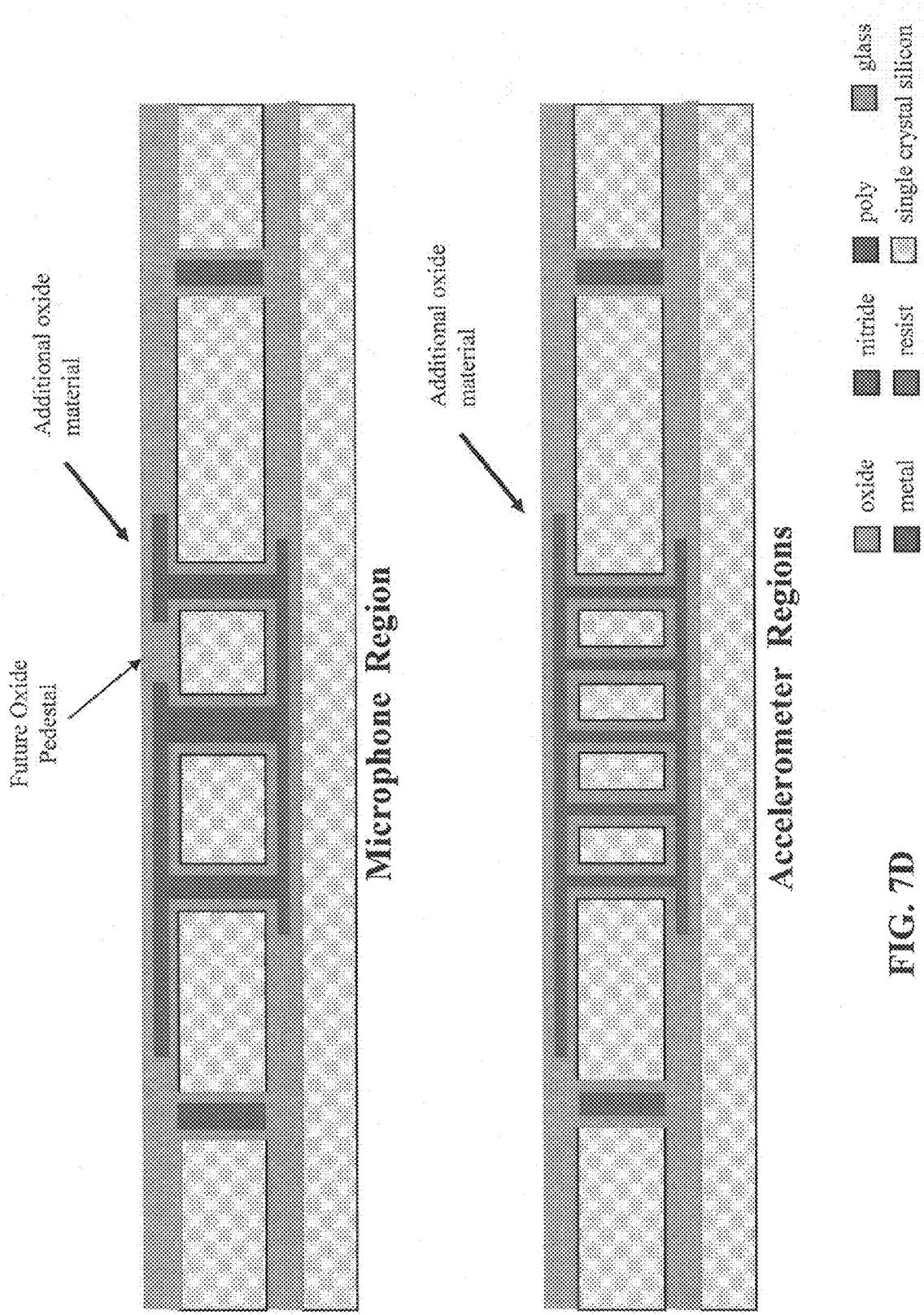

In FIG. 7D, additional oxide material is deposited. The site of a future oxide pedestal, described below, is highlighted.

Figure 7E:
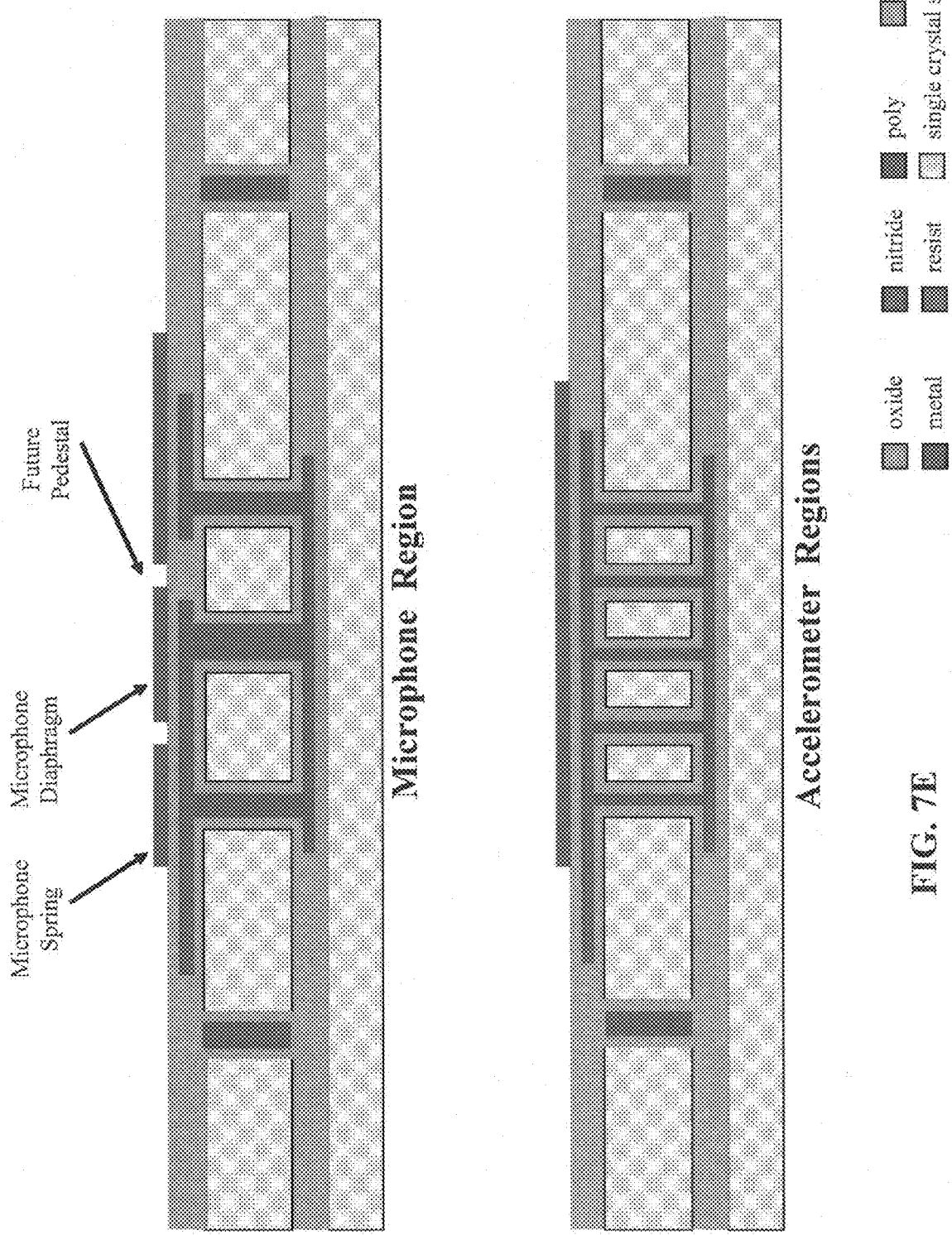

In FIG. 7E, features including the microphone diaphragm, microphone suspension springs, and accelerometer electrode are deposited and patterned from a polysilicon material. The diaphragm is typically round, although this is not a requirement of the invention. The diaphragm may be solid or perforated. The gap between the diaphragm and the surrounding polysilicon is preferably very small so that the sound waves act substantially on one side of the diaphragm only.

Figure 7F:
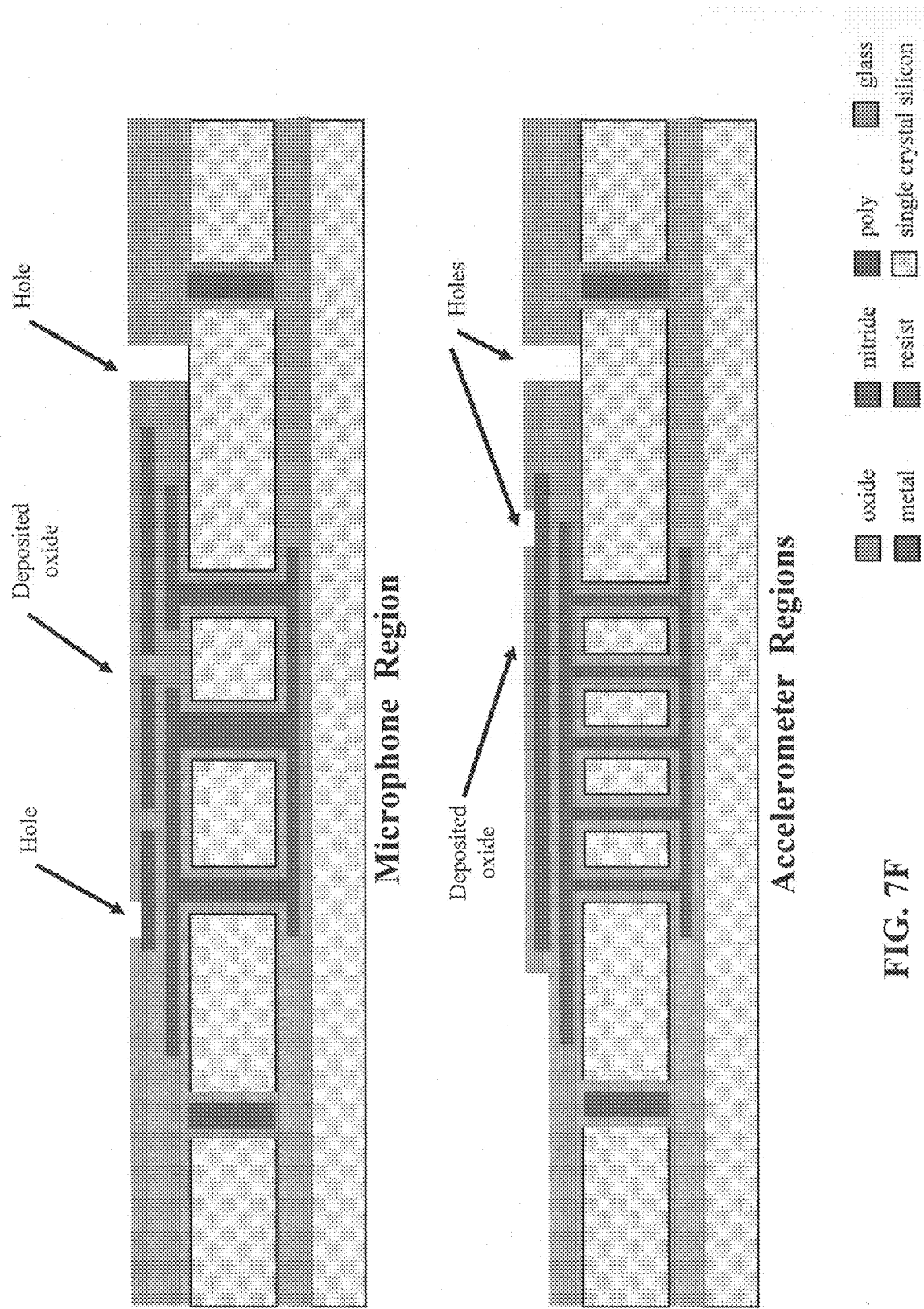

In FIG. 7F, oxide is deposited, and holes are etched. The holes are used for electrodes to the microphone diaphragm and backplate as well as to the accelerometer electrode and intermediate oxide layer, as described below.

Figure 7G:
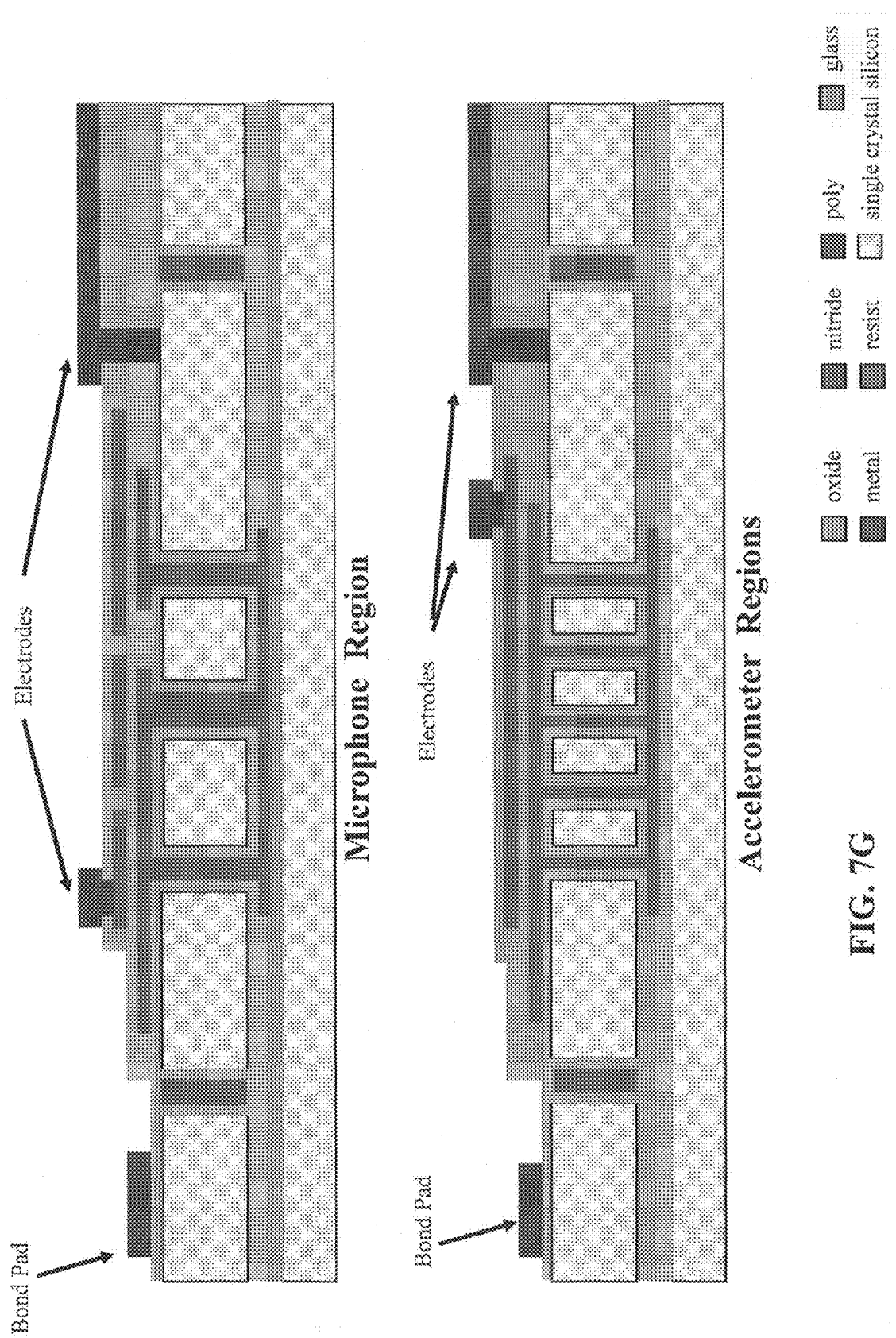

In FIG. 7G, metal is deposited and patterned in order to form bond pads and electrodes for placing charge on the microphone diaphragm and backplate as well as on the accelerometer electrode and intermediate oxide layer. There may be electrical connections (not shown) between the bond pads and one or more of the electrodes.

Figure 7H:
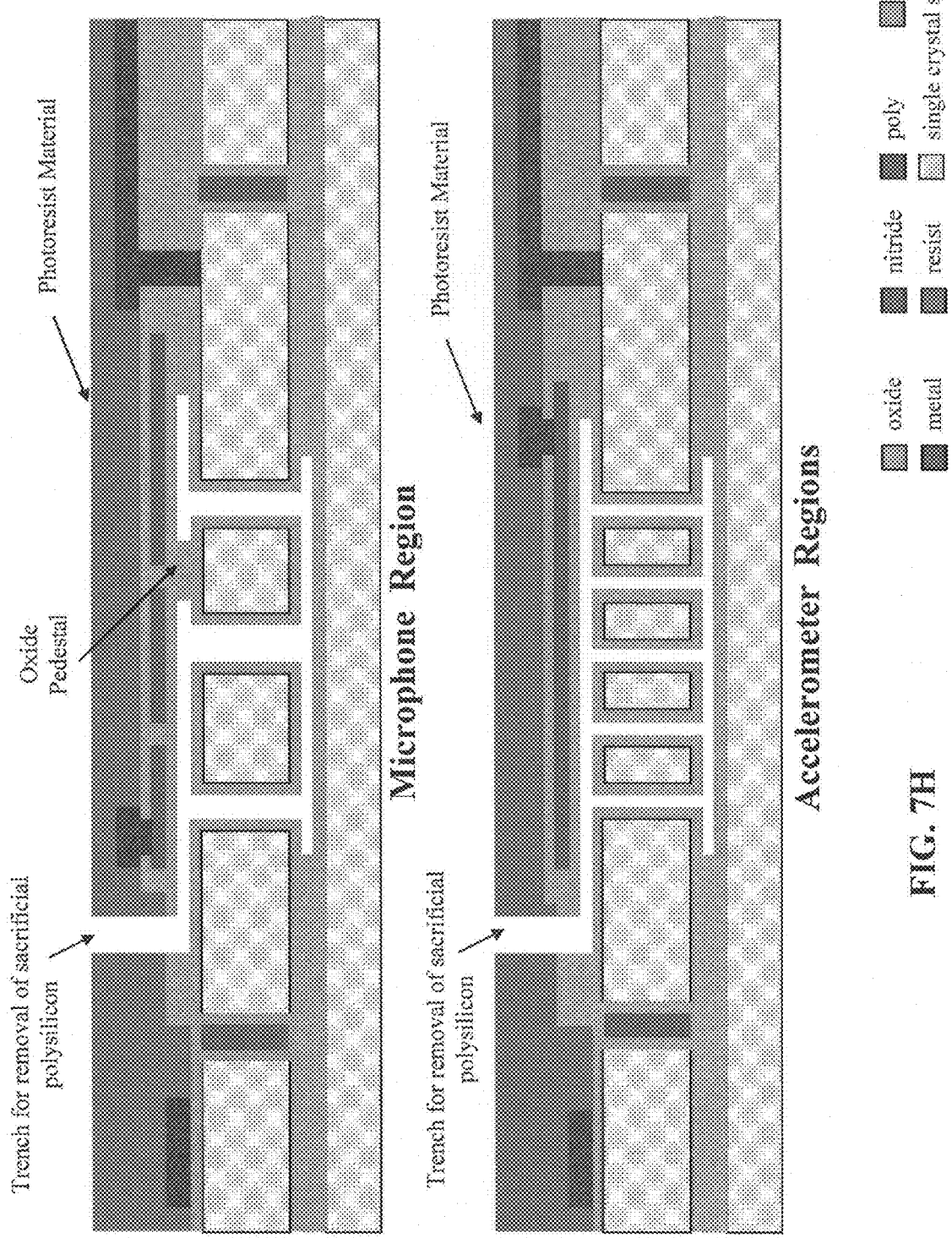

In FIG. 7H, a photoresist material is deposited and patterned. Trenches are then etched to expose the sacrificial polysilicon. The sacrificial polysilicon is removed, and the photoresist material is removed.

Figure 7I:
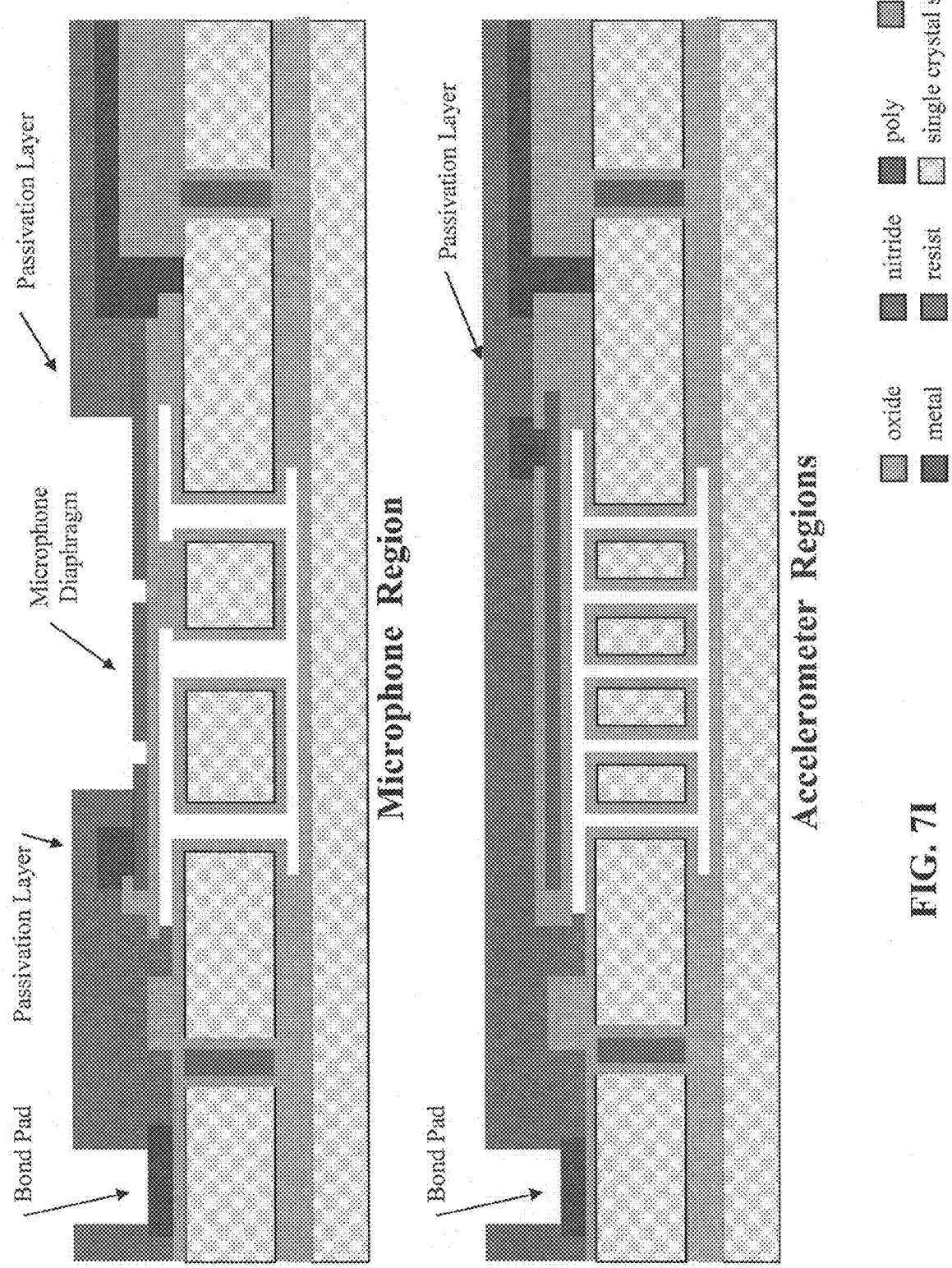

In FIG. 7I, passivation layers are deposited. The passivation layers typically include an oxide layer covered by a nitride layer, which is a standard passivation layer used for integrated circuitry. The passivation layers are etched to expose the bond pads and the microphone diaphragm.

Figure 7J:
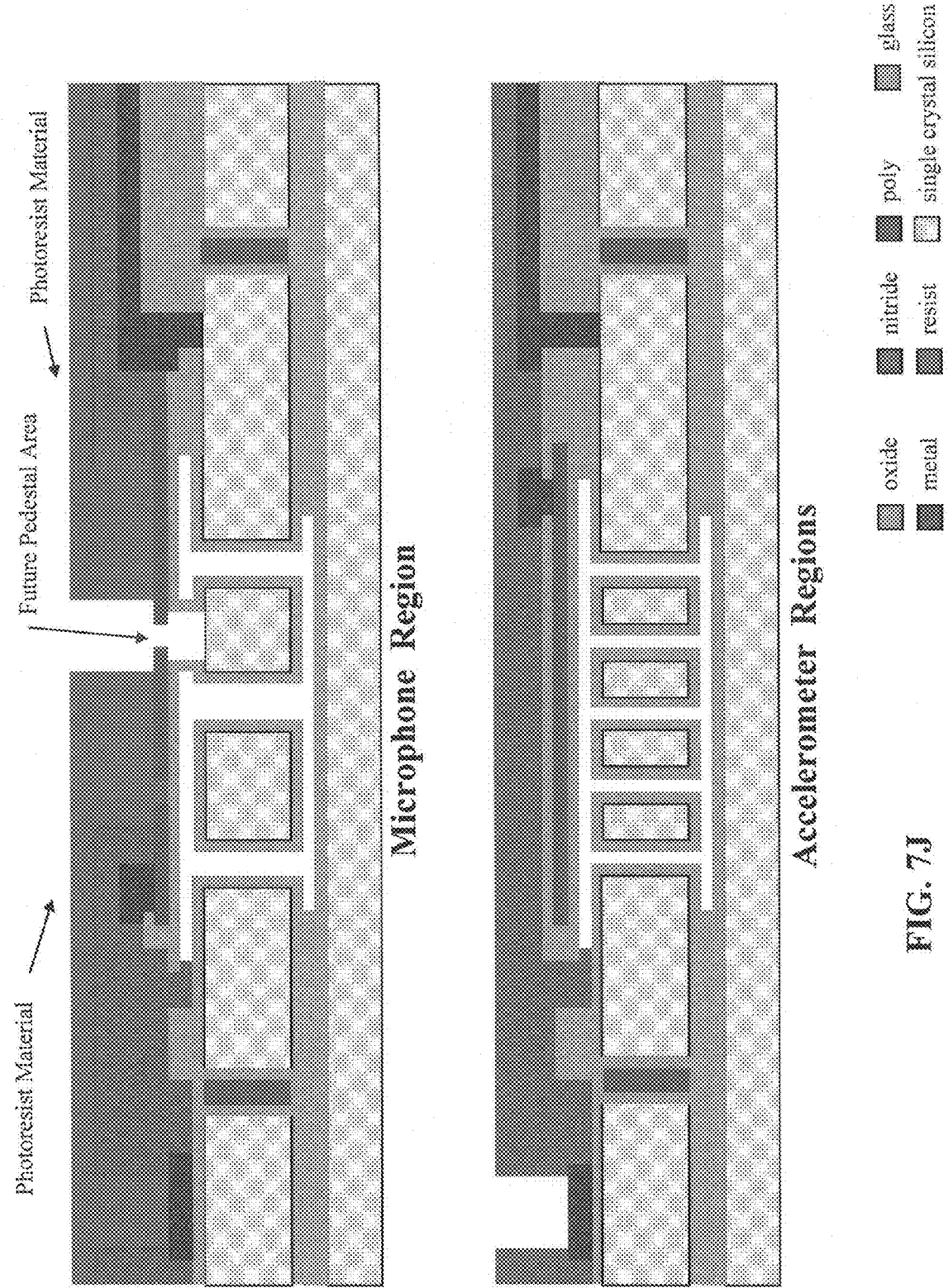

In FIG. 7J, a photoresist material is deposited about the microphone region and then patterned to expose the future pedestal area. The oxide at the future pedestal area is then removed by etching.

Figure 7K:
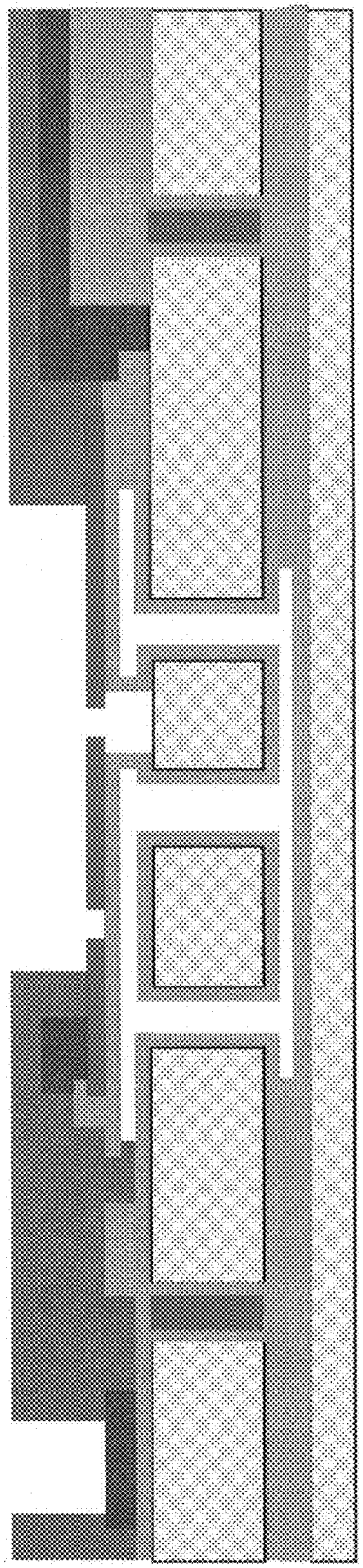
Figure 7K:
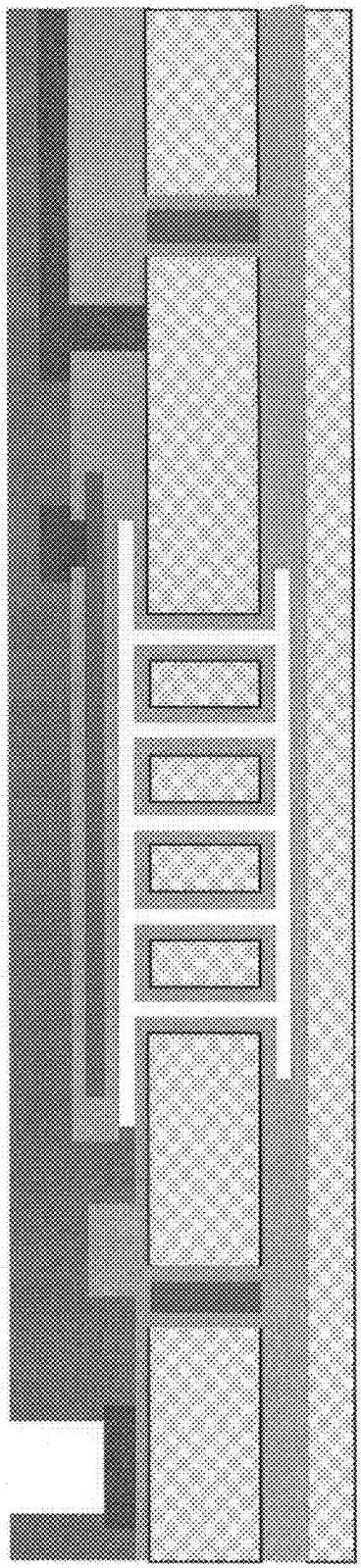

In FIG. 7K, the remaining photoresist material is removed, and the bottom silicon layer is optionally thinned from approximately 650 microns to approximately 350 microns by any of several methods including etching, grinding and polishing.

Figure 7L:
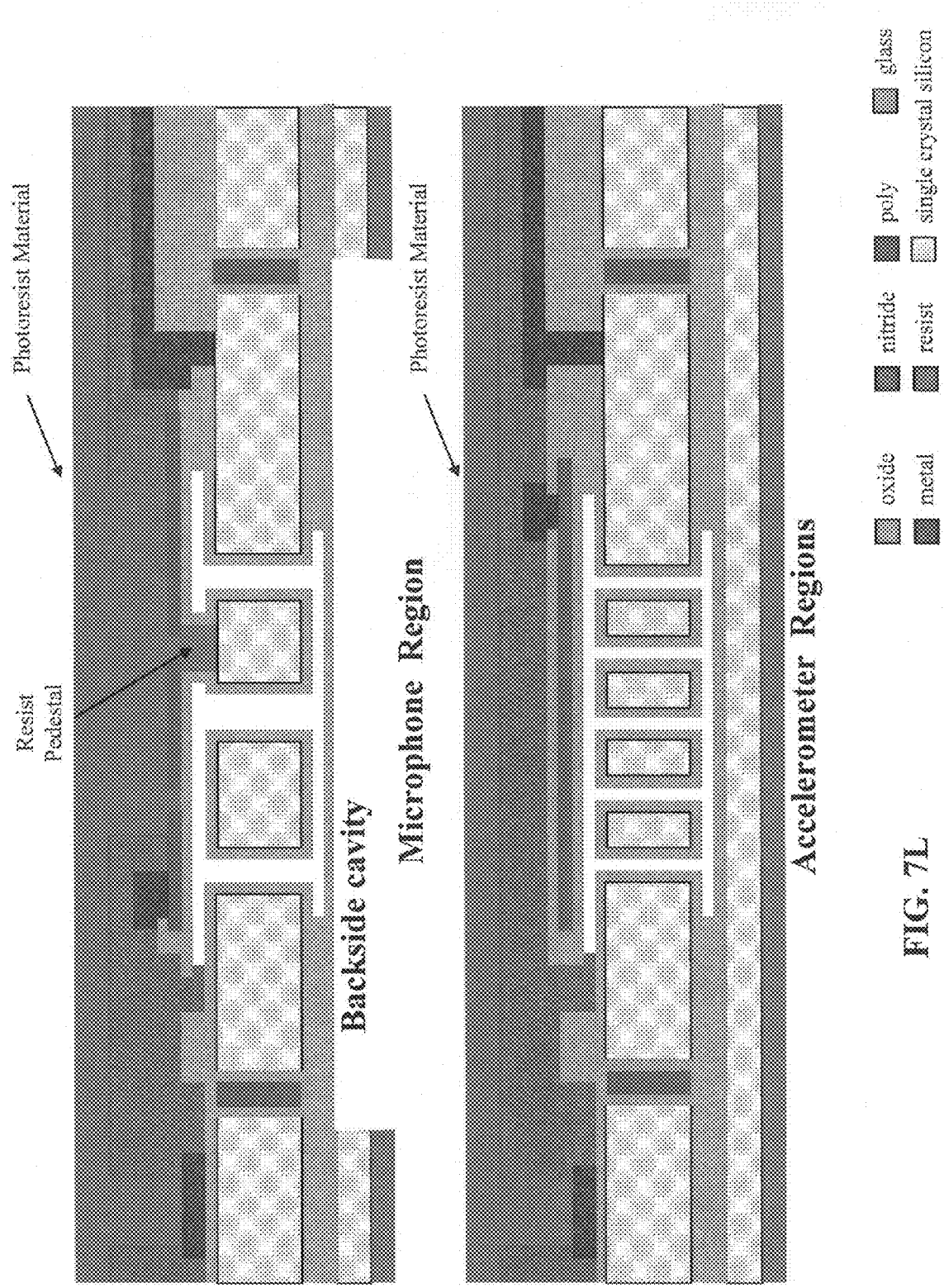

In FIG. 7L, photoresist material is deposited on the front side of the wafer so as to form a photoresist pedestal. Photoresist material is also deposited on back side of the wafer and patterned to outline a backside cavity for the microphone. The backside cavity is partially formed by etching away a portion of the bottom silicon layer to the intermediate oxide layer.

Figure 7M:
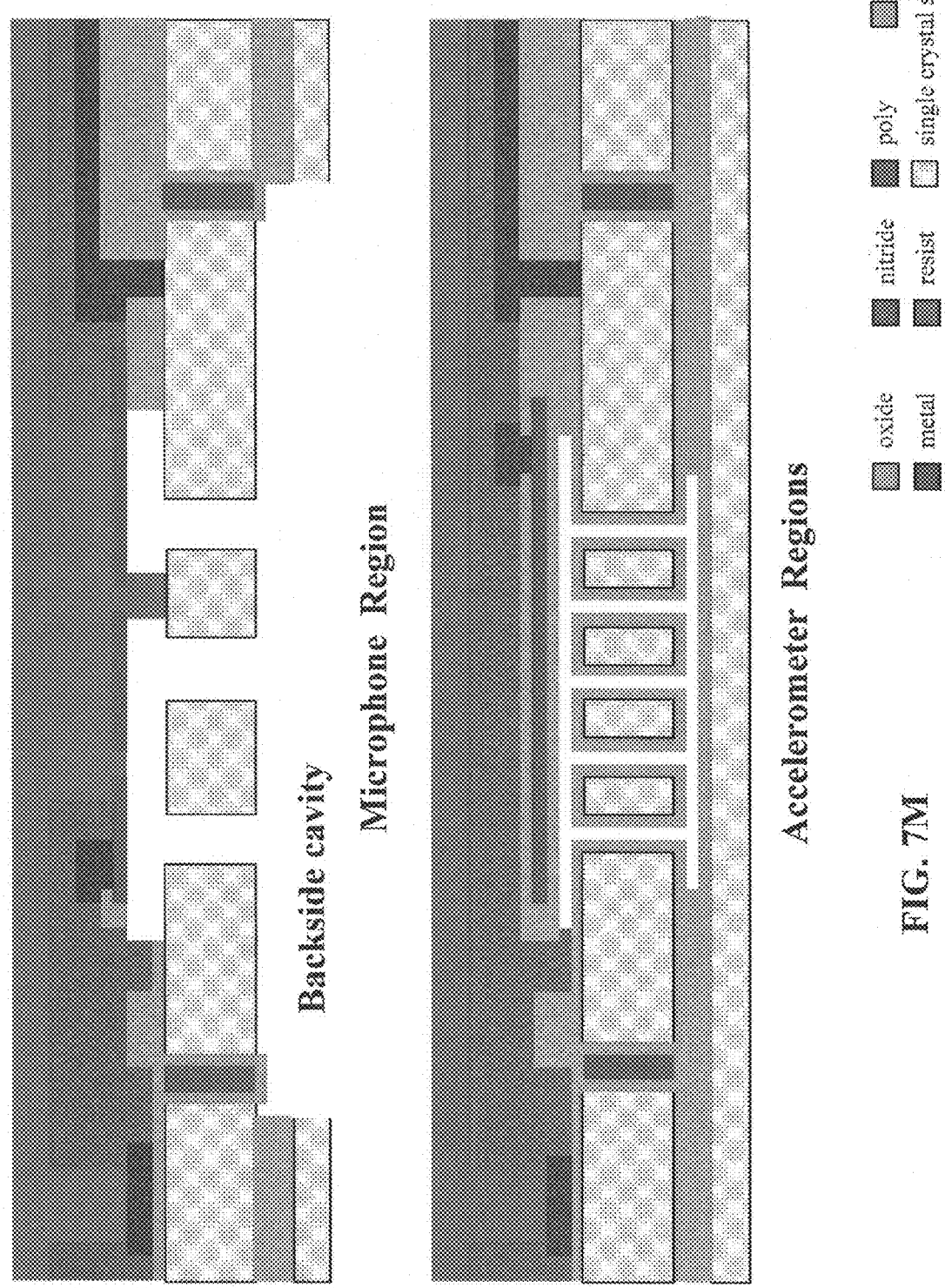

In FIG. 7M, a portion of the intermediate oxide layer within the cavity is removed in order to expose the oxide lining the trenches and underlying the microphone structures. The oxide behind the diaphragm is then removed, preferably by placing in an appropriate etchant such as aqueous HF bath.

Figure 7N:
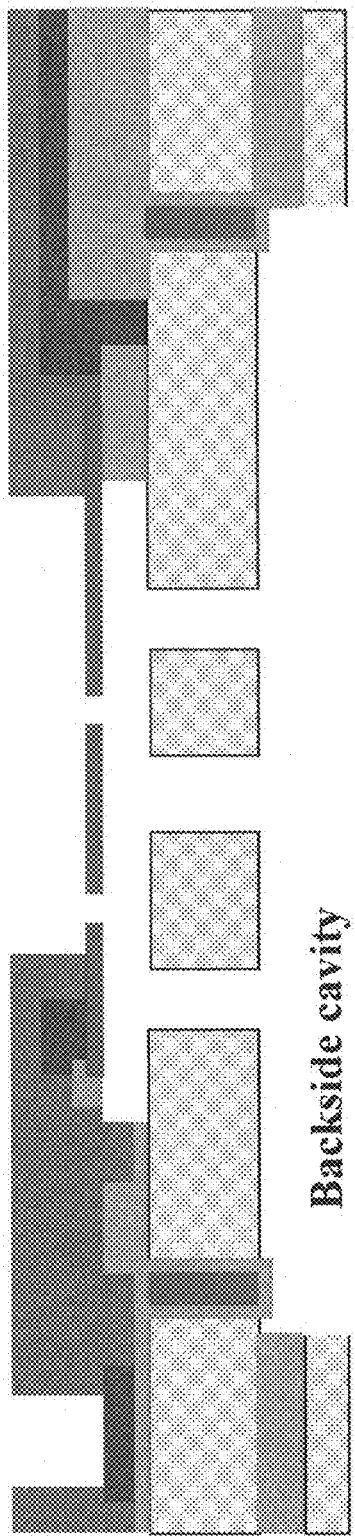
Figure 7N:
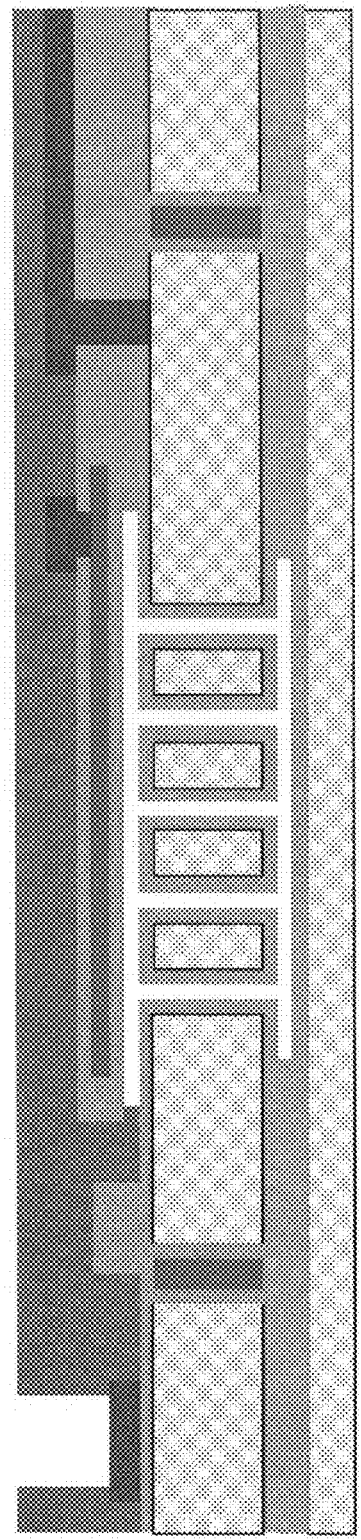

In FIG. 7N, the front side photoresist material (including the pedestal) is removed, preferably in a dry etch (not a liquid). This essentially releases the diaphragm and related structures. It should be noted that the pedestal is used to support the delicate microphone structures during release and may not be required in all embodiments, particularly if vapor HF is used to to remove the oxide instead of a liquid.

An exemplary process for forming a combined microphone and three-axis accelerometer from an SOI wafer is described with reference to FIGS. 8A-8M. In order to show both the microphone region and the accelerometer region of the wafer at each step, the microphone region is shown above the accelerometer region, although it is understood that the regions are actually beside one another on the wafer. It should be noted that this process is a variation of the one described above with reference to FIGS. 7A-7N, and this process could be used to produce just the micromachined microphone, or, for that matter, just the accelerometer.

Figure 8A:
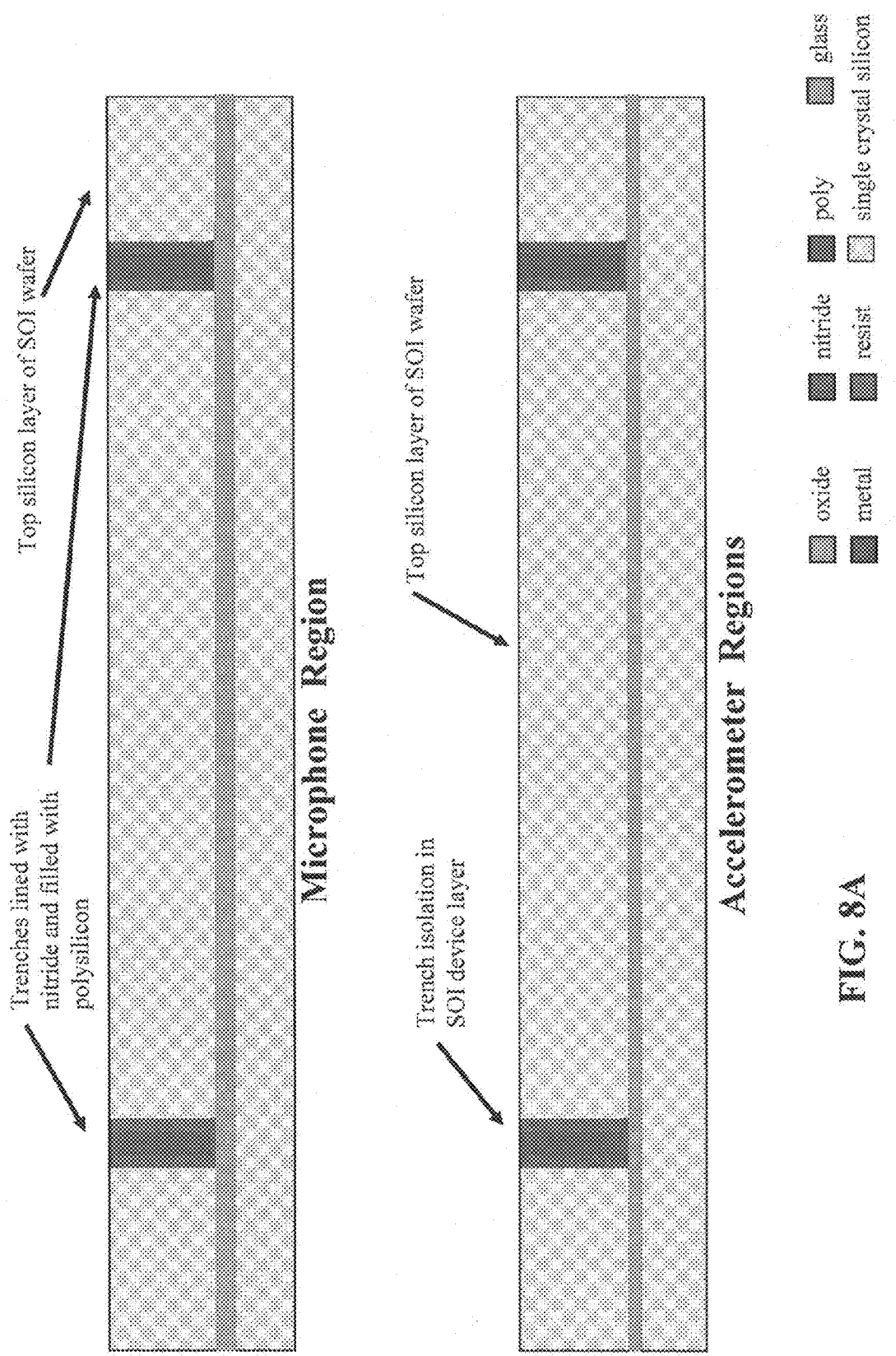

In FIG. 8A, trenches etched through the top silicon layer of an SOI wafer are lined with nitride and filled with polysilicon.

Figure 8B:
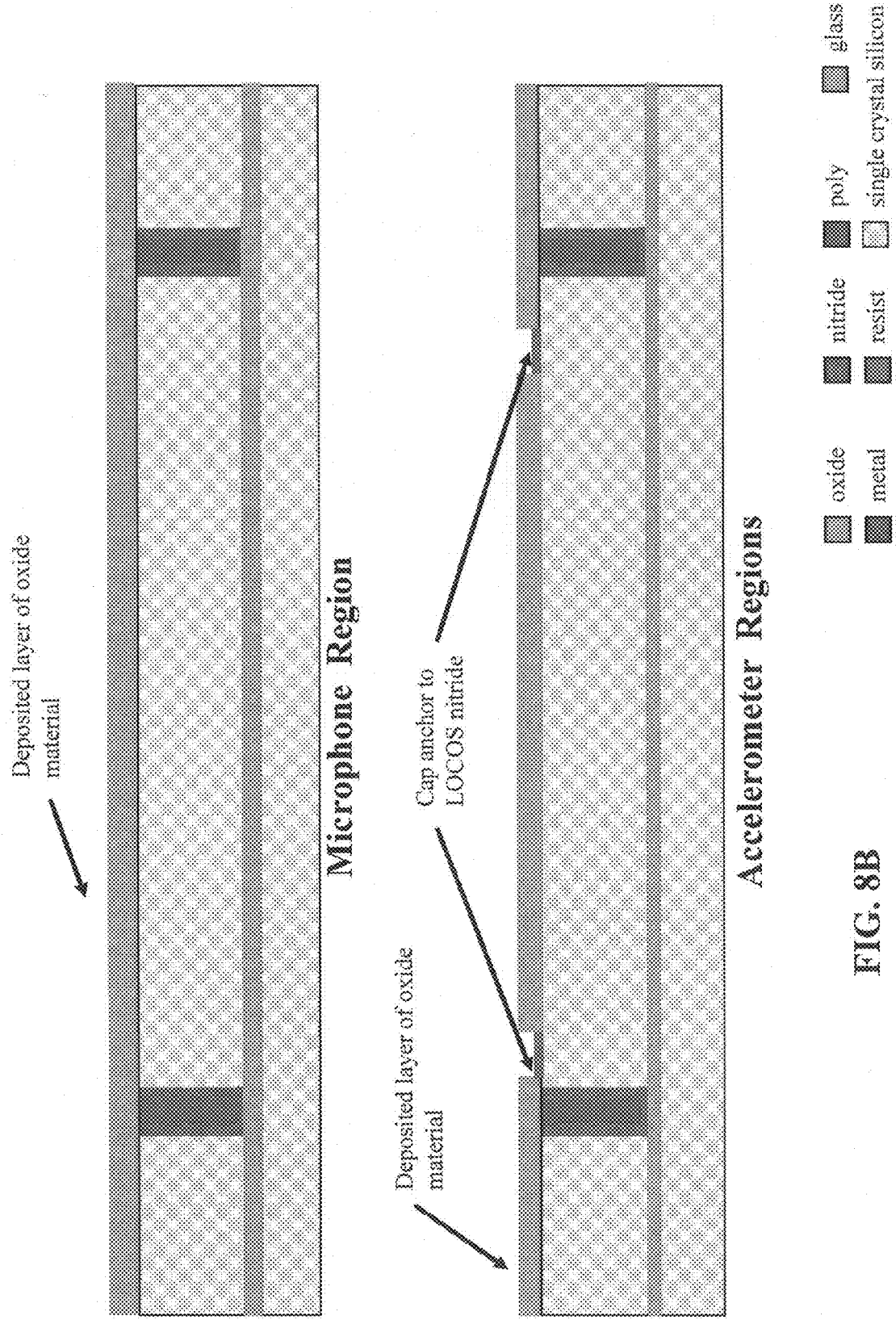

In FIG. 8B, cap anchors are formed in the accelerometer region by depositing a layer of oxide material, etching out the anchor locations, and depositing nitride.

Figure 8C:
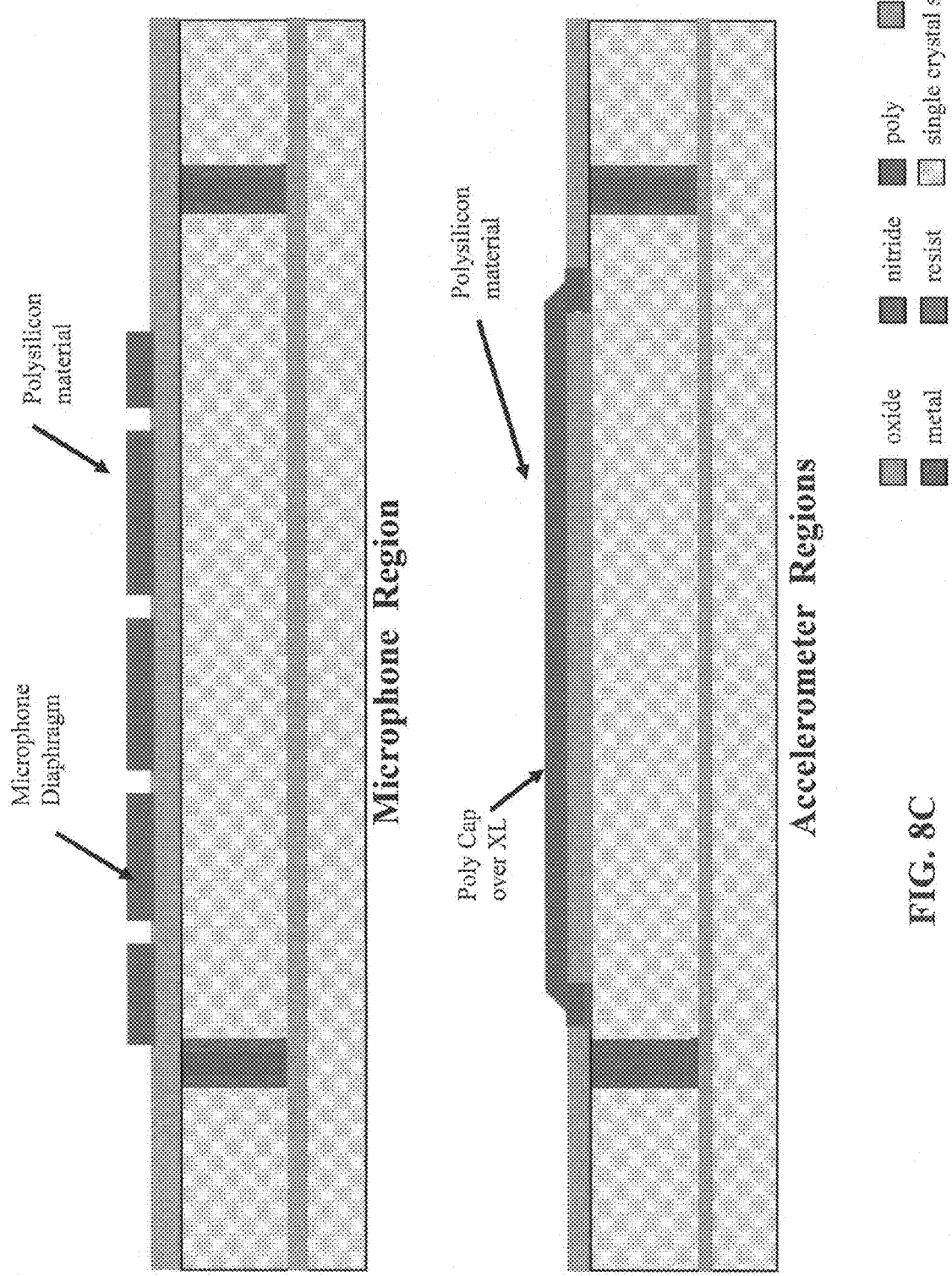

In FIG. 8C, a polysilicon material is patterned and etched to form various microphone structures, including the diaphragm, as well as a cap for the accelerometer.

Figure 8D:
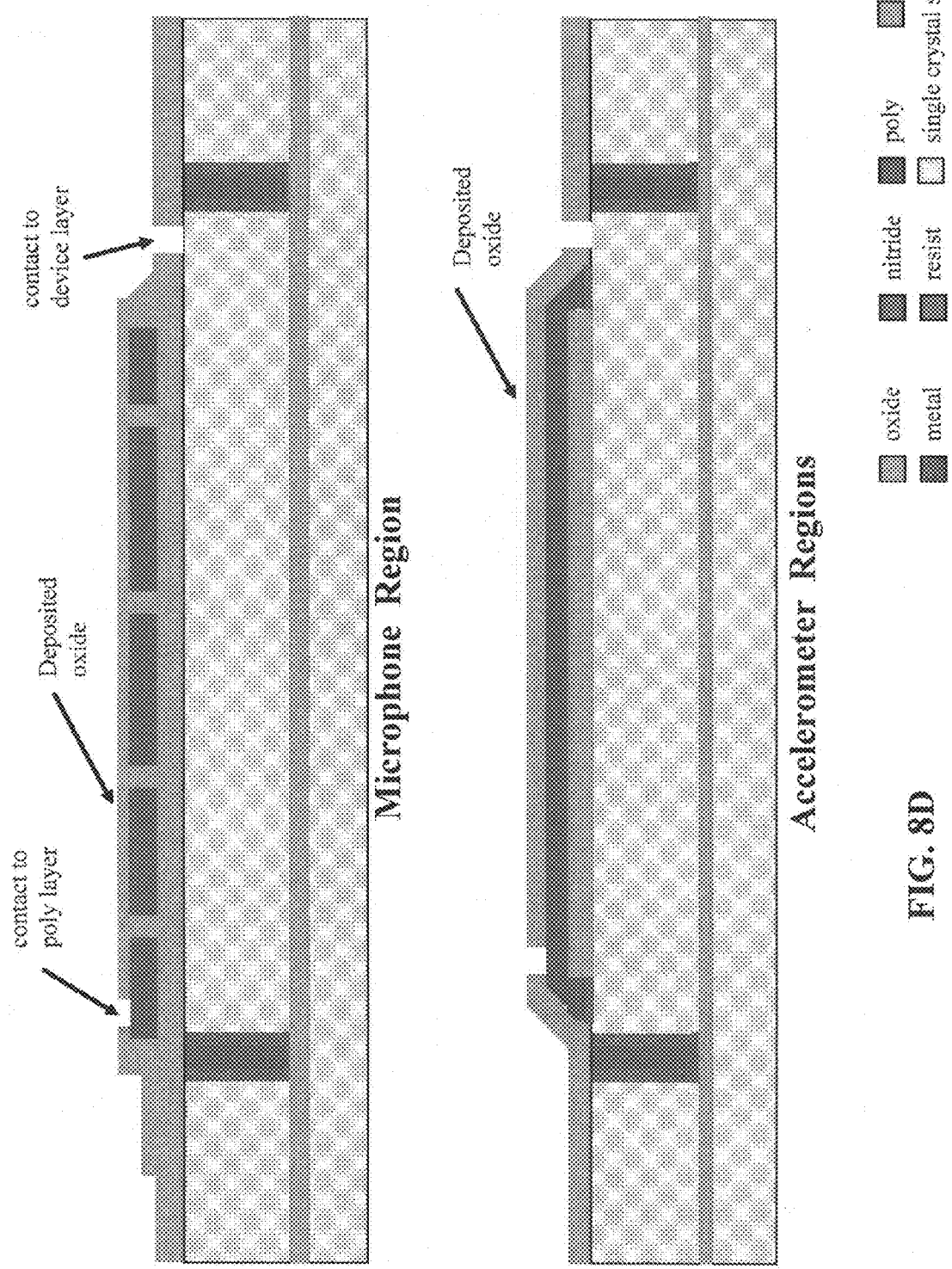

In FIG. 8D, oxide is deposited, and holes are etched. The holes are used for electrodes to the microphone diaphragm and backplate as well as to the accelerometer cap and top silicon layer, as described below.

Figure 8E:
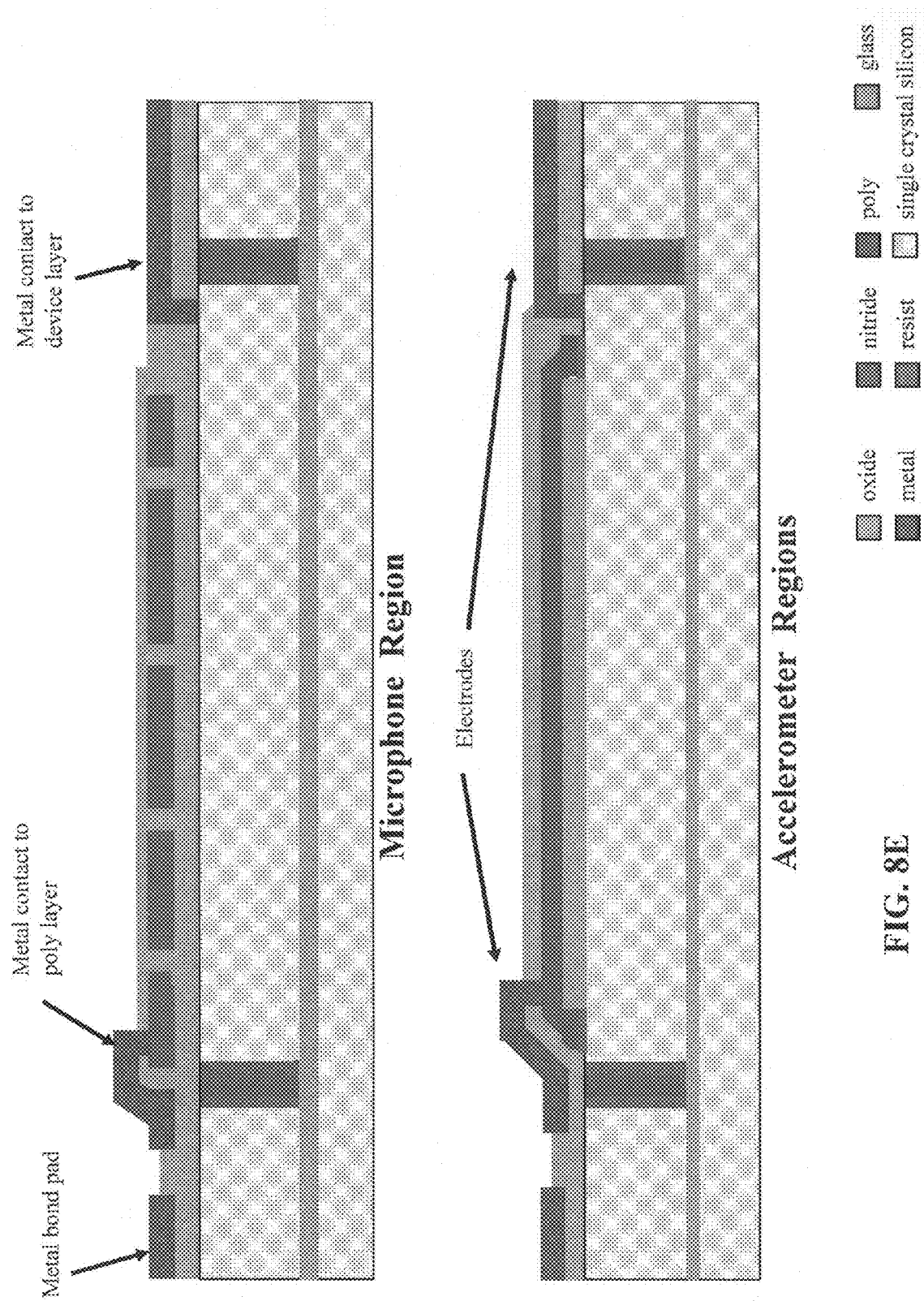

In FIG. 8E, metal is deposited and patterned in order to form bond pads and electrodes for placing charge on the microphone diaphragm and backplate as well as on the accelerometer cap and top silicon layer. There may be electrical connections (not shown) between the bond pads and one or more of the electrodes.

Figure 8F:
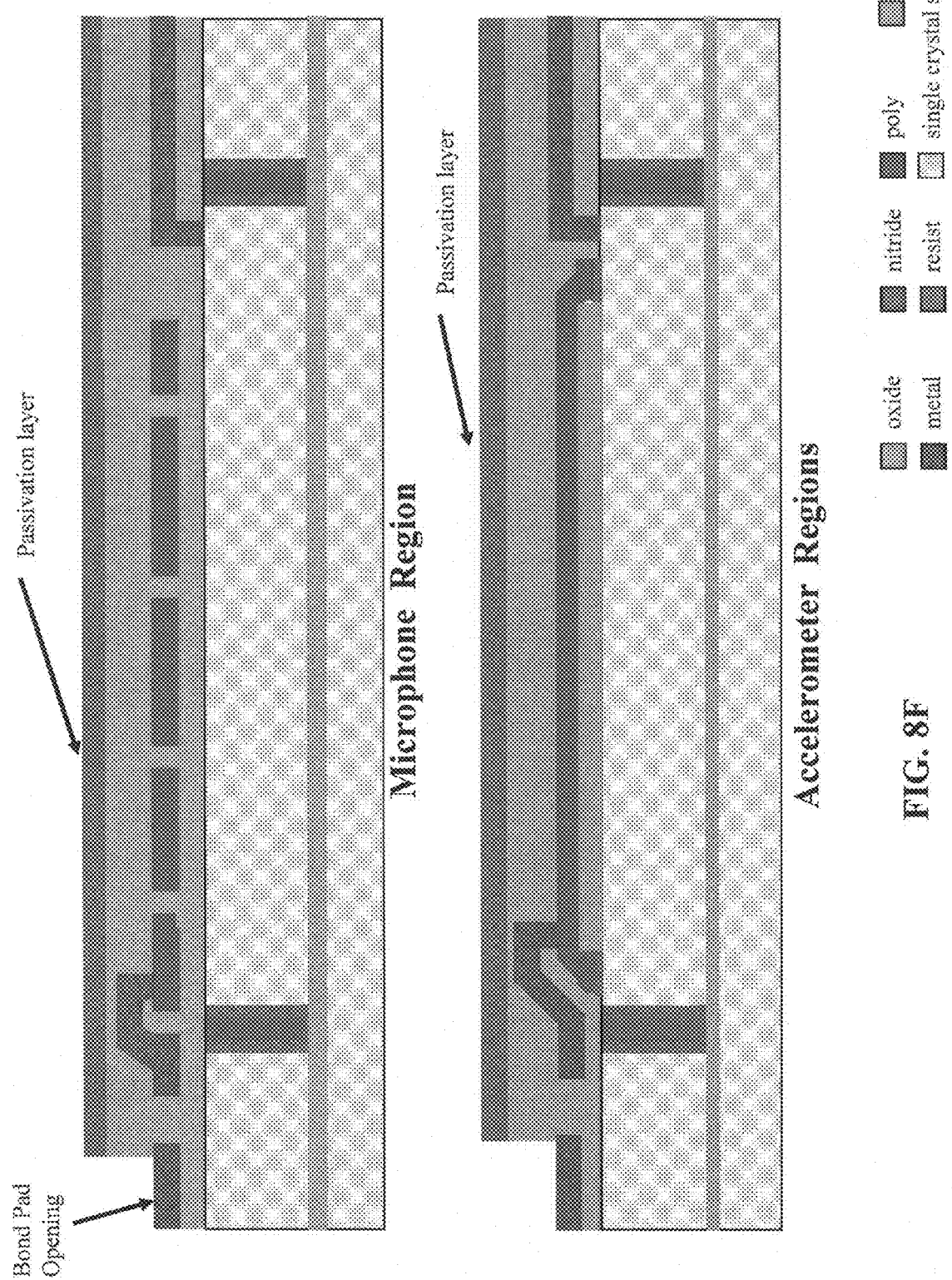

In FIG. 8F, passivation layers are deposited. The passivation layers typically include an oxide layer covered by a nitride layer, which is a standard passivation layer used for integrated circuitry. The passivation layers are etched to expose the bond pads.

Figure 8G:
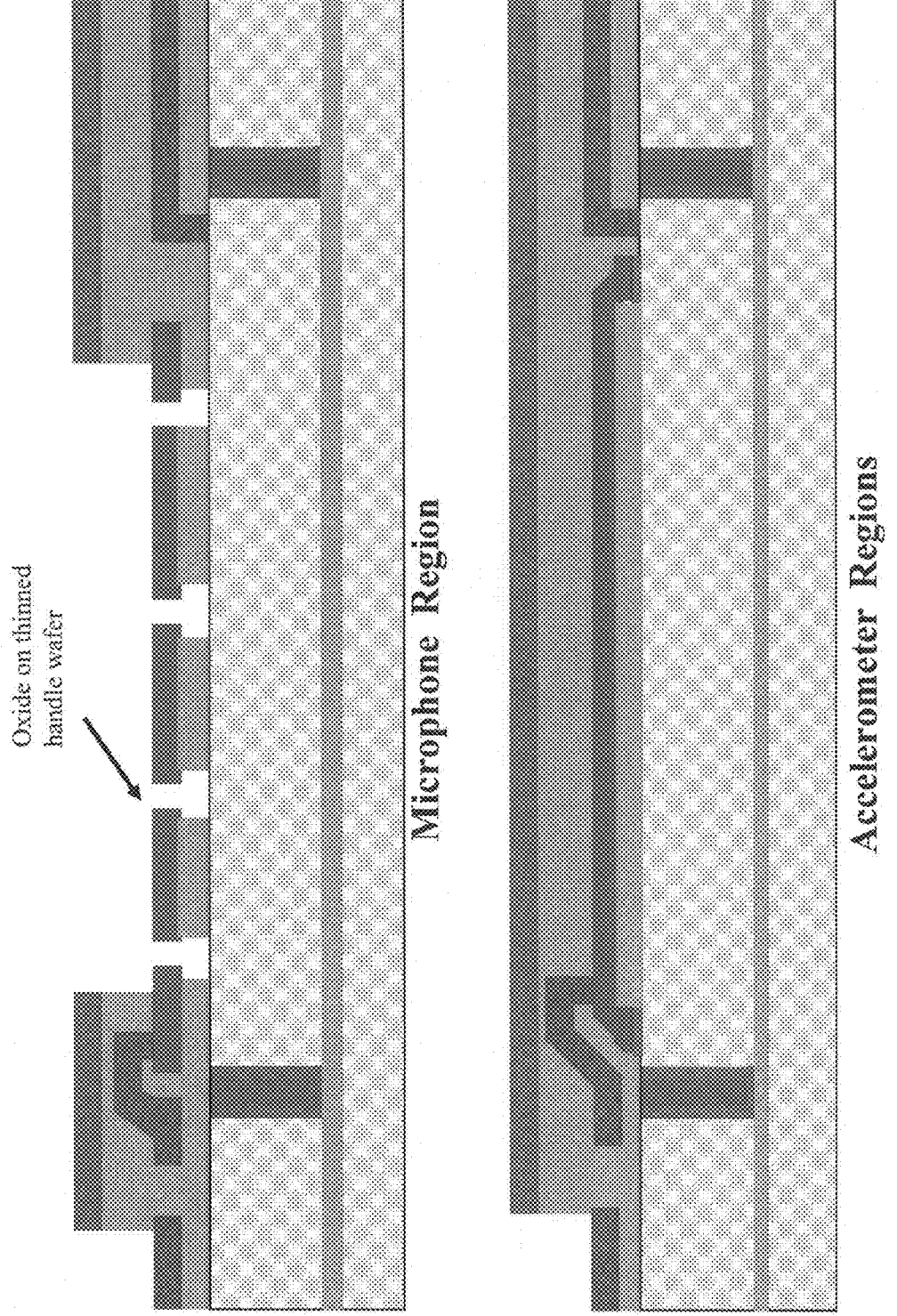

In FIG. 8G, a portion of the passivation layers above the microphone structures is removed and the oxide over and partially under the polysilicon structures is removed to form resist pedestal areas.

Figure 8H:
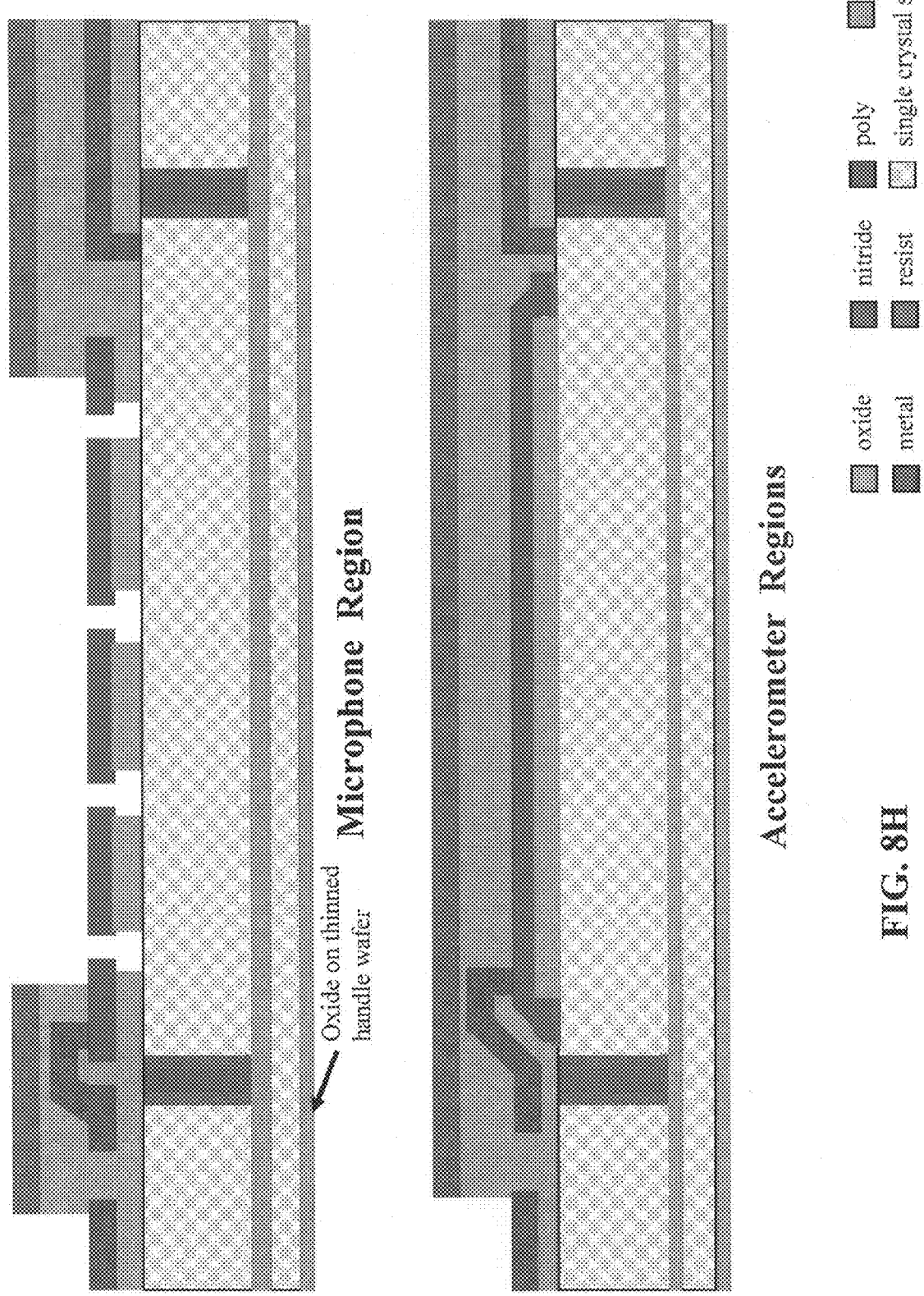

In FIG. 8H, the bottom silicon layer is optionally thinned from approximately 650 microns to approximately 350 microns by any of several methods including etching, grinding and polishing, and a layer of oxide is deposited.

Figure 8I:
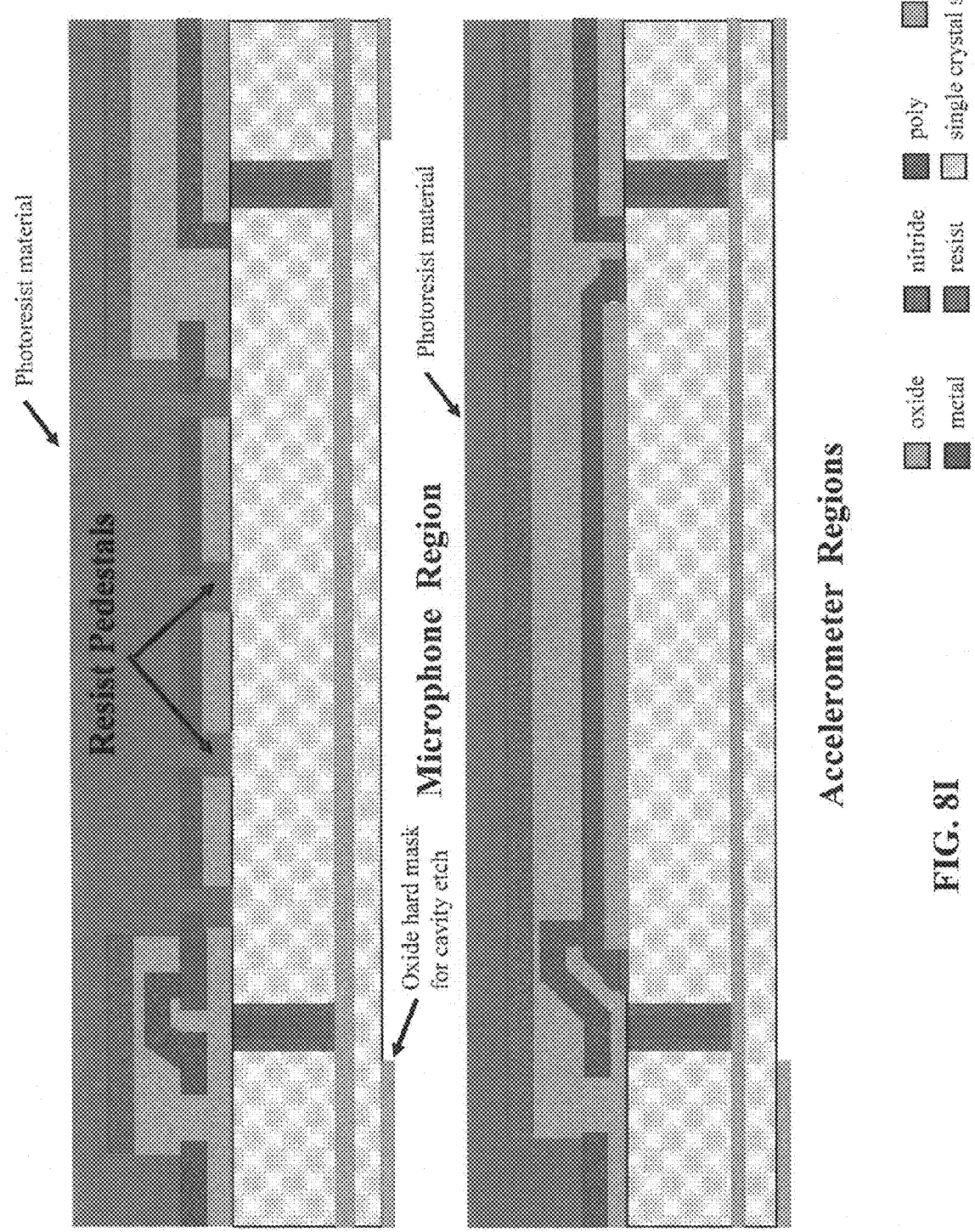

In FIG. 8I, a photoresist material is deposited on the front side of the wafer, and the oxide on the back side of the wafer is patterned.

Figure 8J:
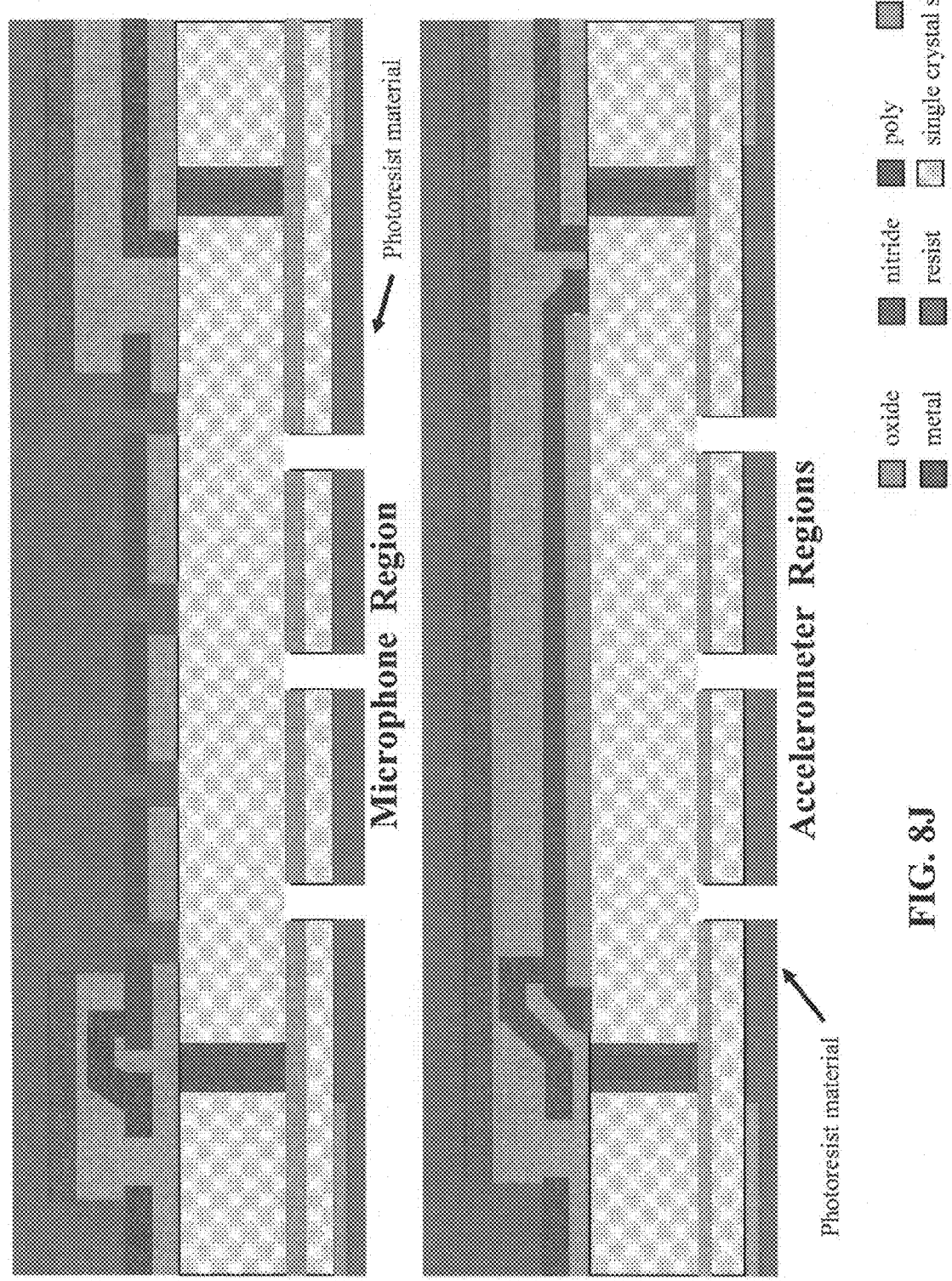

In FIG. 8J, a photoresist material is deposited and patterned on the back side of the wafer, and trenches are etched through the bottom silicon layer and the intermediate oxide layer of the wafer.

Figure 8K:
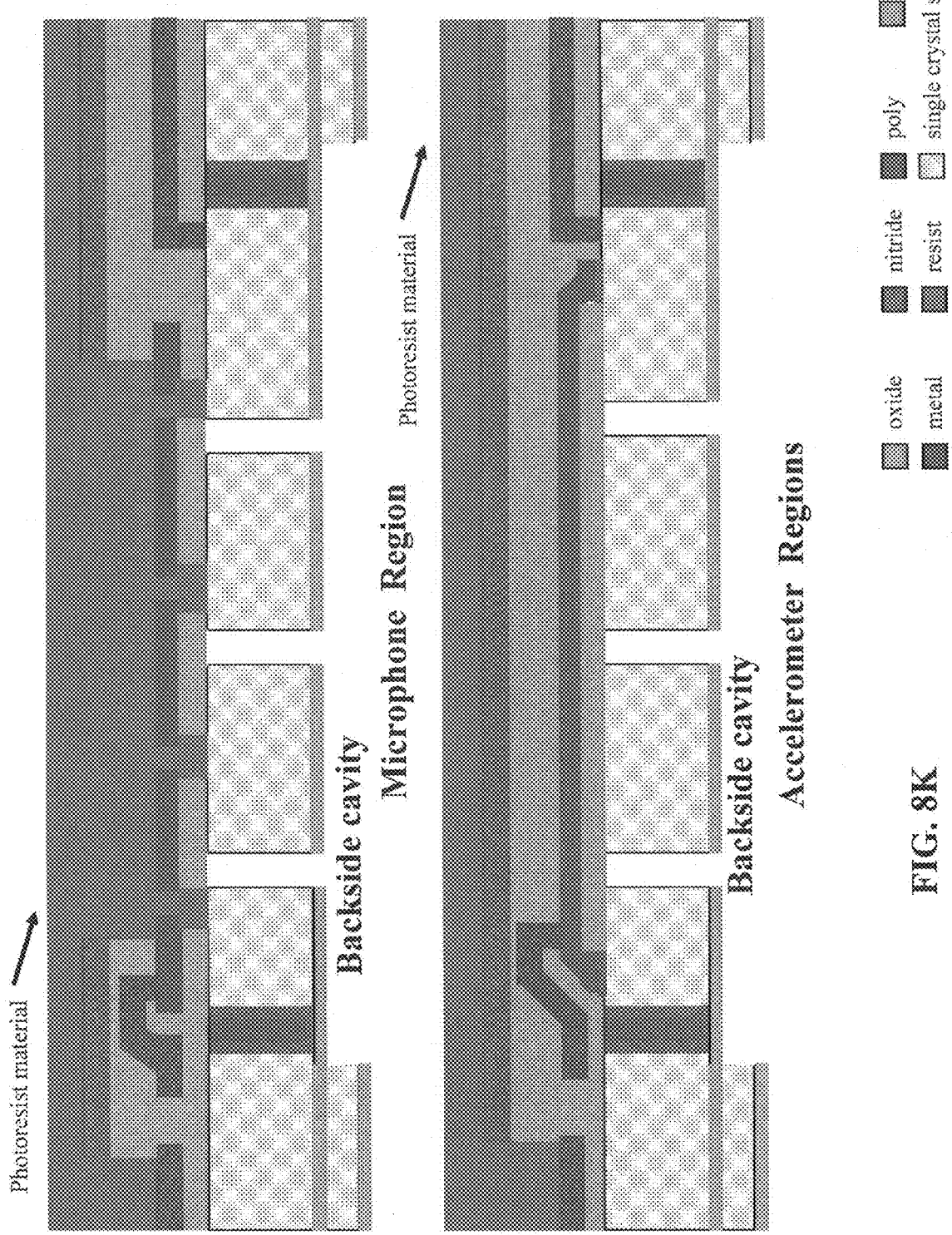

In FIG. 8K, the trenches are etched through the top silicon layer of the wafer to the resist pedestal areas of the microphone region and the oxide underlying the cap of the accelerometer region. The photoresist material is then removed from both the front side and the back side, and a new layer of photoresist material is deposited on the front side for protection. Cavities are then etched in the back side of the wafer using the existing oxide as a hard mask.

In FIG. 8L, the oxide exposed through the cavities is removed, preferably by exposing to HF gas.

Figure 8M:
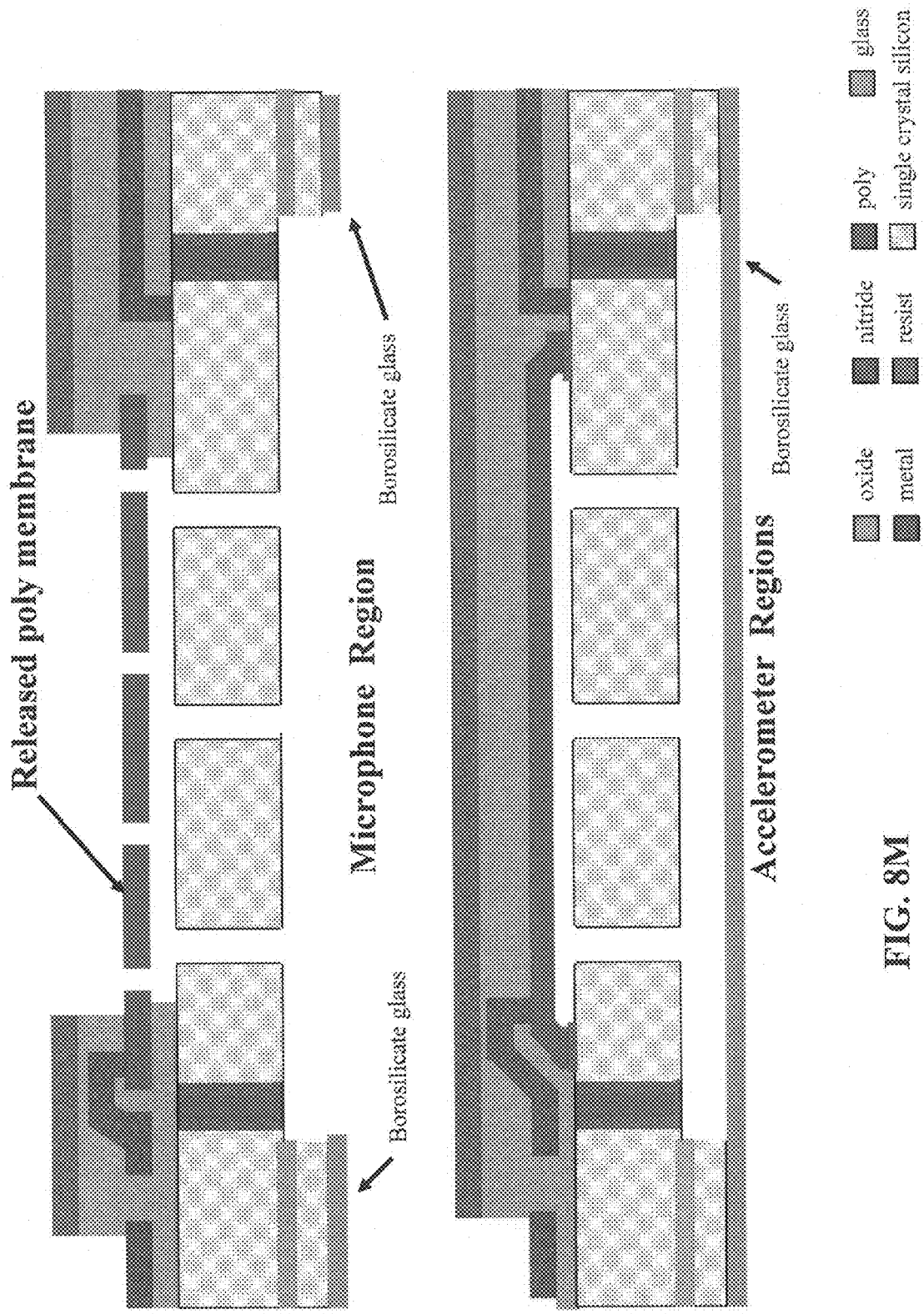

In FIG. 8M, borosilicate glass is aligned and anodic bonded to the back side of the wafer. Microphone holes are preferably ultrasonically cut in the glass prior to bonding. The remaining photoresist material is removed from the front side of the wafer, thereby releasing the microphone structures.

An exemplary process for forming a combined microphone and three-axis accelerometer from a regular silicon wafer is described with reference to FIGS. 9A-9O. In order to show both the microphone region and the accelerometer region of the wafer at each step, the microphone region is shown above the accelerometer region, although it is understood that the regions are actually beside one another on the wafer. It should be noted that this process is a variation of the one described above with reference to FIGS. 8A-8M, and this process could be used to produce just the micromachined microphone, or, for that matter, just the accelerometer.

Figure 9A:
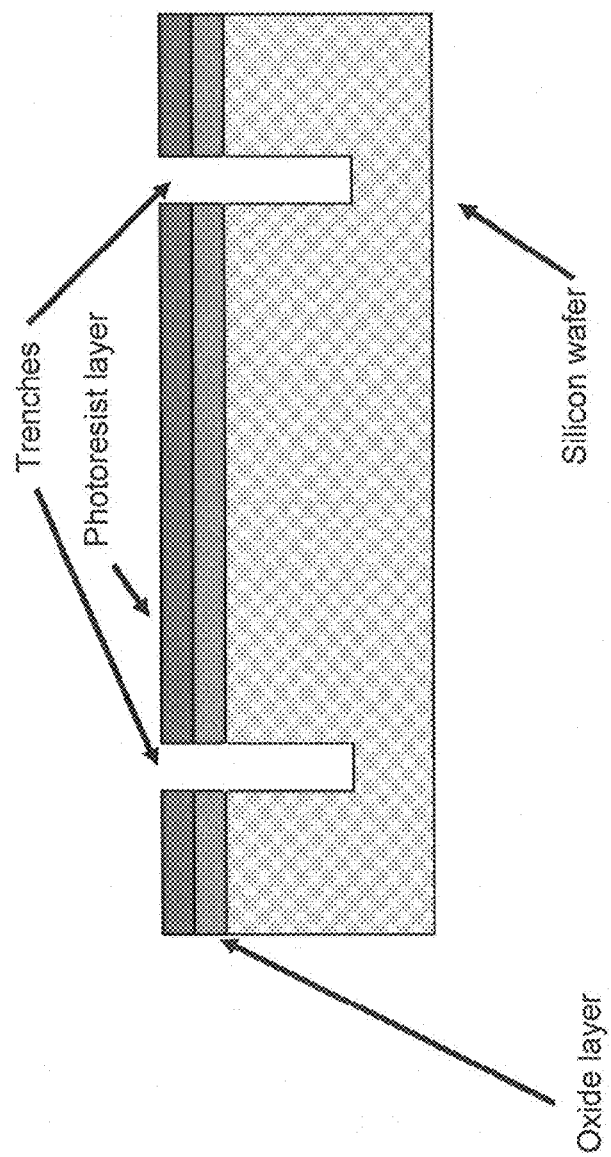
FIGS. 9A-9O demonstrate an exemplary process for forming a combined microphone and three-axis accelerometer from a regular silicon wafer in accordance with an embodiment of the present invention.

In FIG. 9A, an oxide layer is deposited on the silicon wafer. A photoresist material is then deposited and patterned. Trenches are then etched into the silicon for accelerometer electrodes. The remaining photoresist and oxide hard mask are then removed. It should be noted that this step is not required for a microphone-only product.

Figure 9B:
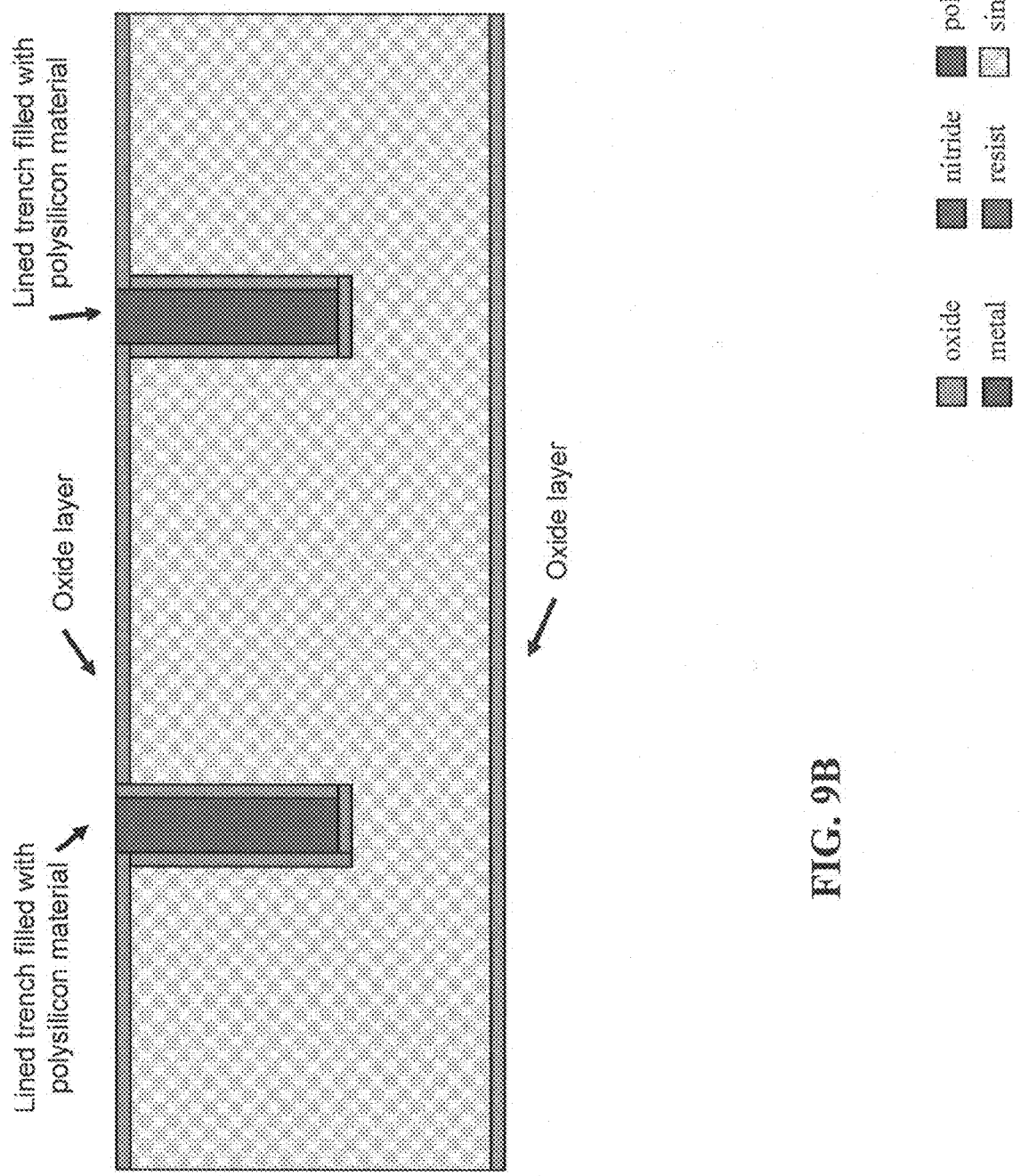

In FIG. 9B, an oxide layer is grown on both the front side and the back side of the wafer to approximately 1.6 microns. The lined trenches are then filled with a polysilicon material. It should be noted that this step is not required for a microphone-only product.

Figure 9C:
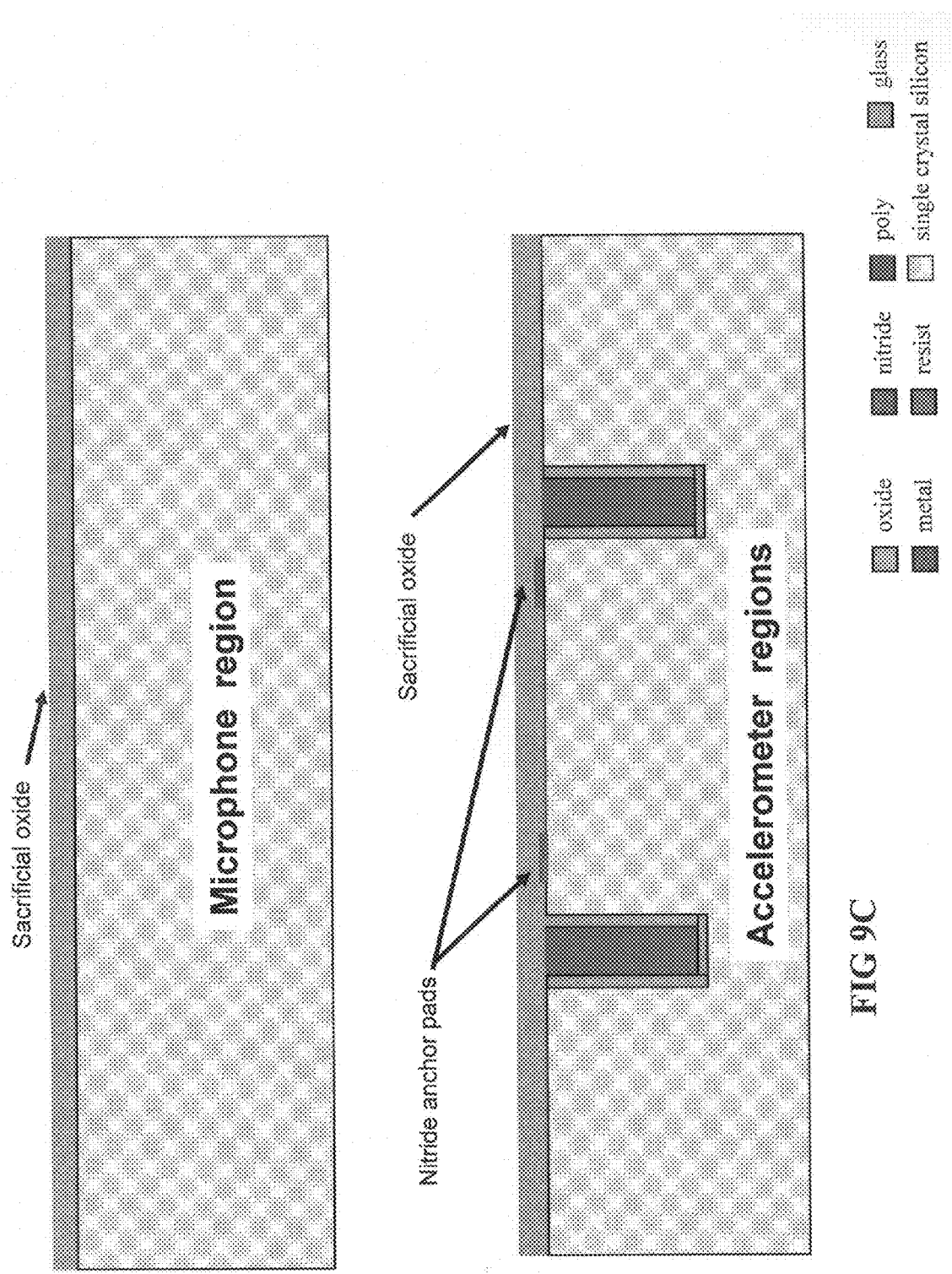

In FIG. 9C, the remaining oxide is stripped, for example, by exposing to HF gas. Nitride anchor pads are then deposited and patterned on the accelerometer region. A layer of Novellus oxide is then deposited as a sacrificial layer. It should be noted that this step is not required for a microphone-only product.

Figure 9D:
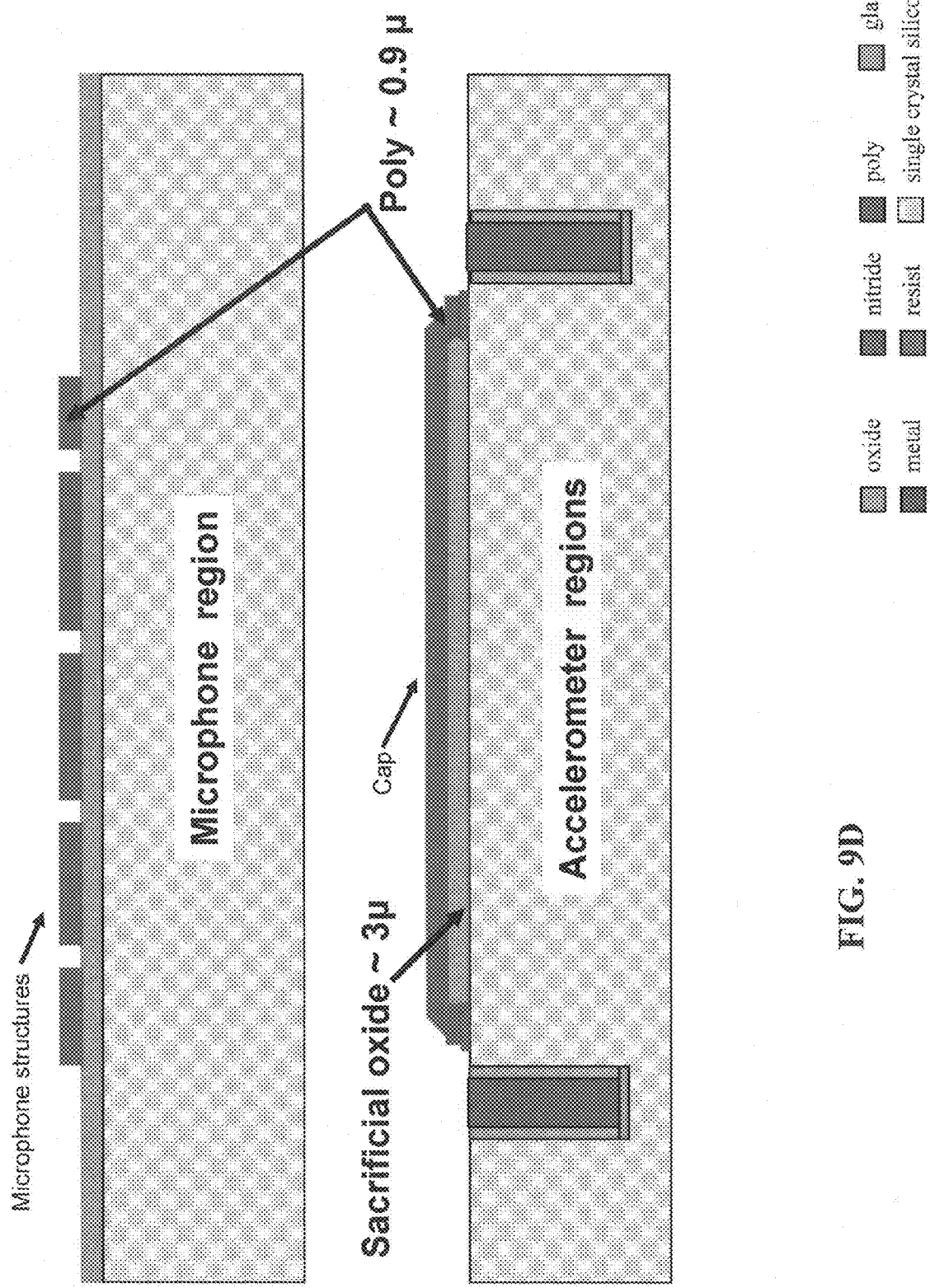

In FIG. 9D, the oxide layer is etched to expose the nitride pads. Then, a polysilicon material is patterned and etched to form various microphone structures, including the diaphragm, as well as a cap for the accelerometer.

Figure 9E:
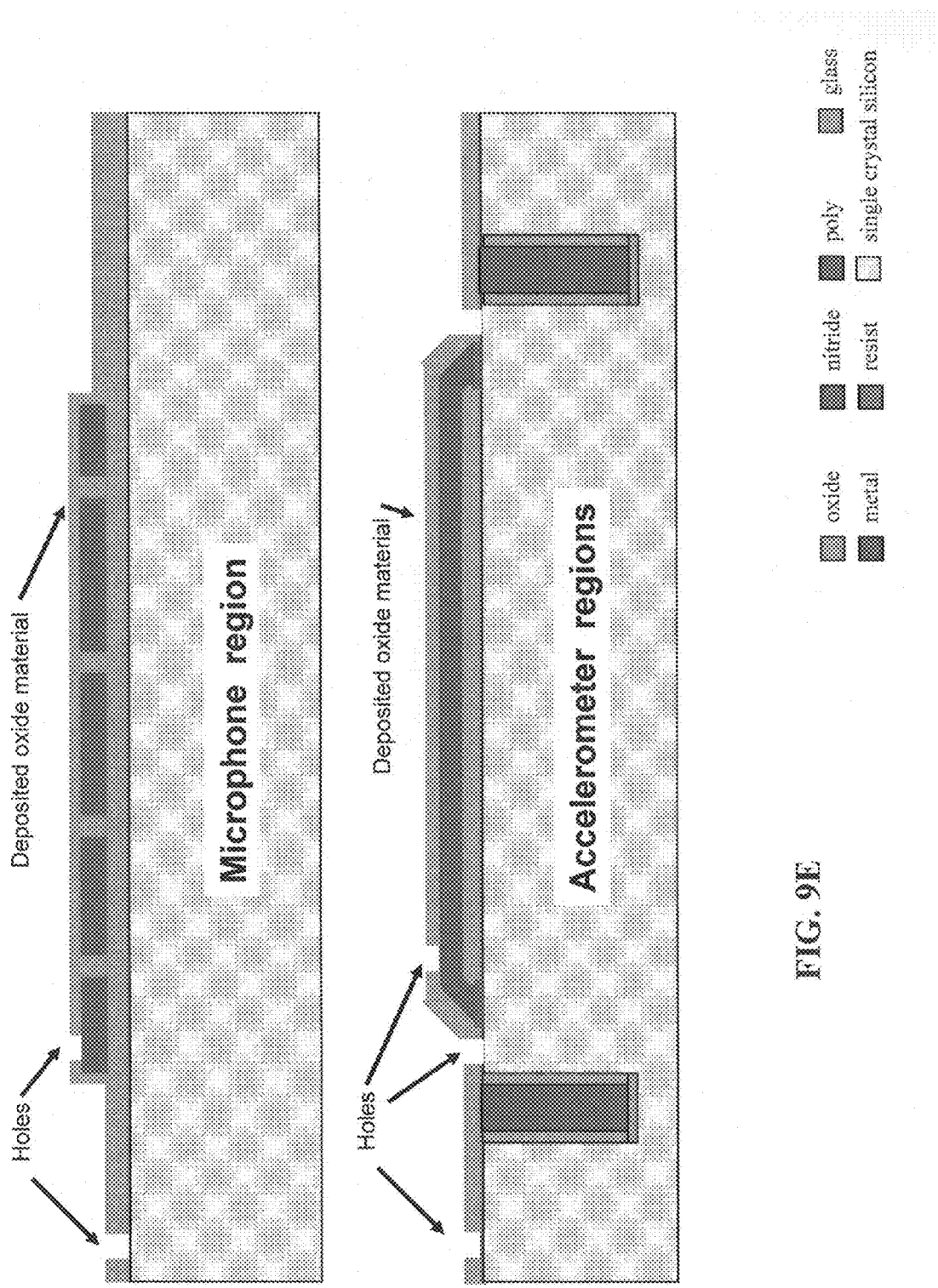

In FIG. 9E, an oxide material is deposited, and holes are etched. The holes are used for electrodes to the microphone diaphragm and backplate as well as to the accelerometer cap and silicon layer, as described below.

Figure 9F:
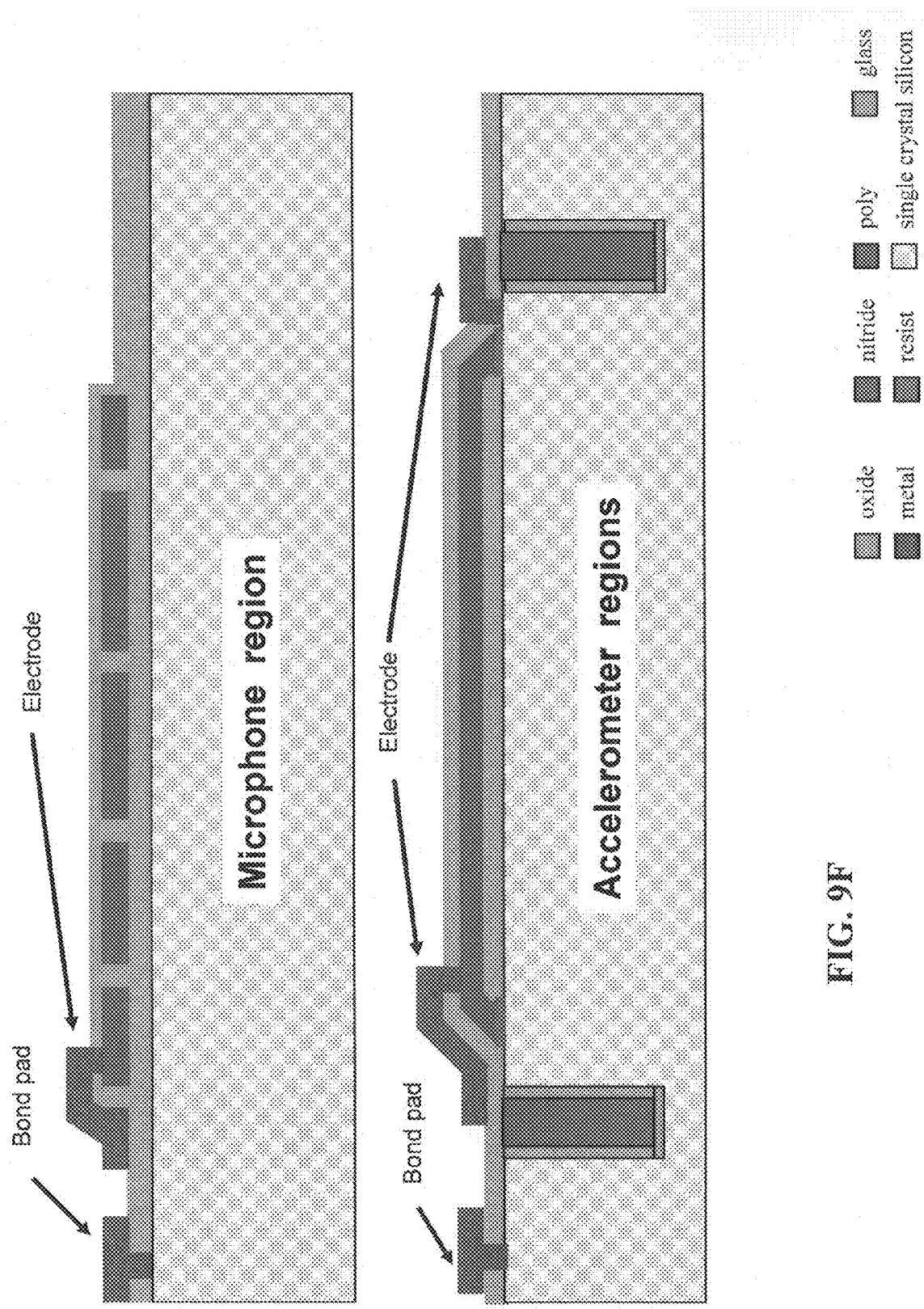

In FIG. 9F, metal is deposited and patterned in order to form bond pads and electrodes for placing charge on the microphone diaphragm and backplate as well as on the accelerometer cap and silicon layer. There may be electrical connections (not shown) between the bond pads and one or more of the electrodes.

Figure 9G:
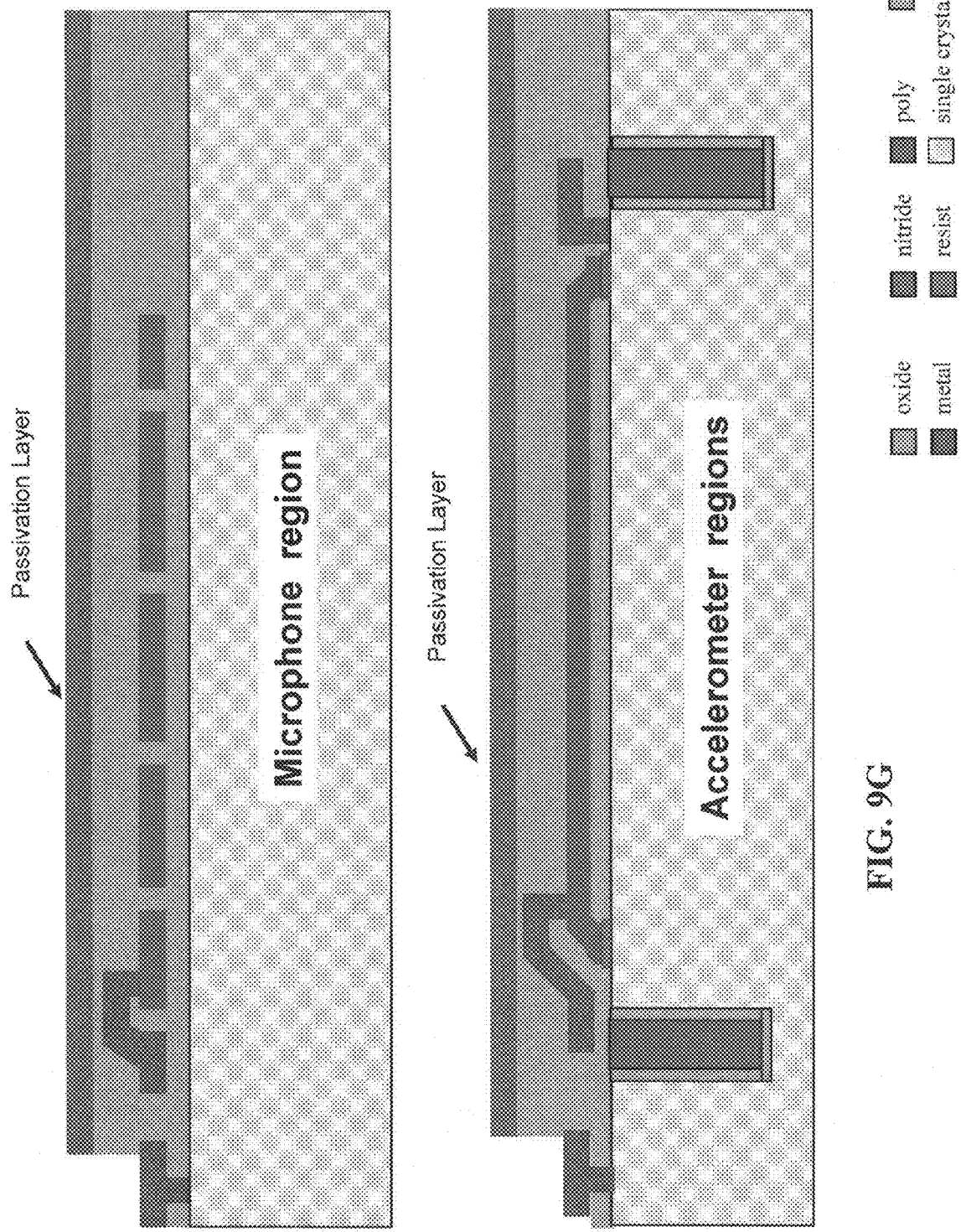

In FIG. 9G, passivation layers are deposited. The passivation layers typically include an oxide layer covered by a nitride layer, which is a standard passivation layer used for integrated circuitry. The passivation layers are etched to expose the bond pads.

Figure 9H:
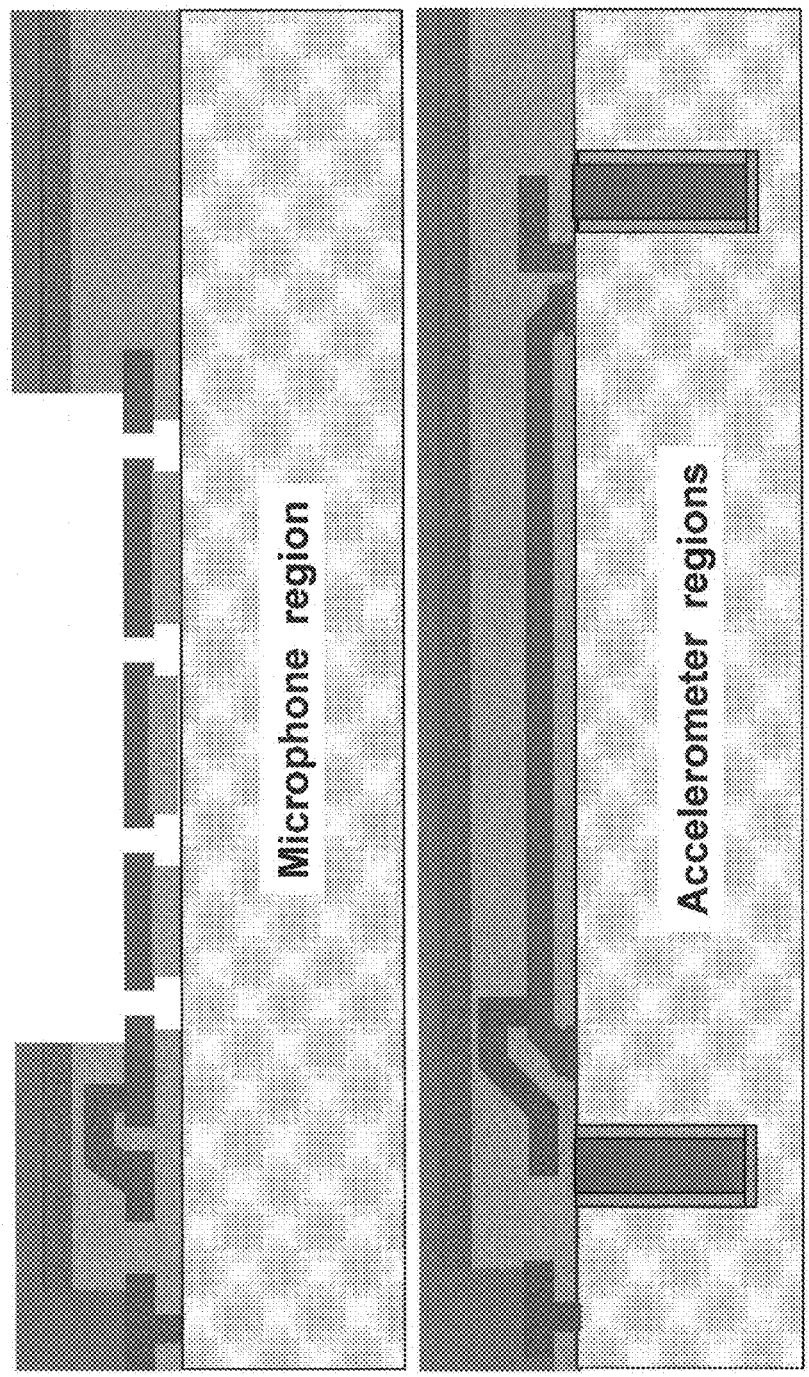

In FIG. 9H, a portion of the passivation layers above the microphone structures is removed and the oxide over and partially under the polysilicon structures is removed to form resist pedestal areas.

Figure 9I:
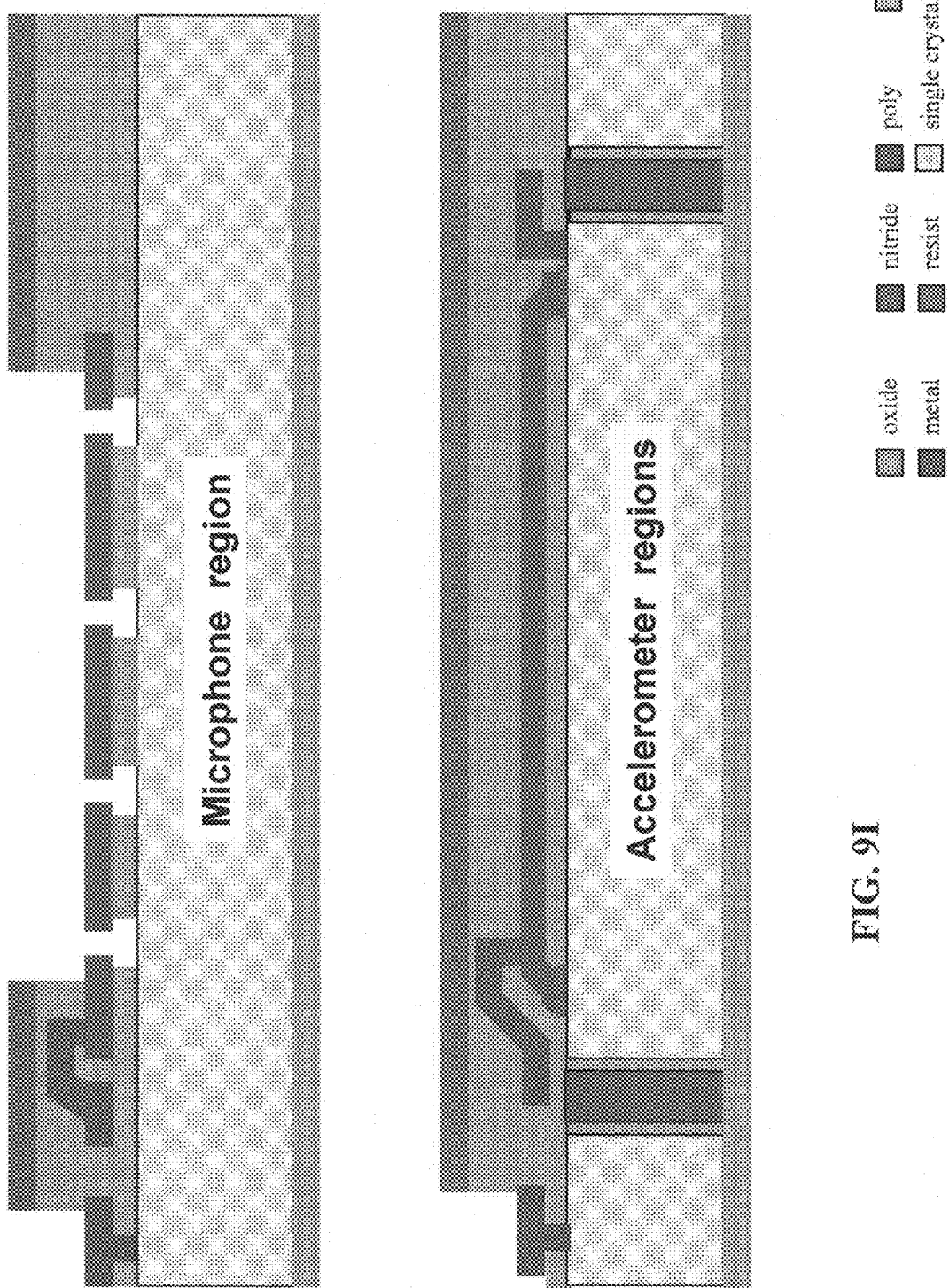

In FIG. 9I, the silicon wafer is optionally thinned from approximately 650 microns to approximately 350 microns by any of several methods including etching, grinding and polishing the back side, and a layer of oxide is deposited.

Figure 9J:
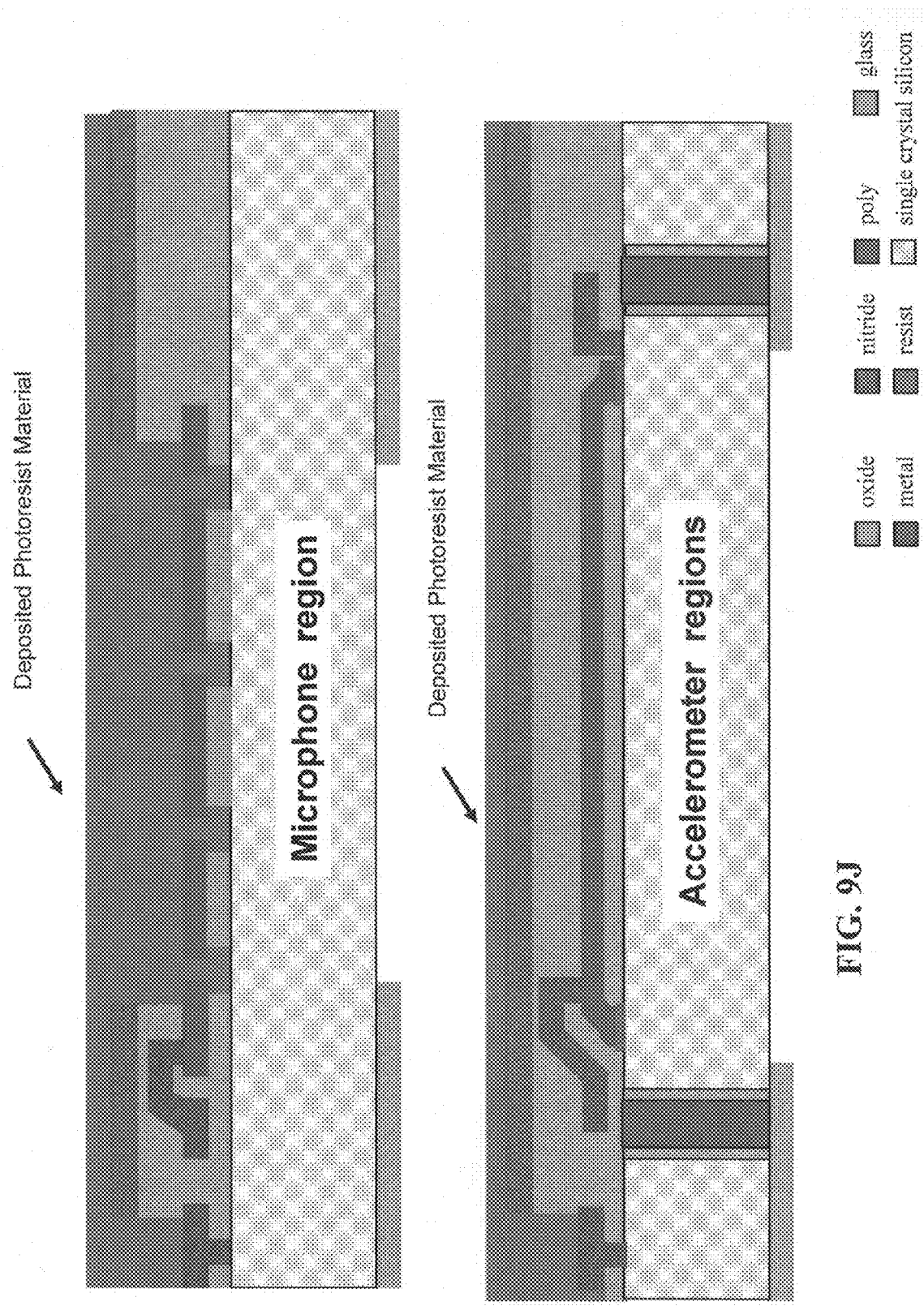

In FIG. 9J, a photoresist material is deposited on the front side of the wafer, and the oxide on the back side of the wafer is patterned.

Figure 9K:
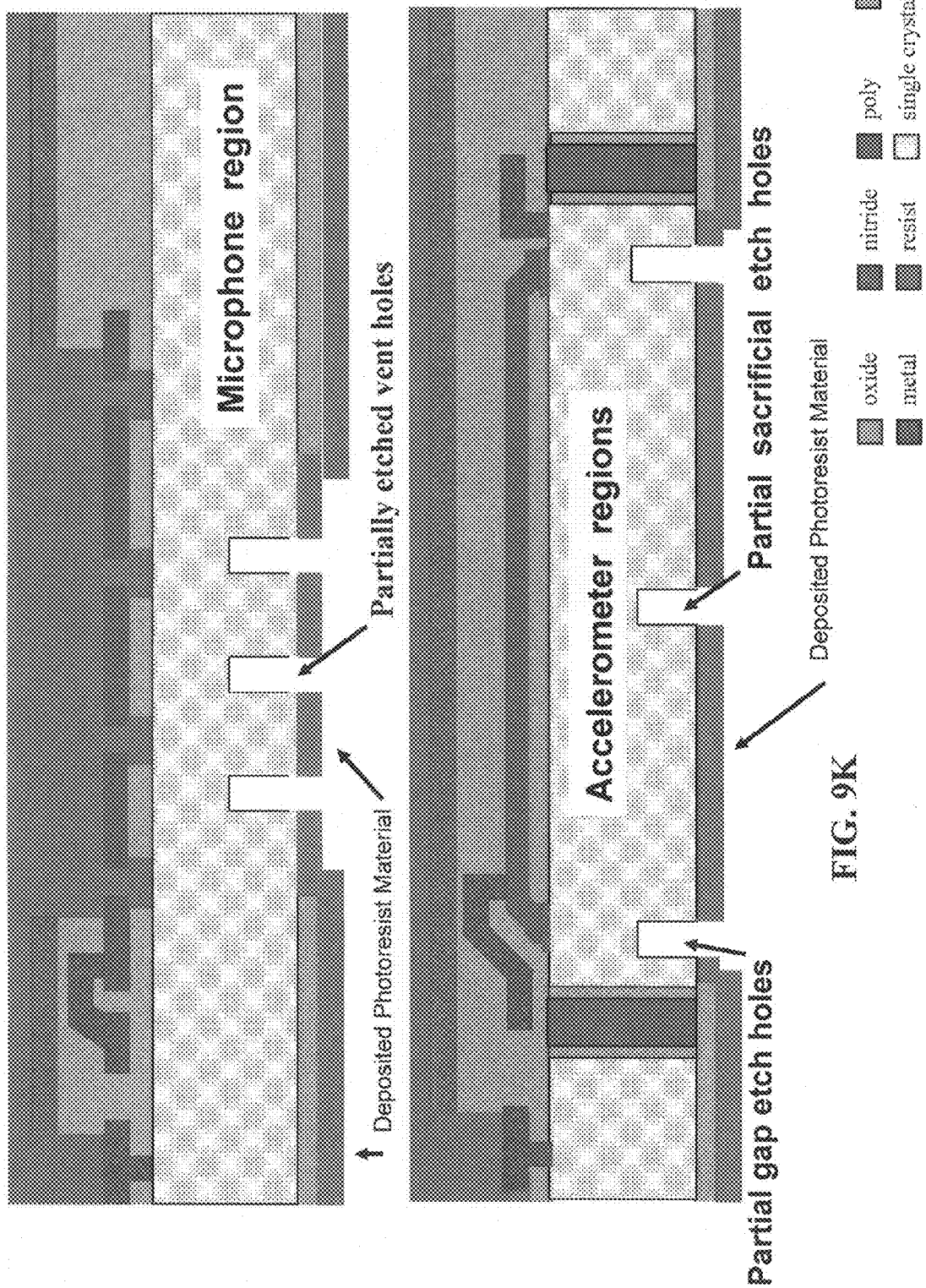

In FIG. 9K, a photoresist material is deposited and patterned on the back side of the wafer, and trenches are etched into the silicon wafer.

Figure 9L:
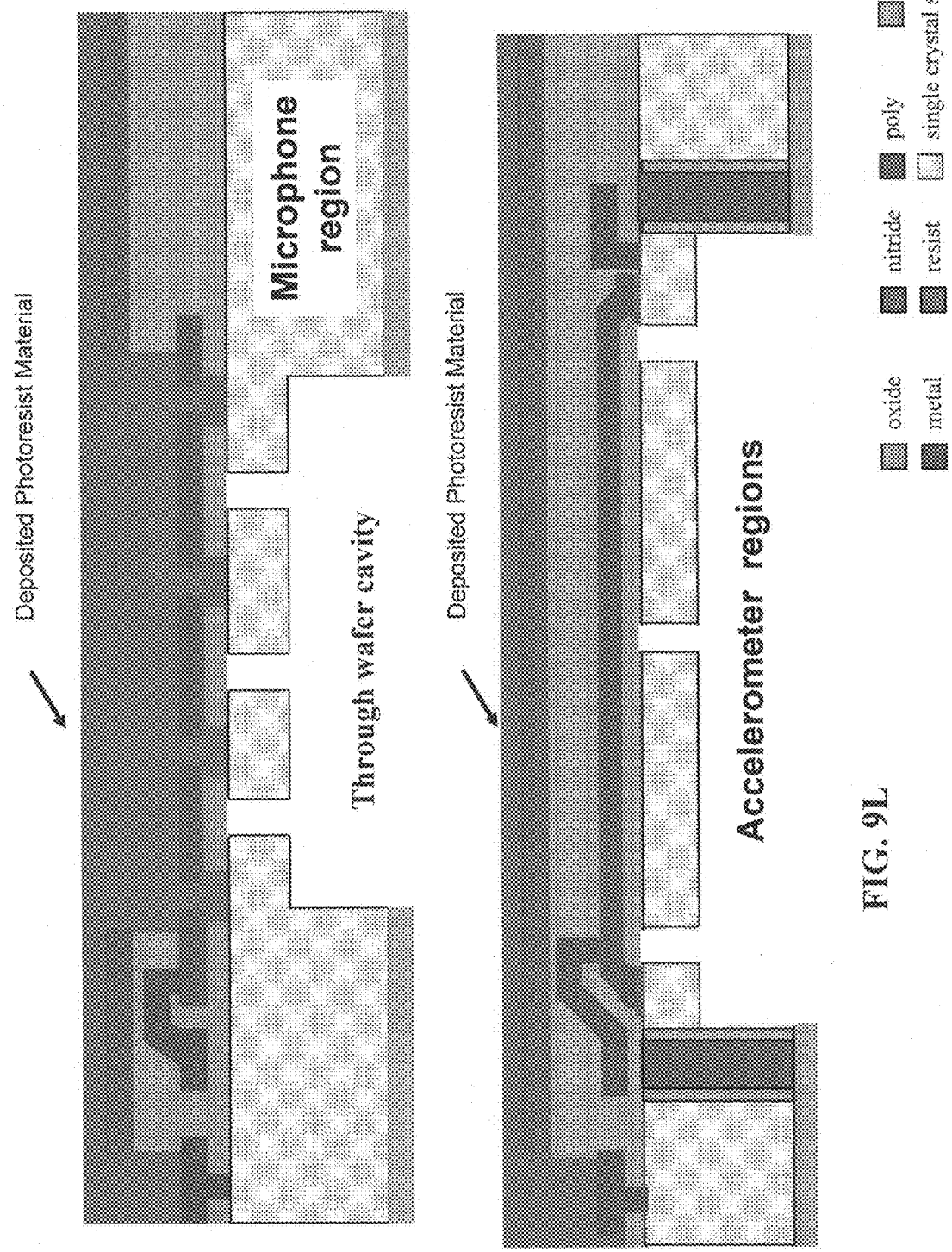

In FIG. 9L, the photoresist material is removed from both the front side and the back side, and a new layer of photoresist material is deposited on the front side for protection. Cavities are then etched in the back side of the wafer using the existing oxide as a hard mask. The trenches are then further etched through the silicon layer to the resist pedestal areas of the microphone region and the oxide underlying the cap of the accelerometer region.

Figure 9M:
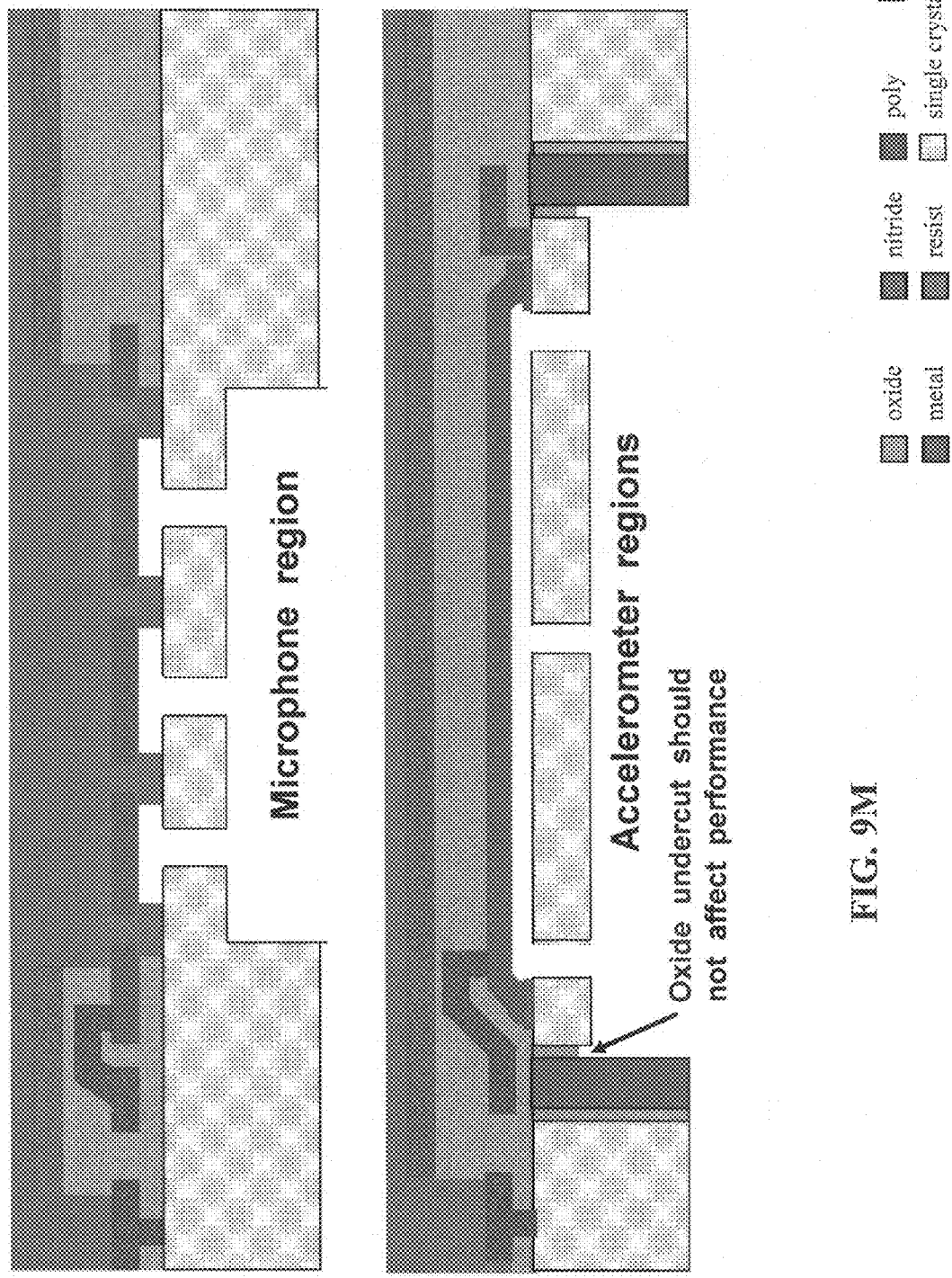

In FIG. 9M, the oxide exposed through the cavities is removed, preferably by exposing to HF gas.

Figure 9N:
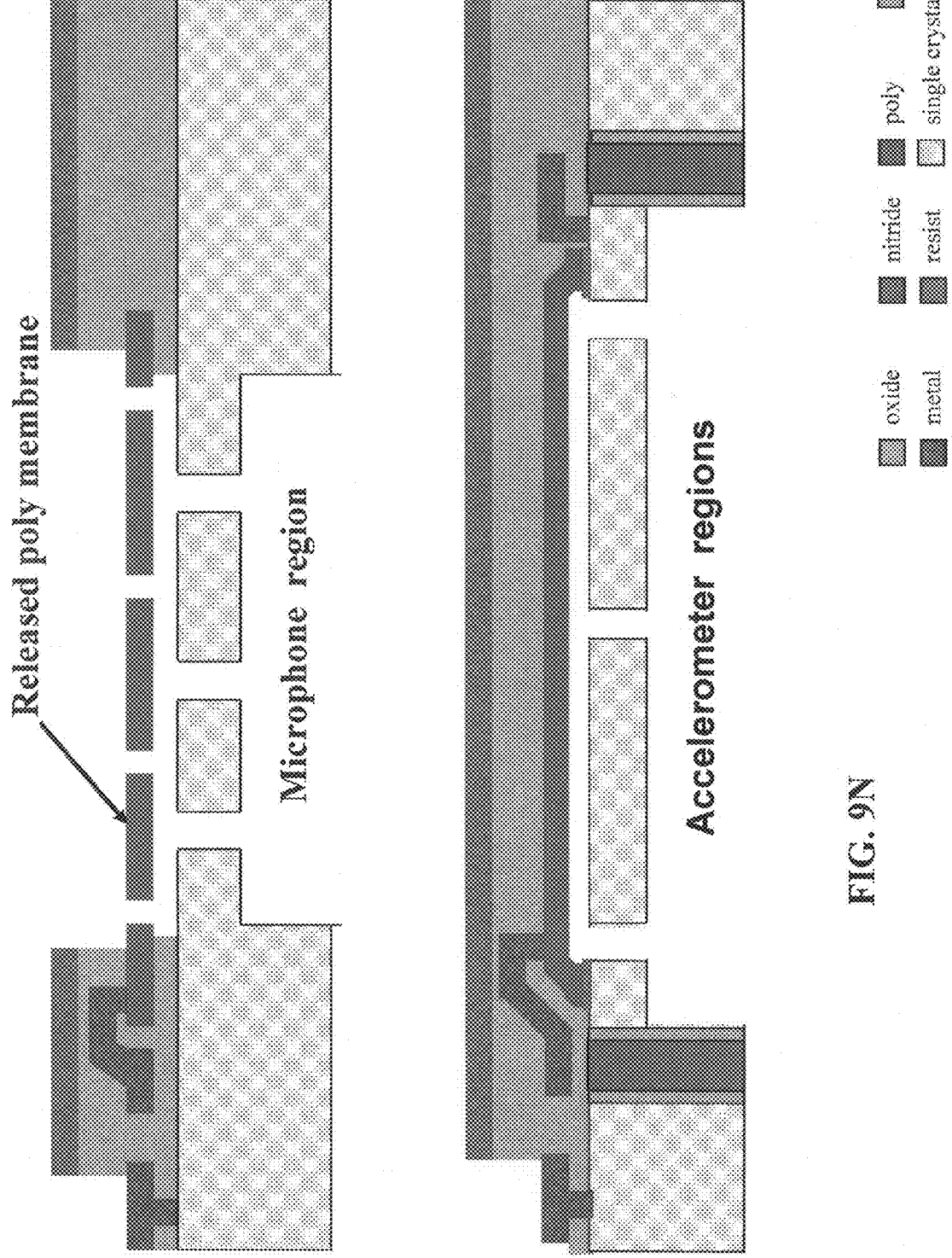

In FIG. 9N, the remaining photoresist material is removed from the front side of the wafer, thereby releasing the microphone structures.

Figure 9O:
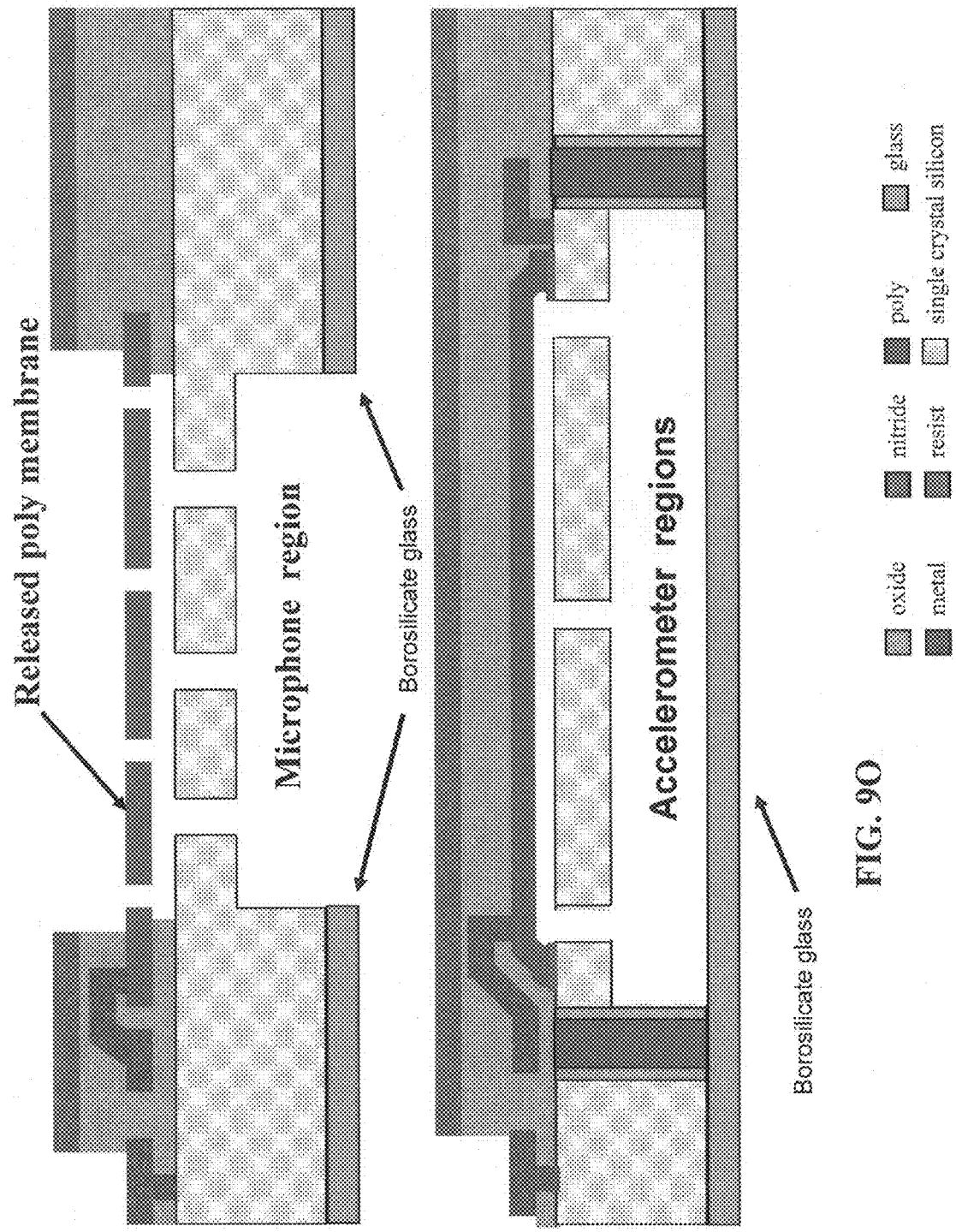

In FIG. 9O, borosilicate glass is aligned and anodic bonded to the back side of the wafer. Microphone holes are preferably ultrasonically cut in the glass prior to bonding.

Figure 3:
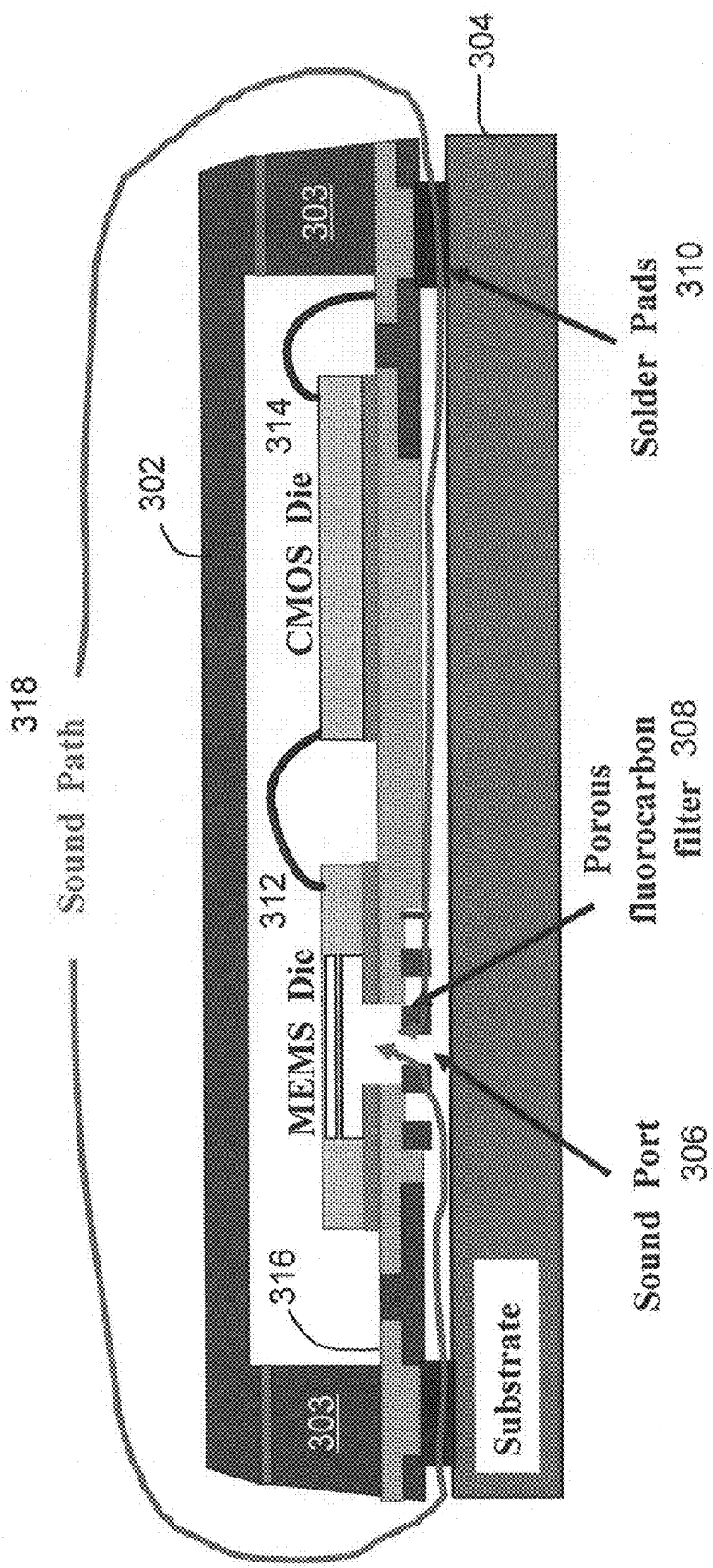
FIG. 3 shows an exemplary configuration for a device combining a micromachined microphone or multisensor with an IC wafer in accordance with an embodiment of the present invention.

A micromachined microphone or multisensor may be assembled with an integrated circuit (IC) die in a single package. FIG. 3 shows an exemplary configuration for a device combining a micromachined microphone or multisensor with an IC die in a pre-molded plastic package in accordance with an embodiment of the present invention. The package contains a MEMS (Micro-Electro-Mechanical System) die 312 that includes the micromachined microphone and an integrated circuit (IC) die 314 that includes various electronics for processing signals, including those generated by the MEMS die 312. The MEMS die 312 and the IC die 314 are die attached to the package leadframe 316. After wire bonding, the package is sealed, including lid 302 and package body 303. When mounted on a substrate in the embodiment shown, sound waves reach the microphone diaphragm through a downward-facing sound port 306 along a sound path 318 that includes spaces between the leadframe 316 and the substrate 304. These spaces are formed by the height of the solder pads and, optionally, by passages etched into the bottom surface of the leadframe 316. Such passages are typically formed when the leadframes 316 are etched from metal foils by using appropriate patterns in a photoresist-based process, or other suitable patterning method. A porous hydrophobic filter 308 or other filter may be included, for example, to protect the microphone diaphragm and other exposed features from moisture, particulates or other elements. Filter 308 may be laminated to a support fabric to enhance manufacturability and durability. In one alternative embodiment, the substrate 304 could include a hole to allow sound waves to reach the microphone diaphragm. In another alternative embodiment, lid 302 could include a hole to allow sound waves to reach the microphone diaphragm through the top of the package. In another alternative embodiment, the plastic side walls 303 of the package could have a plurality of slots to allow sound waves to reach the microphone diaphragm. In another alternative embodiment, lid 302, downward-facing sound port 306, and substrate 304 could include holes to allow sound waves to reach the microphone diaphragm from different locations. In another alternative embodiment, a MEMS die 312 that includes the micromachined microphone and an integrated circuit (IC) die 314 that includes various electronics for processing signals, including those generated by the MEMS die 312 and a MEMS die containing at least one sealed inertial sensor are assembled in a package.

It should be noted that the described techniques for forming microphone and inertial sensor structures suspended above the front side of the top silicon layer may be similar or related to techniques described in U.S. patent application Ser. No. 11/028,249 entitled Method of Forming a MEMS Device, filed Jan. 3, 2005 in the names of Thomas Kieran Nunan and Timothy J. Brosnihan, which is hereby incorporated herein by reference in its entirety.

It should also be noted that the present invention is not limited to any particular shape or configuration of microphone diaphragm. The microphone may be, for example, round or square, solid or perforated by one or more holes, and/or flat or corrugated. Different diaphragm configurations might require different or additional processes from those described. For example, additional processes may be required to form holes or corrugations in the diaphragm.

It should also be noted that the described processes are exemplary only. For any particular implementation, fewer, additional, or different steps or processes may be required. In some cases, materials different than those described may be suitable for a particular step or process. It would be virtually impossible to describe every combination and permutation of materials and processes that could be employed in various embodiments of the invention. Therefore, the present invention is intended to include all such materials and processes including suitable variations of the materials and processes described.

The present invention may be embodied in other specific forms without departing from the true scope of the invention. The described embodiments are to be considered in all respects only as illustrative and not restrictive.

What is claimed is:

1. A method for producing a micromachined microphone from a wafer having at least a first silicon layer, the method comprising:
    forming trenches through the first silicon layer;
    depositing a first oxide layer covering the front side of the first silicon layer and lining the trenches;
    forming a plurality of sacrificial polysilicon microphone structures on the first oxide layer;
    depositing a second oxide layer over the first oxide layer and the sacrificial polysilicon microphone structures;
    forming a plurality of polysilicon microphone structures including a diaphragm on the second oxide layer;
    removing the sacrificial polysilicon microphone structures; and
    removing a portion of at least one oxide layer underlying the plurality of polysilicon microphone structures from a back side of the first silicon layer through the trenches.

2. The method according to claim 1, wherein forming the plurality of sacrificial polysilicon microphone structures on the first oxide layer comprises:
    depositing a polysilicon layer covering the first oxide layer and filling the lined trenches; and
    patterning the polysilicon layer to form the plurality of sacrificial polysilicon microphone structures.

3. The method according to claim 1, further comprising, before removing the portion of the at least one oxide layer underlying the plurality of polysilicon microphone structures:
    forming an additional oxide layer over the second oxide layer and the plurality of polysilicon microphone structures;
    patterning the additional oxide layer to expose a portion of the polysilicon microphone structures and a portion of the first silicon layer;
    forming metallic electrodes to at least the exposed portion of the polysilicon microphone structure and the exposed portion of the first silicon layer.

4. The method according to claim 1, further comprising, before removing the portion of the at least one oxide layer underlying the plurality of polysilicon microphone structures:
    depositing a first photoresist layer over the diaphragm over at least one hole in the diaphragm;
    patterning the first photoresist layer to expose a hole in the diaphragm;
    removing a portion of oxide beneath the hole in the diaphragm;
    depositing a second photoresist layer forming a pedestal beneath the hole in the diaphragm, wherein the pedestal supports the diaphragm during removal of the portion of the at least one oxide layer underlying the plurality of polysilicon microphone structures; and
    removing the pedestal after removing the portion of the at least one oxide layer underlying the plurality of polysilicon microphone structures.

5. The method according to claim 1, further comprising:
    forming a plurality of inertial sensor structures during formation of the polysilicon microphone structures.

6. The method according to claim 1, further comprising:
    forming a plurality of sacrificial polysilicon inertial sensor structures on the first oxide layer during formation of the plurality of sacrificial polysilicon microphone structures;
    depositing the second oxide layer over the sacrificial polysilicon inertial sensor structures; and
    removing the sacrificial polysilicon inertial sensor structures.

7. The method according to claim 6, further comprising:
    patterning a polysilicon layer to form the plurality of sacrificial polysilicon inertial sensor structures during formation of the sacrificial polysilicon microphone structures.

8. The method according to claim 1, wherein the wafer further includes a second silicon layer and an intermediate oxide layer between the first silicon layer and the second silicon layer, and wherein removing the portion of the at least one oxide layer underlying the plurality of polysilicon microphone structures from the back side of the first silicon layer comprises:
    removing underlying portions of the second silicon layer and the intermediate oxide layer to form a back side cavity; and
    removing the portion of the at least one oxide layer underlying the plurality of polysilicon microphone structures through the back side cavity.

9. The method according to claim 5, wherein the wafer further includes a second silicon layer and an intermediate oxide layer between the first silicon layer and the second silicon layer, and wherein removing the portion of the at least one oxide layer underlying the plurality of polysilicon microphone structures from the back side of the first silicon layer comprises:
    removing underlying portions of the second silicon layer and the at least one intermediate oxide layer to form back side cavities for the polysilicon microphone structures and the inertial sensor structures; and removing the portions of the at least one intermediate material underlying the polysilicon microphone structures and inertial sensor structures through the back side cavities.

10. The method according to claim 9, further comprising:
forming a glass layer on a back side of the second silicon layer, the glass layer covering and sealing the back side cavity of the inertial sensor structures but not covering the back side cavity of the polysilicon microphone structures.

11. The method according to claim 1, wherein the plurality of trenches allow sound waves to reach the diaphragm from the back side of the first silicon layer.

12. The method according to claim 1, wherein the first silicon layer is a device layer of an SOI wafer.

13. The method according to claim 12, wherein the SOI wafer includes an intermediate oxide layer, and wherein forming the trenches comprises etching through the device layer into the intermediate oxide layer.

14. The method according to claim 13, wherein the SOI wafer includes a bottom silicon layer, such that the intermediate oxide layer is between the device layer and the bottom silicon layer, and wherein forming the trenches comprises etching through the bottom silicon layer.

15. The method according to claim 2, further comprising:
patterning the polysilicon layer to form a plurality of sacrificial polysilicon inertial sensor structures during formation of the sacrificial polysilicon microphone structures.

16. The method according to claim 1 wherein the first silicon layer comprises a fixed sensing electrode and wherein forming the trenches comprises forming perforations through the fixed sensing electrode.

17. A method for producing a micromachined microphone from a wafer having at least a first silicon layer, the method comprising:
forming at least one oxide layer on a front side of the first silicon layer;
forming a plurality of polysilicon microphone structures including a diaphragm on at least one oxide layer;
forming an additional oxide layer over the at least one oxide layer and the plurality of polysilicon microphone structures;
patterning the additional oxide layer to expose a portion of a polysilicon structure and a portion of the first silicon layer;
forming metallic electrodes to at least the exposed portion of the polysilicon structure and the exposed portion of the first silicon layer; and
removing a portion of at least one oxide layer underlying the plurality of polysilicon microphone structures from a back side of the first silicon layer through a plurality of trenches formed through the first silicon layer.

18. The method according to claim 17, further comprising forming the trenches through the first silicon layer.

19. The method according to claim 18 wherein the first silicon layer comprises a fixed sensing electrode and wherein forming the trenches comprises forming perforations through the fixed sensing electrode.

20. The method according to claim 19 wherein the first silicon layer is a device layer of an SOI wafer, and wherein the SOI wafer further includes an intermediate oxide layer and a bottom silicon layer such that the intermediate oxide layer is between the device layer and the bottom silicon layer, and wherein forming the trenches further comprises etching through the intermediate oxide layer.

* * * * *